(12) United States Patent
Beigel et al.

(10) Patent No.: US 10,297,290 B1
(45) Date of Patent: May 21, 2019

(54) SEMICONDUCTOR DEVICES, AND RELATED CONTROL LOGIC ASSEMBLIES, CONTROL LOGIC DEVICES, ELECTRONIC SYSTEMS, AND METHODS

(71) Applicant: Micron Technology, Inc., Boise, ID (US)

(72) Inventors: Kurt D. Beigel, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/858,188

(22) Filed: Dec. 29, 2017

(51) Int. Cl.
| | |
|---|---|
| *G11C 5/02* | (2006.01) |
| *H01L 29/786* | (2006.01) |
| *H01L 27/092* | (2006.01) |
| *H01L 27/02* | (2006.01) |
| *H03K 19/0948* | (2006.01) |
| *H01L 21/8238* | (2006.01) |
| *H01L 21/308* | (2006.01) |
| *H01L 21/822* | (2006.01) |
| *H01L 29/66* | (2006.01) |
| *H01L 27/06* | (2006.01) |

(Continued)

(52) U.S. Cl.
CPC ............ *G11C 5/025* (2013.01); *H01L 21/308* (2013.01); *H01L 21/8221* (2013.01); *H01L 21/823828* (2013.01); *H01L 21/823857* (2013.01); *H01L 21/823878* (2013.01); *H01L 21/823885* (2013.01); *H01L 27/0207* (2013.01); *H01L 27/0688* (2013.01); *H01L 27/092* (2013.01); *H01L 29/66742* (2013.01); *H01L 29/78642* (2013.01); *H03K 19/0948* (2013.01); *G11C 5/14* (2013.01); *G11C 7/06* (2013.01); *G11C 7/12* (2013.01); *G11C 8/08* (2013.01); *G11C 8/10* (2013.01); *G11C 29/4401* (2013.01)

(58) Field of Classification Search
CPC ... G11C 5/025; H01L 21/308; H01L 21/8221; H01L 21/823828; H01L 21/823885
See application file for complete search history.

(56) References Cited

U.S. PATENT DOCUMENTS

| | | |
|---|---|---|
| 4,740,826 A | 4/1988 | Chatterjee |
| 5,038,325 A | 8/1991 | Douglas et al. |

(Continued)

OTHER PUBLICATIONS

Bonnaud et al., Verticasl Channel Thin Film Transistor: Improvement Approach Similar to Multigate Monolithic CMOS Technology, ECS Transactions, vol. 37, vol. 1, (2011), pp. 29-37.

(Continued)

*Primary Examiner* — James G Norman
(74) *Attorney, Agent, or Firm* — TraskBritt

(57) ABSTRACT

A semiconductor device comprises a stack structure comprising decks each comprising a memory element level comprising memory elements, and a control logic level in electrical communication with the memory element level and comprising control logic devices. At least one of the control logic devices of the control logic level of one or more of the decks comprises at least one device exhibiting a gate electrode shared by neighboring vertical transistors thereof. A control logic assembly, a control logic device, an electronic system, a method of forming a control logic device, and a method of operating a semiconductor device are also described.

4 Claims, 24 Drawing Sheets

(51) Int. Cl.
  *G11C 7/12* (2006.01)
  *G11C 8/10* (2006.01)
  *G11C 7/06* (2006.01)
  *G11C 8/08* (2006.01)
  *G11C 29/44* (2006.01)
  *G11C 5/14* (2006.01)

(56) References Cited

U.S. PATENT DOCUMENTS

| | | |
|---|---|---|
| 5,521,860 A | 5/1996 | Ohkubo |
| 5,612,563 A | 3/1997 | Fitch et al. |
| 6,094,068 A | 7/2000 | Nomura et al. |
| 6,349,399 B1 | 2/2002 | Manning |
| 6,424,001 B1 | 7/2002 | Forbes et al. |
| 6,691,252 B2 | 2/2004 | Hughes et al. |
| 6,721,206 B2 | 4/2004 | Abedifard |
| 6,774,426 B2 | 8/2004 | Abedifard |
| 6,924,560 B2 | 8/2005 | Wang et al. |
| 7,265,393 B2 | 9/2007 | Schuele et al. |
| 7,372,091 B2 | 5/2008 | Leslie |
| 7,408,224 B2 | 8/2008 | Kim |
| 7,629,633 B2 | 12/2009 | Chan et al. |
| 7,825,460 B2 | 11/2010 | Breitwisch et al. |
| 8,294,212 B2 | 10/2012 | Wang et al. |
| 8,958,228 B2 | 2/2015 | Samachisa et al. |
| 9,105,320 B2 | 8/2015 | Schubert et al. |
| 9,112,138 B2 | 8/2015 | Ramaswamy et al. |
| 9,281,044 B2 | 3/2016 | Ramaswamy et al. |
| 9,530,790 B1 | 12/2016 | Lu et al. |
| 9,653,617 B2 | 5/2017 | Zhou et al. |
| 2006/0049461 A1 | 3/2006 | Schuele et al. |
| 2006/0097304 A1 | 5/2006 | Yoon et al. |
| 2010/0213525 A1* | 8/2010 | Masuoka ........ H01L 21/823828 257/306 |
| 2013/0003433 A1 | 1/2013 | Hishida et al. |
| 2014/0151776 A1 | 6/2014 | Beigel et al. |
| 2014/0361239 A1 | 12/2014 | Ramaswamy et al. |
| 2015/0131381 A1 | 5/2015 | Rhie |
| 2016/0035418 A1 | 2/2016 | Castro et al. |
| 2016/0155855 A1 | 6/2016 | Ramaswamy et al. |
| 2016/0240533 A1 | 8/2016 | Oxland |
| 2016/0343727 A1 | 11/2016 | Kim et al. |
| 2016/0351722 A1* | 12/2016 | Zhou ................ H01L 29/78696 |
| 2018/0047753 A1 | 2/2018 | Yamazaki et al. |
| 2018/0061835 A1 | 3/2018 | Yang et al. |
| 2018/0308853 A1 | 10/2018 | Bell et al. |
| 2018/0342584 A1 | 11/2018 | Boemmels |

OTHER PUBLICATIONS

Chan et al., Amorphous Silicon Thin-Film Transistors with 90° Vertical Nanoscale Channel, Appl. Phys. Lett, vol. 86, (2005), pp. 253501-1-253501-3.

Fairchild Semiconductor, CMOS, The Ideal Logic Family, Application Note 77, (Jan. 1983), 12 pages.

ITRS, International Technology Roadmap for Semiconductors, 2013 Edition, Process Integration, Devices, and Structures, 51 pages.

Li et al., Skybridge-3D-CMOS: A Fine-Grained 3D CMOS Integrated Circuit Technology, IEEE Transactions on Nanotechnology, vol. 16, No. 4, (Jul. 2017), pp. 639-652.

Michal, Vratislav, On the Low-Power Design, Stability Improvement and Frequency Estimation of the CMOS Ring Oscillator, Radioelektronika (Radioelektronika), 2012 22nd International Conference, Apr. 17-18, 2012, 4 pages.

Nelson et al., Defeating the Trade-Off Between Process Complexity and Electrical Performance with Vertical Zinc Oxide Transistors, Appl. Phys. Lett., vol. 101, (2012), pp. 183503-1-183503-4.

Yakimets et al, Vertical GAAFETs for the Ultimate CMOS Scaling, IEEE Transactions on Electron Devices, vol. 26, No. 5, (May 2015), pp. 1433-1439.

Zhao et al., Three-Dimensional Flexible Complementary Metal-Oxide-Semiconductor Logic Circuits Based on Two-Layer Stacks of Single-Walled Carbon Nanotube Networks, ACS Nano, vol. 10, (2016), pp. 2193-2202.

\* cited by examiner

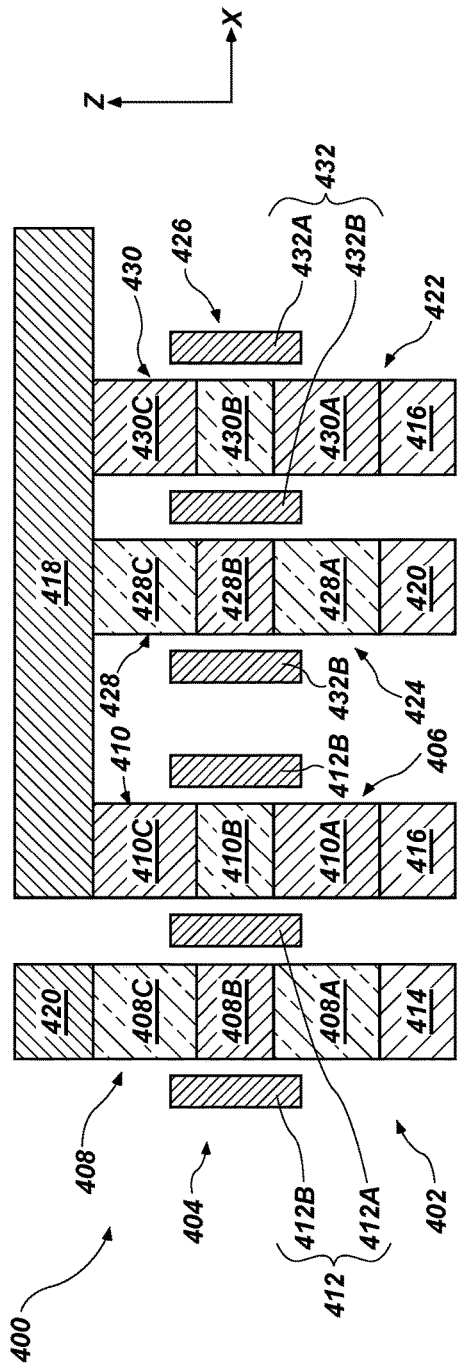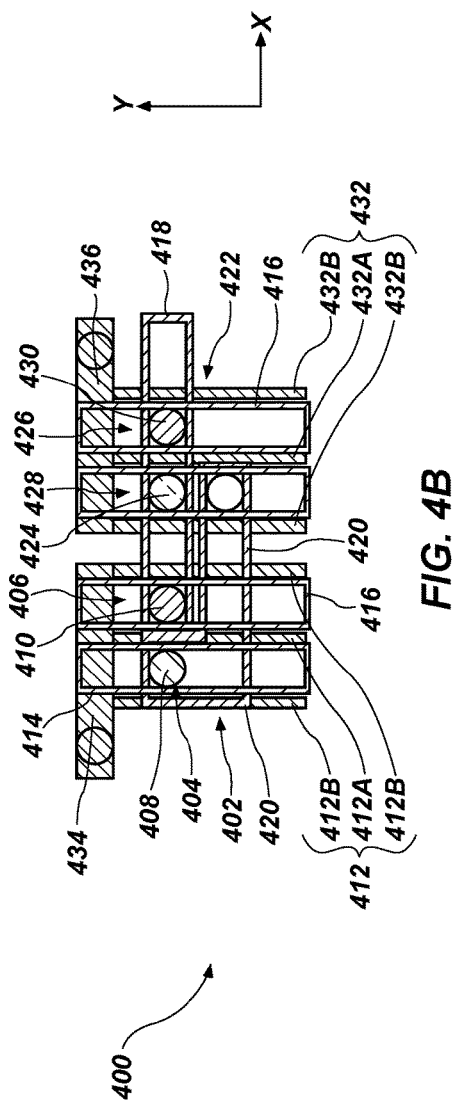
FIG. 4A
FIG. 4B

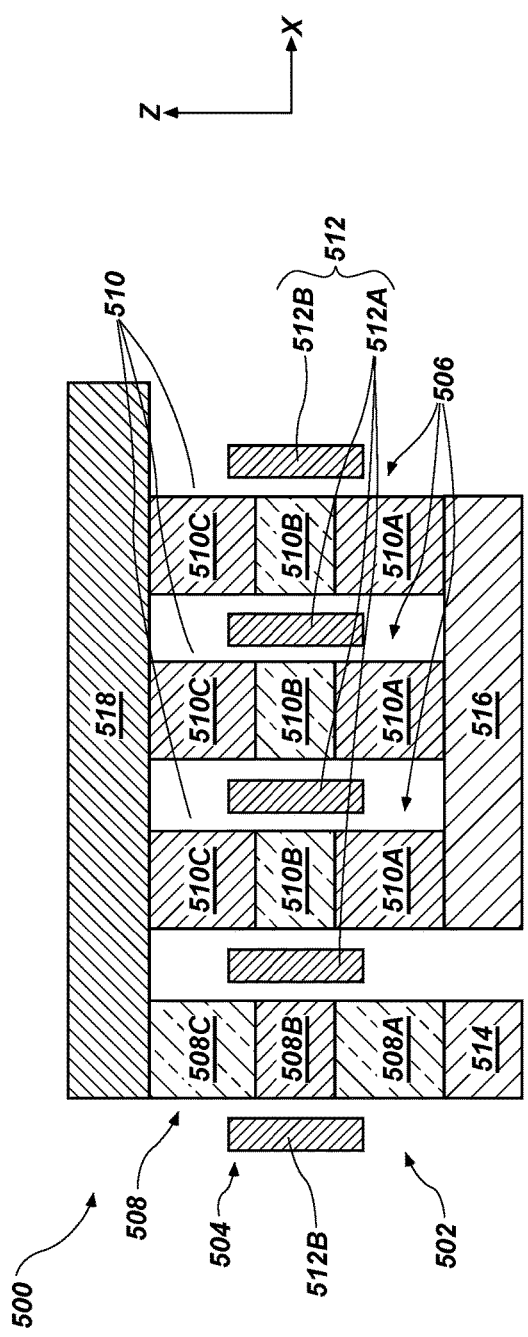
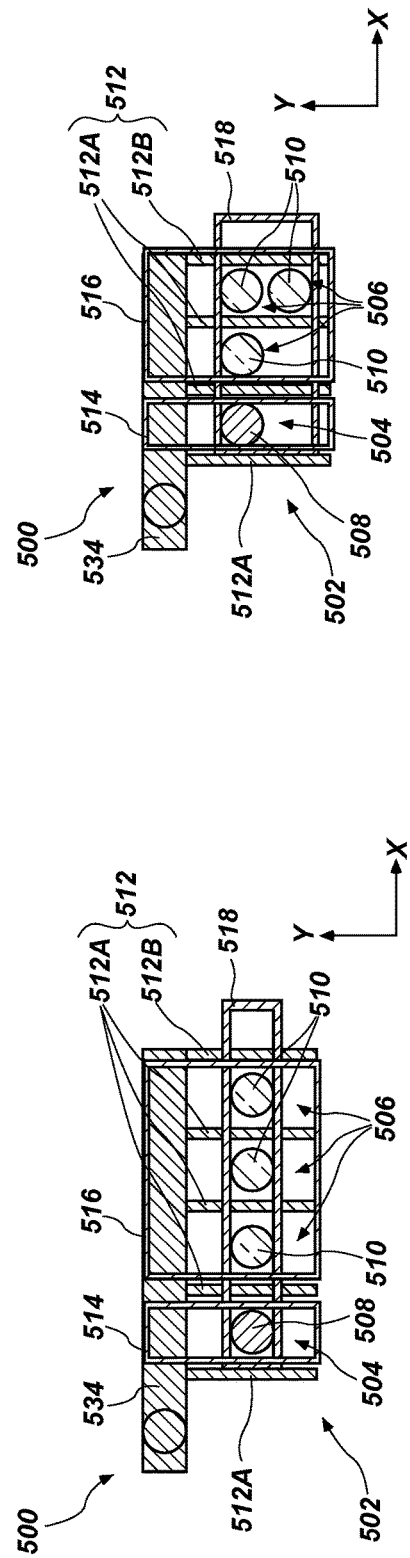
FIG. 5A
FIG. 5B
FIG. 5C

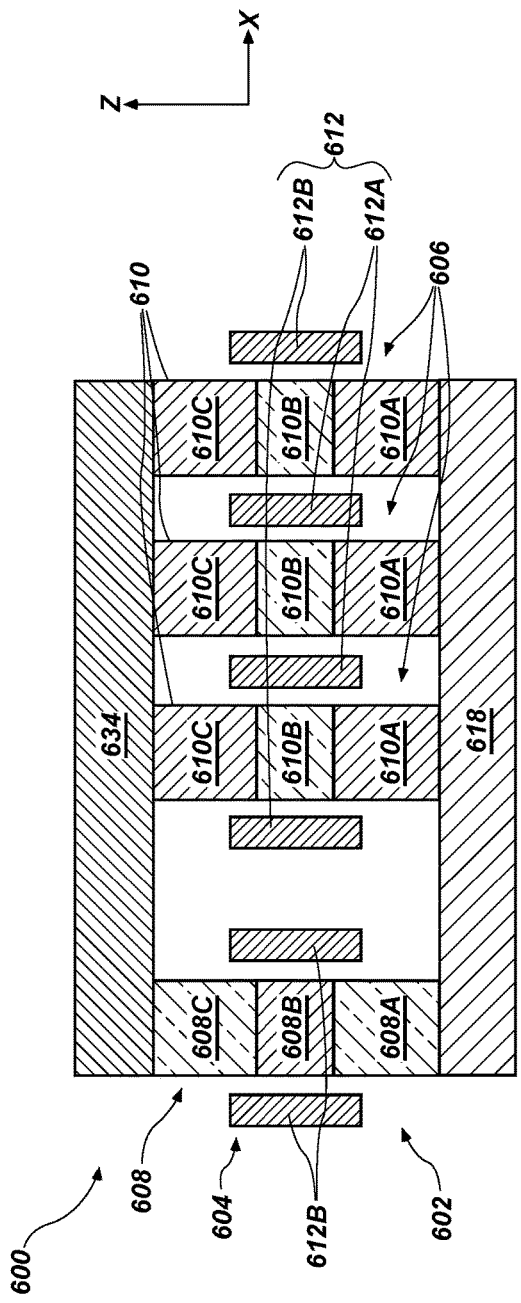
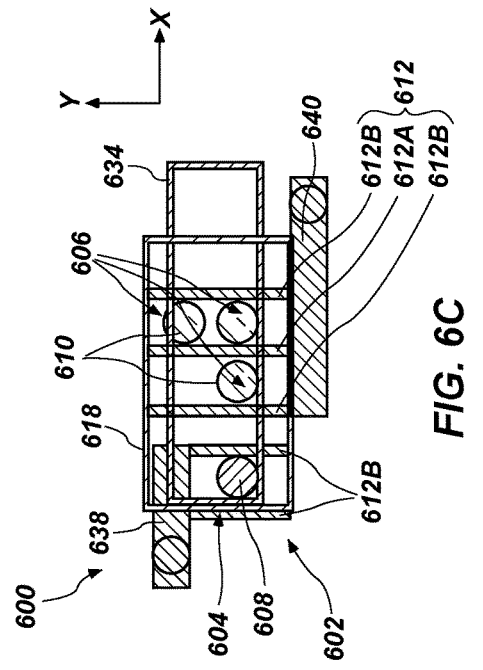
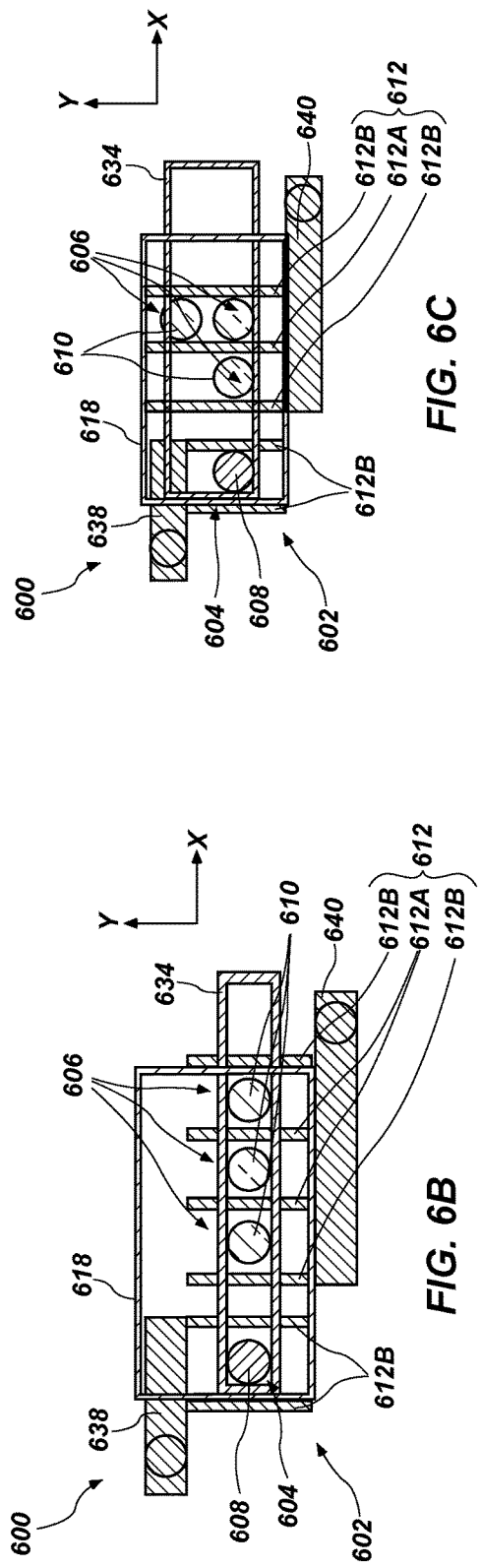
FIG. 6A
FIG. 6B
FIG. 6C

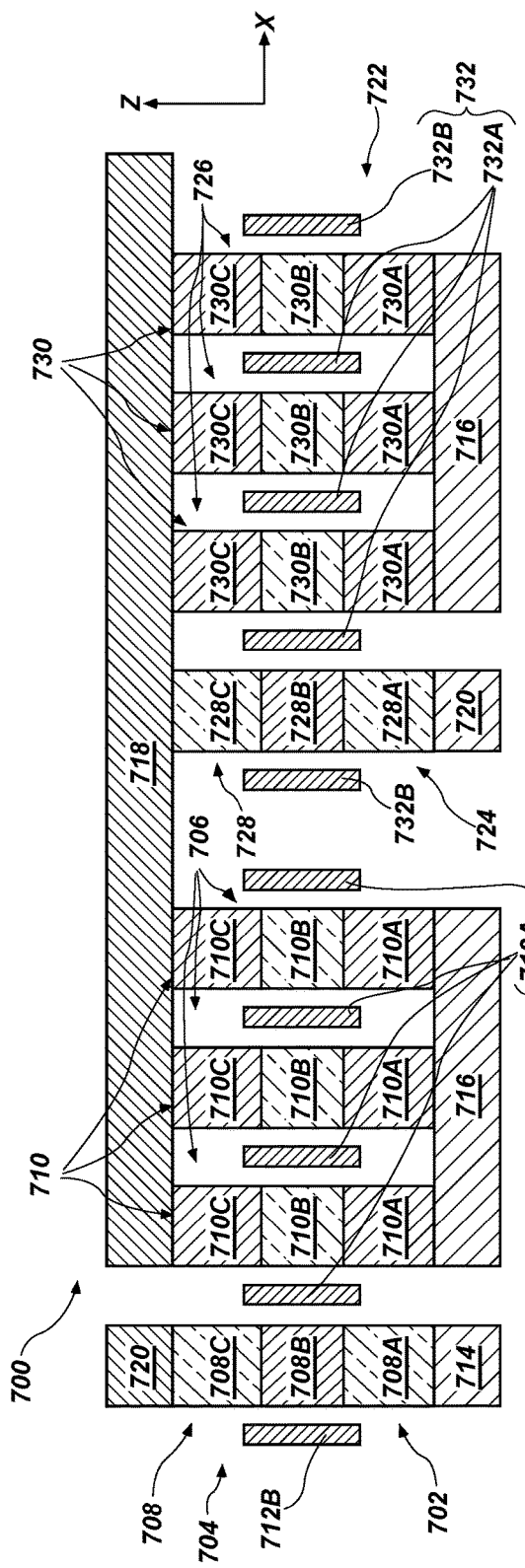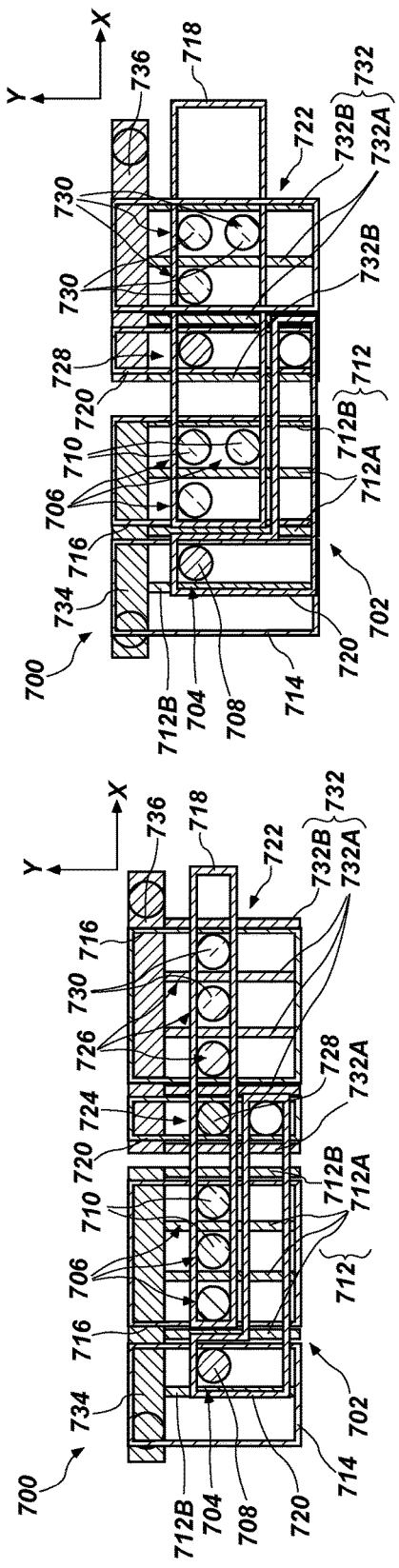
FIG. 7A
FIG. 7B
FIG. 7C

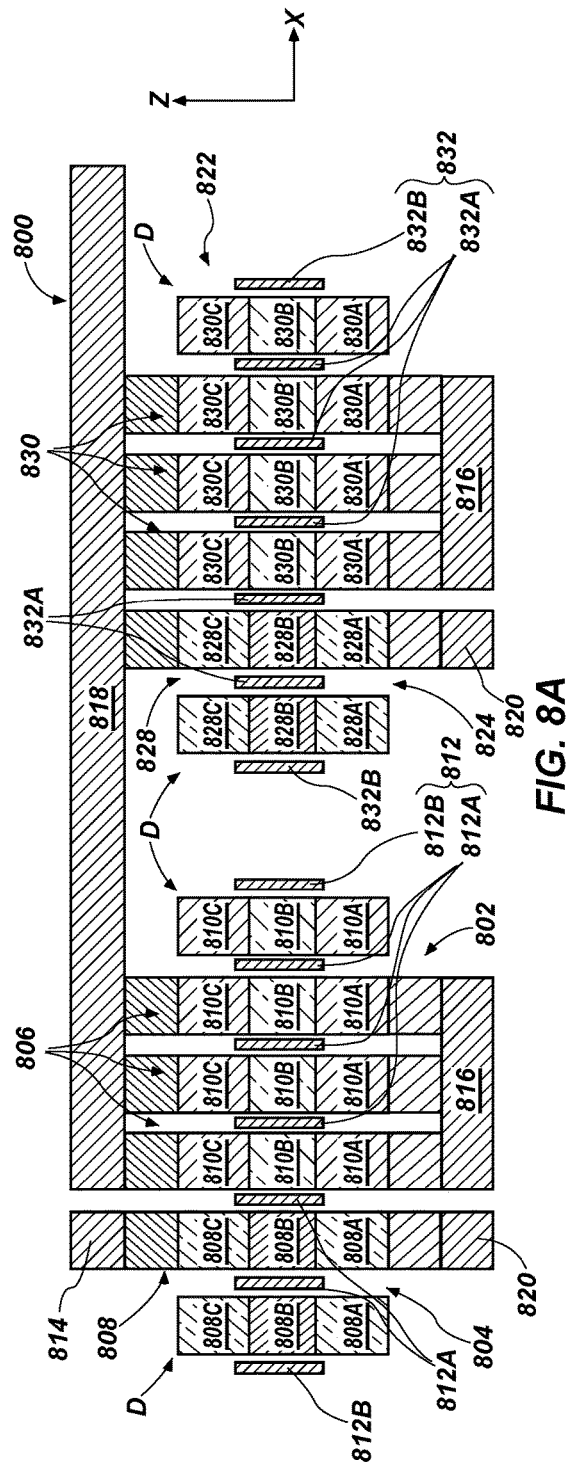
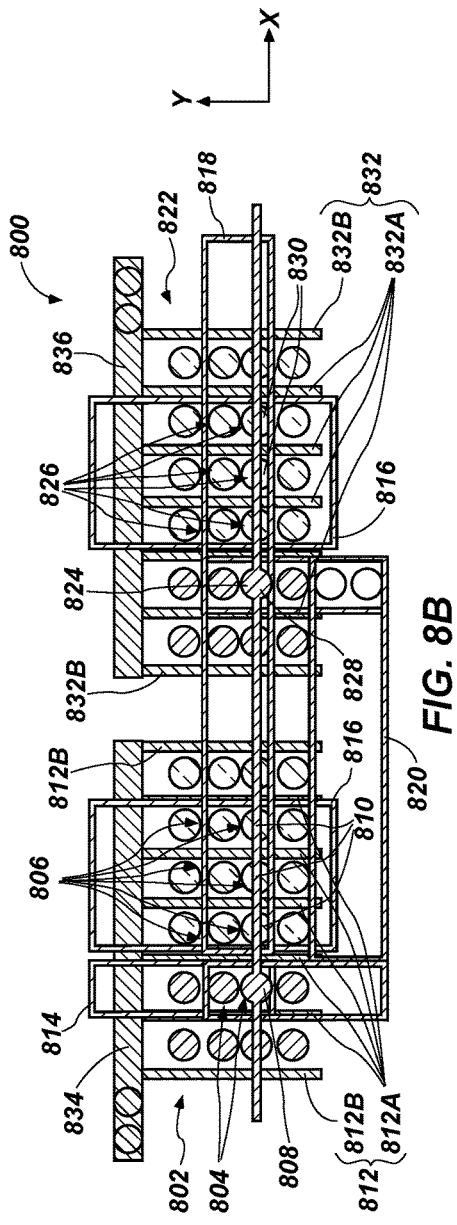
FIG. 8A
FIG. 8B

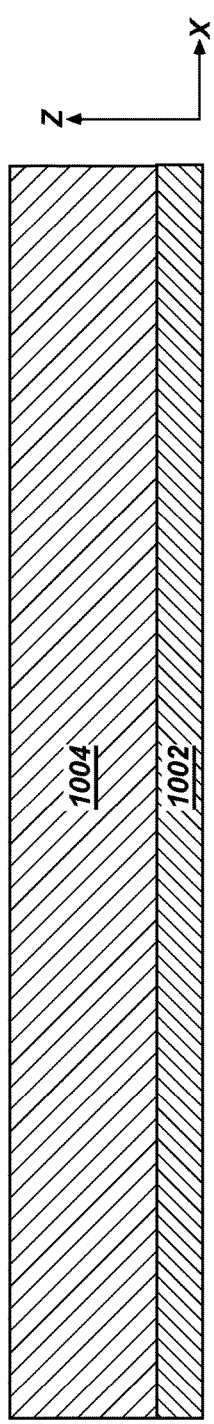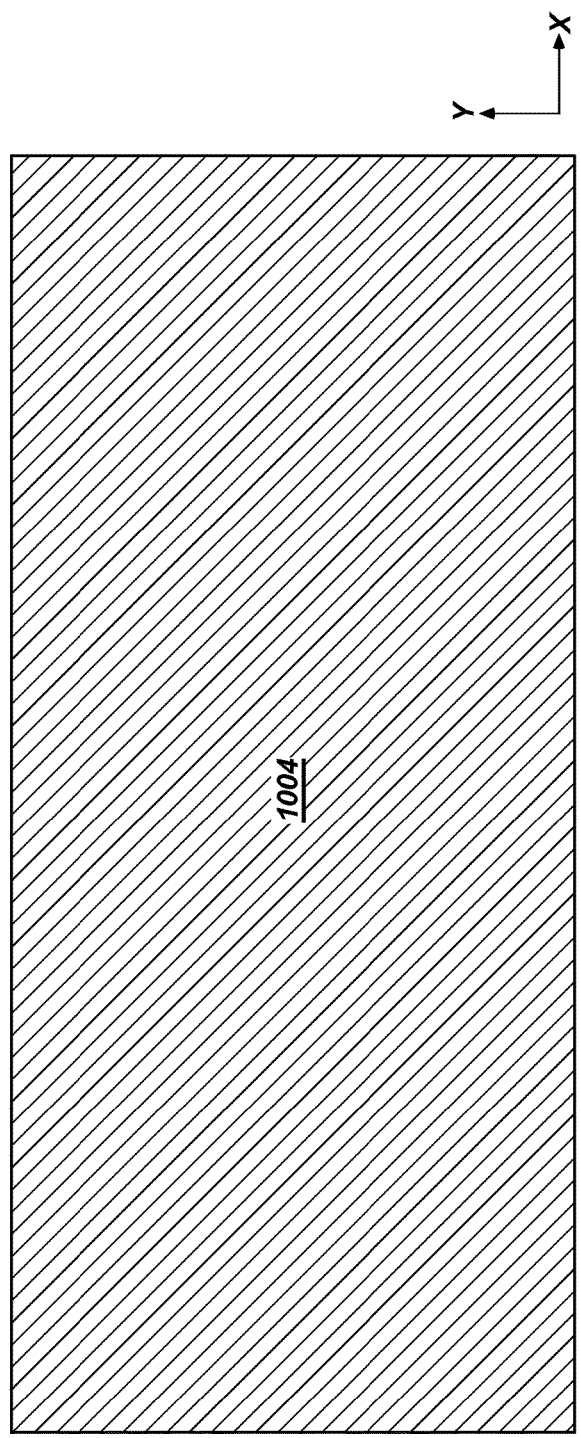

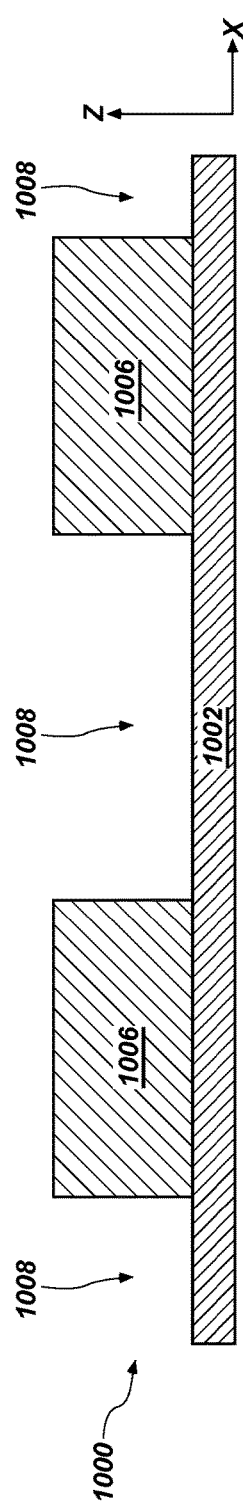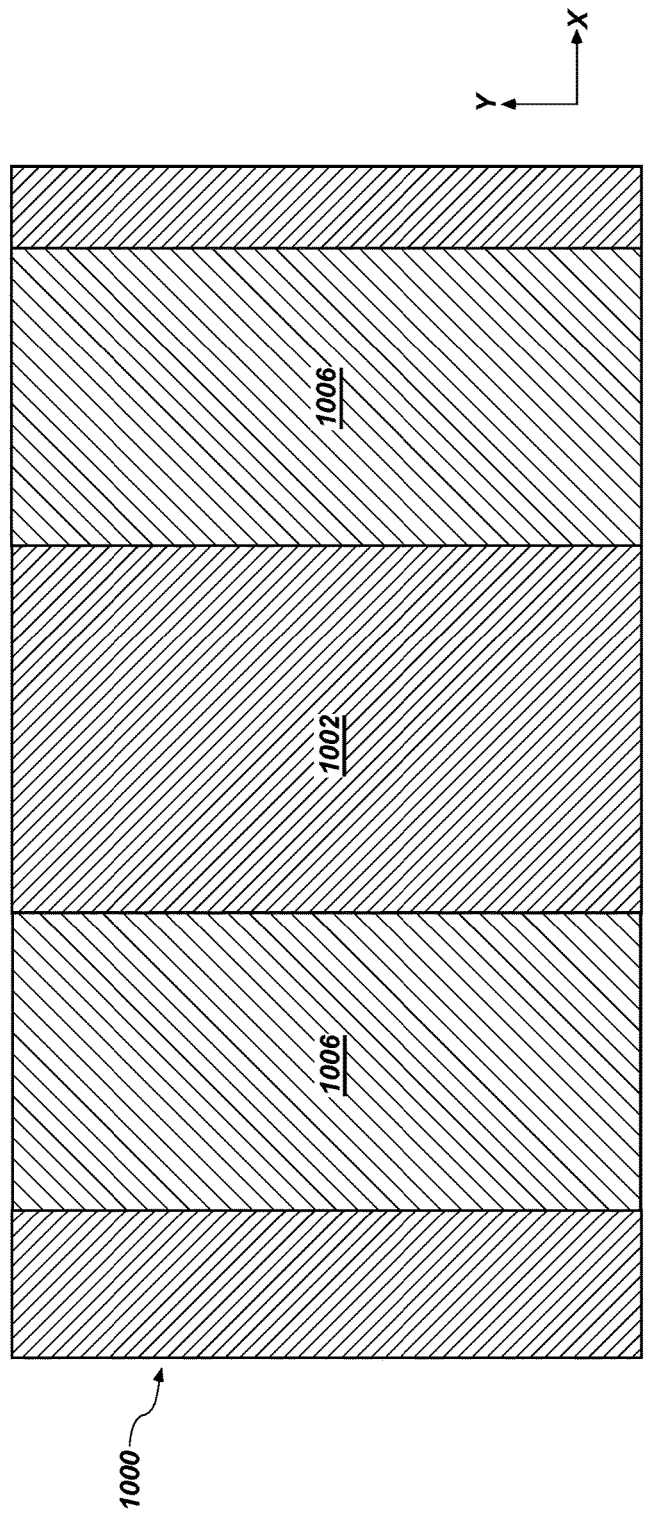

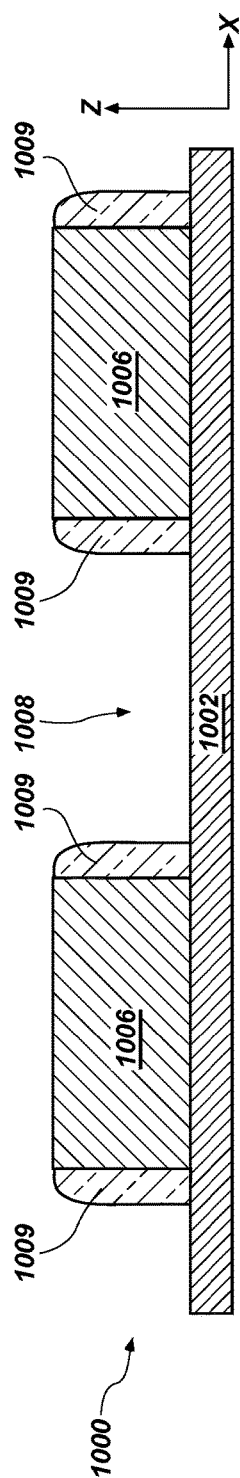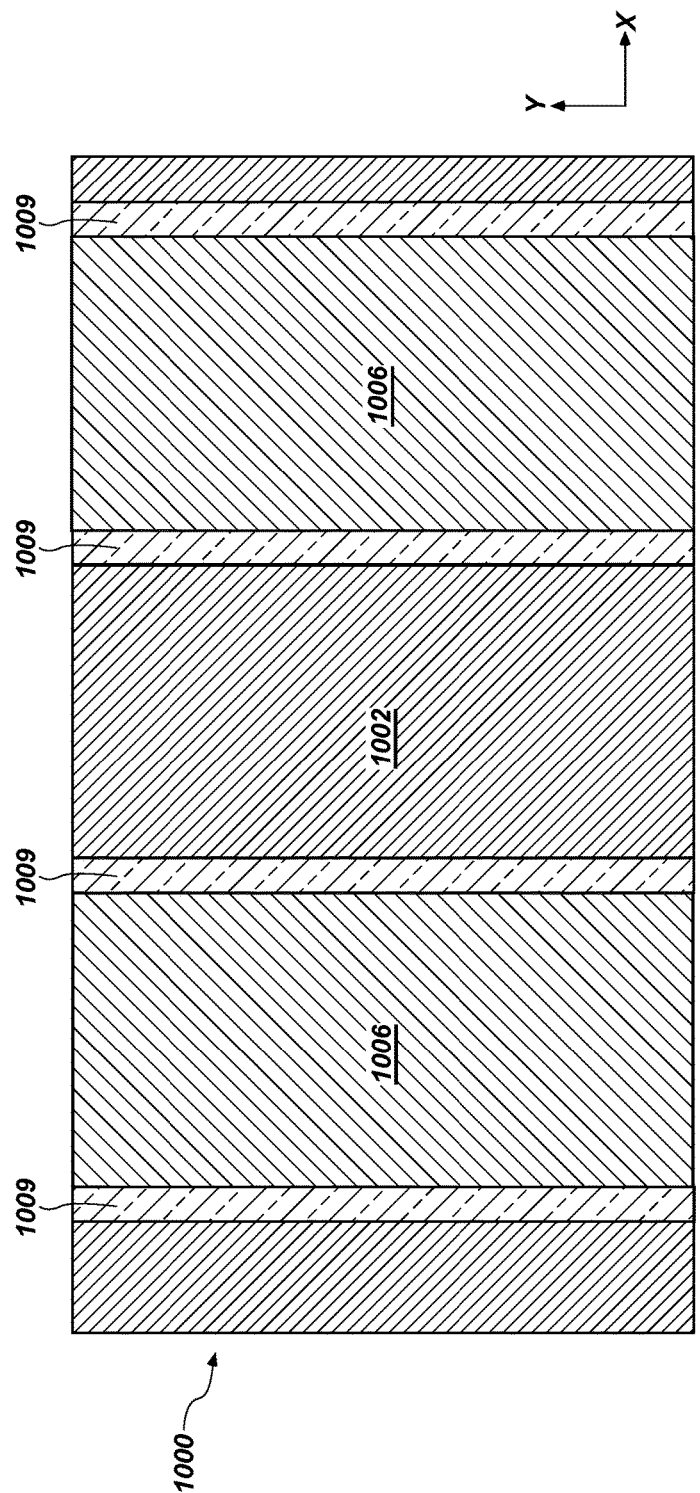

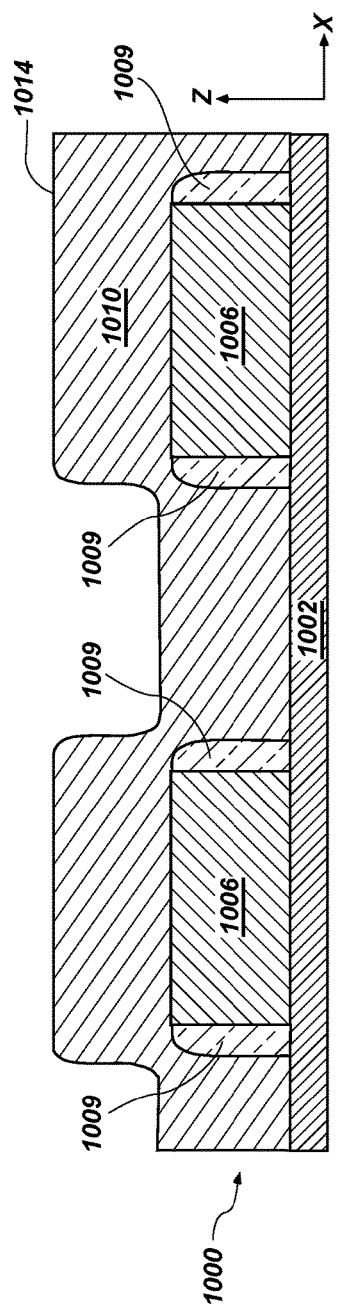
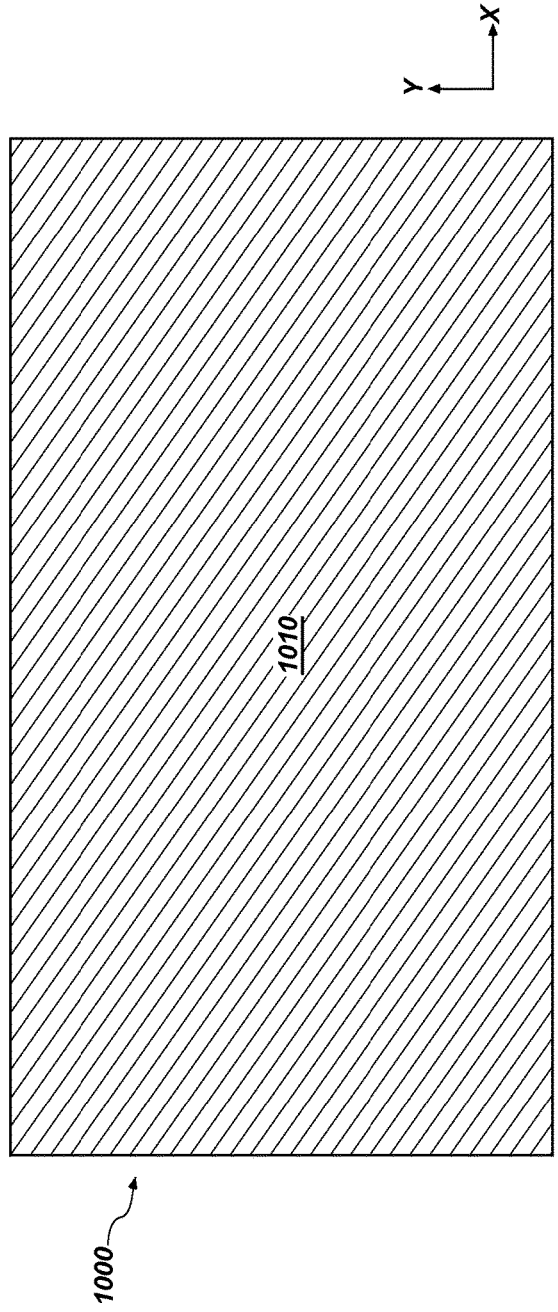
FIG. 12A
FIG. 12B

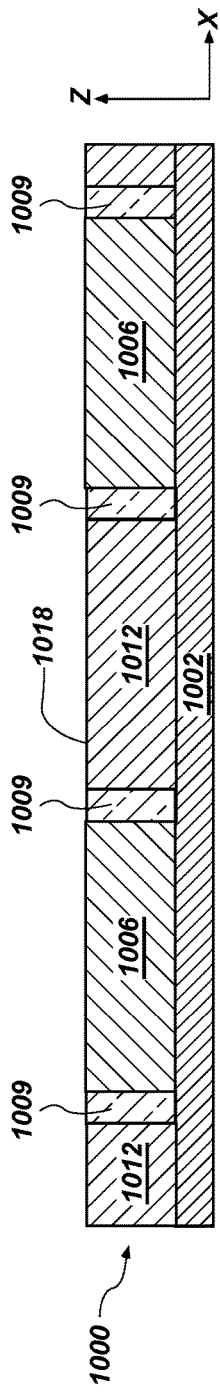
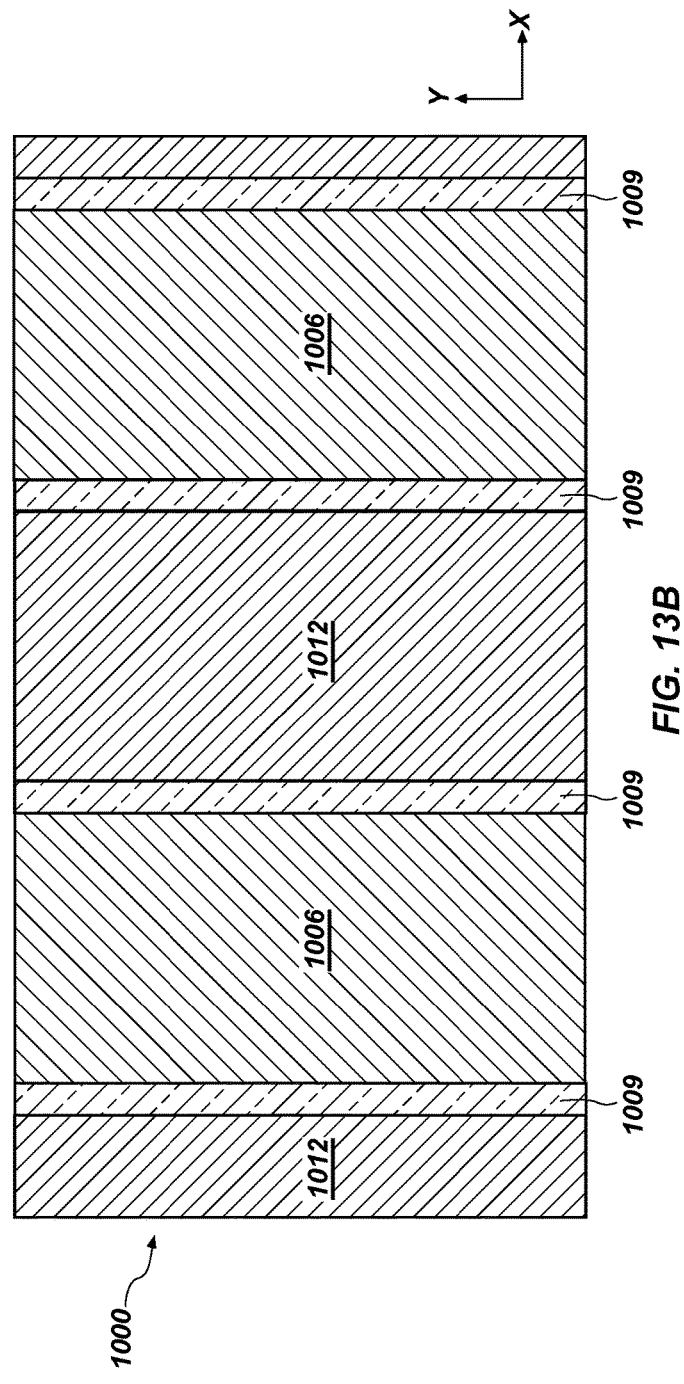
FIG. 13A
FIG. 13B

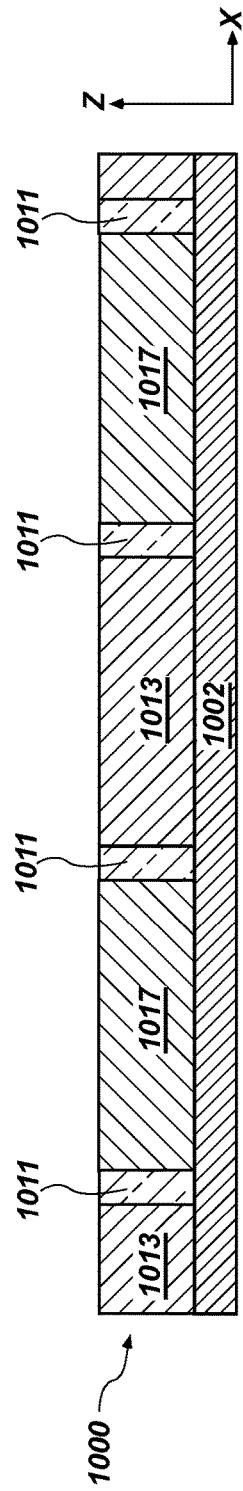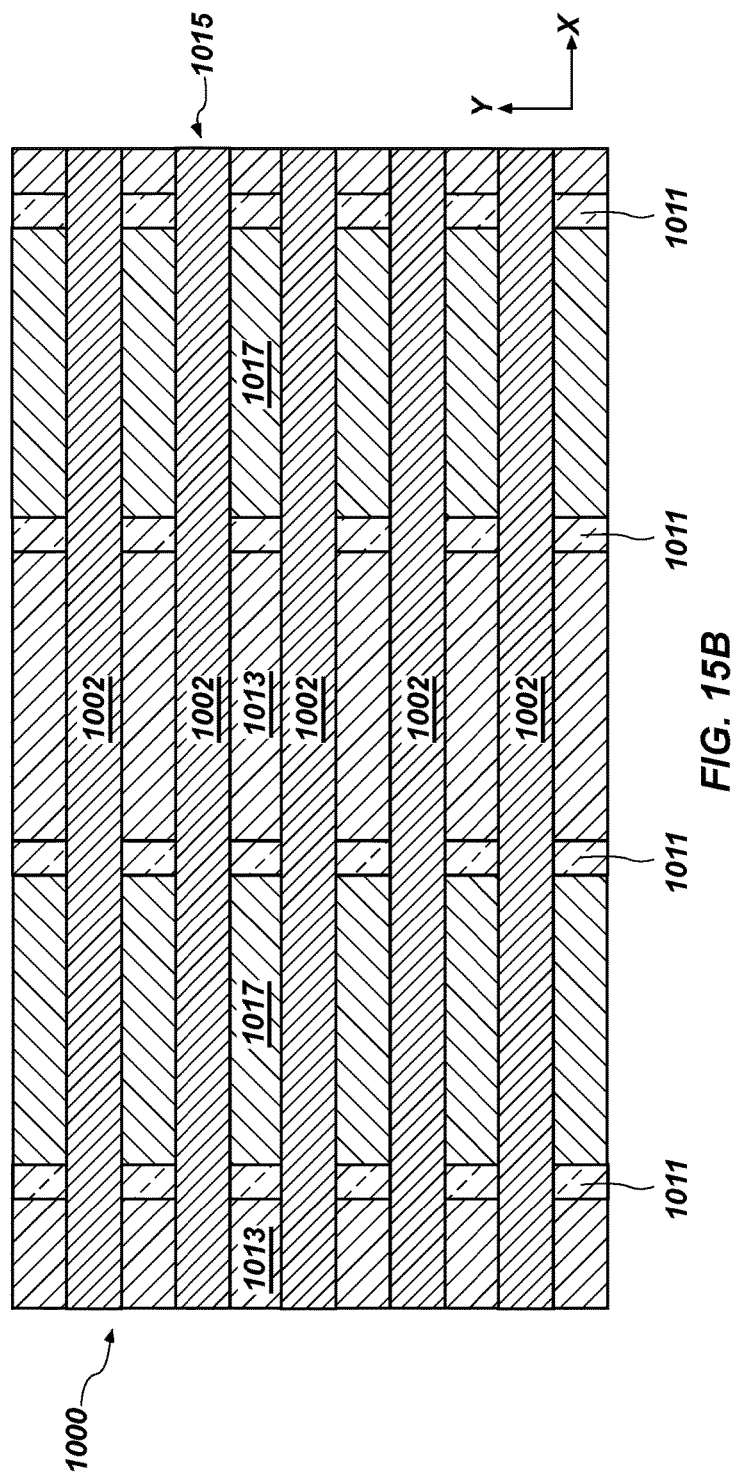

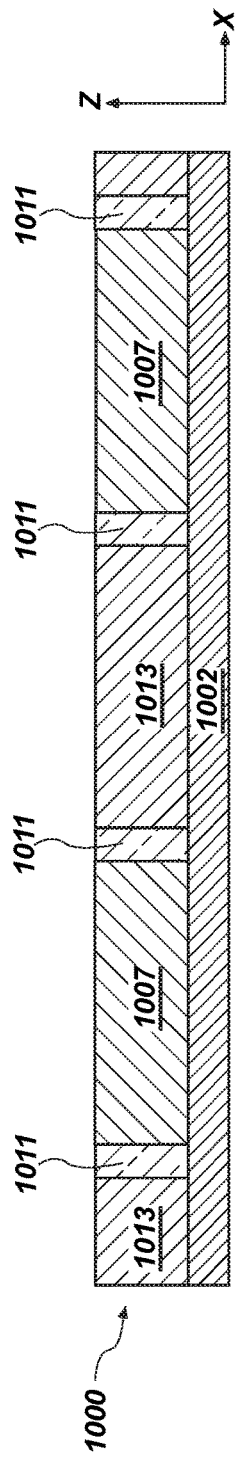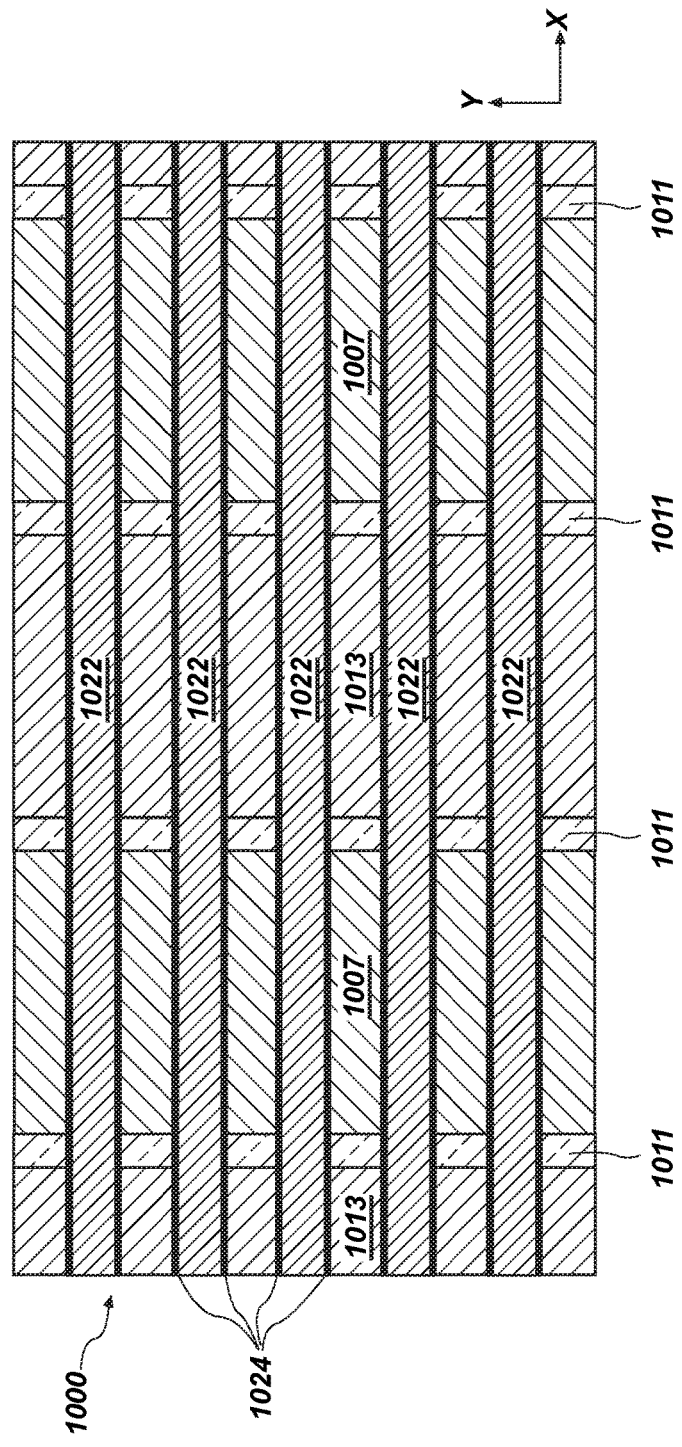
FIG. 16A
FIG. 16B

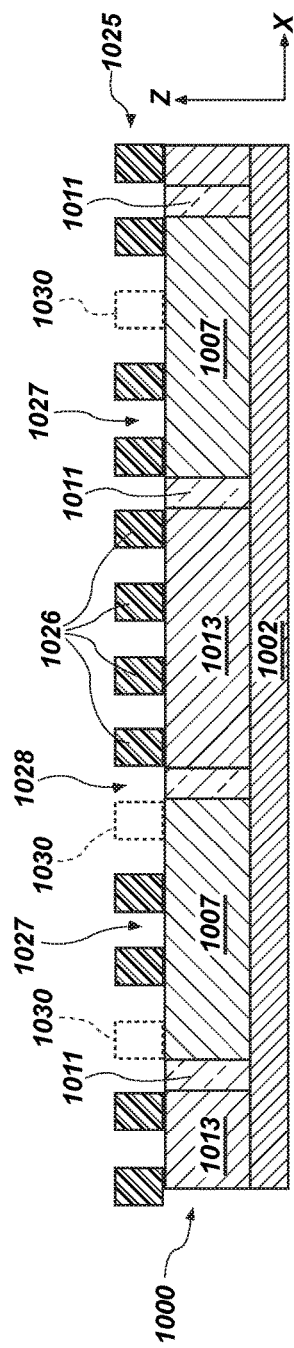
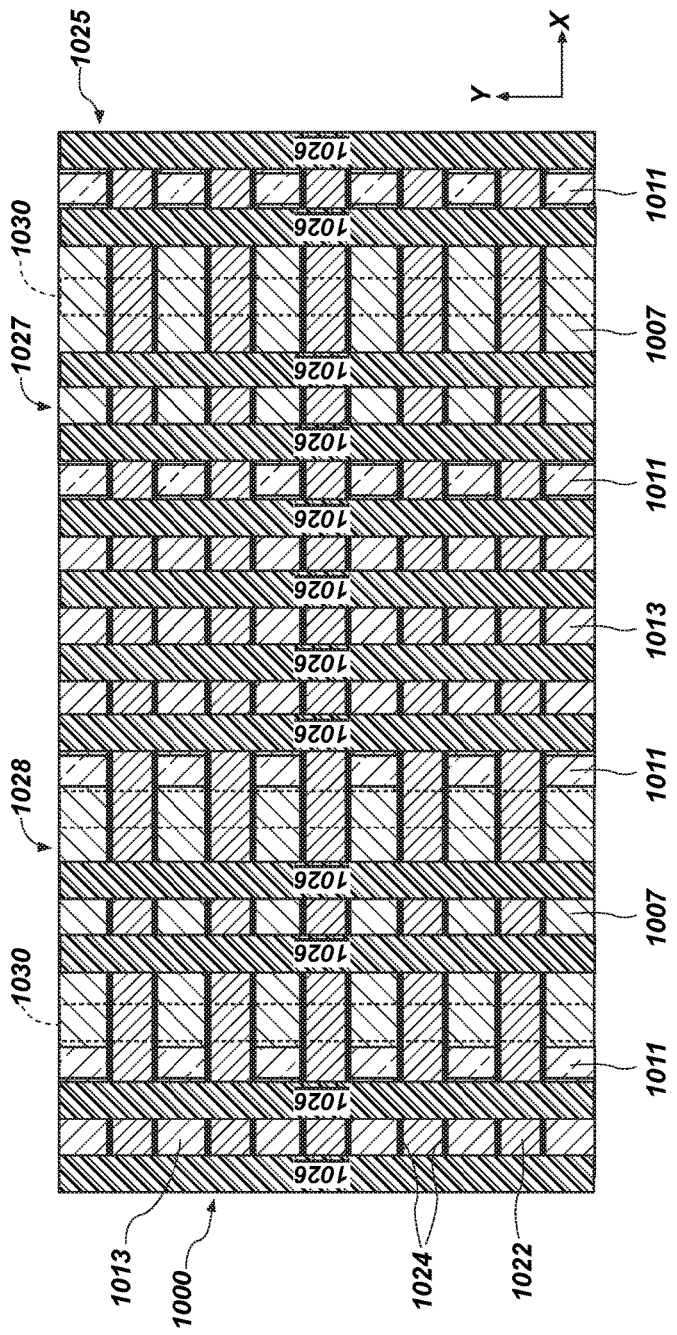
FIG. 17A
FIG. 17B

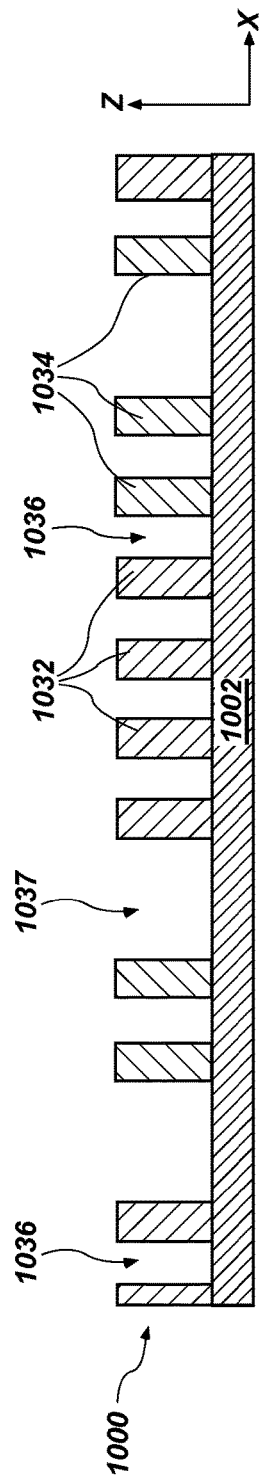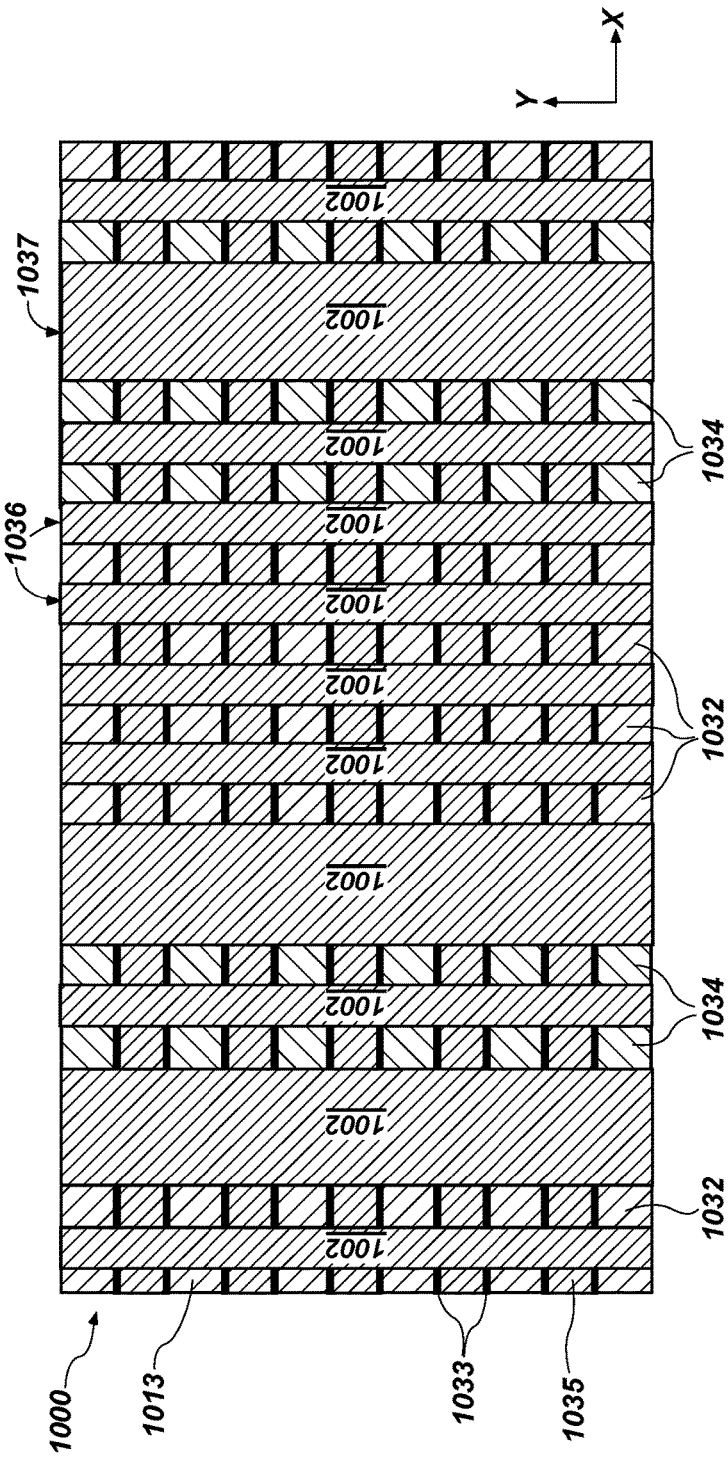

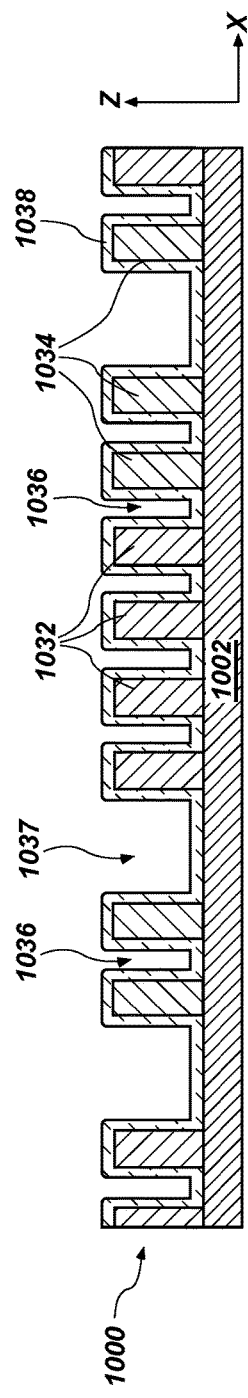
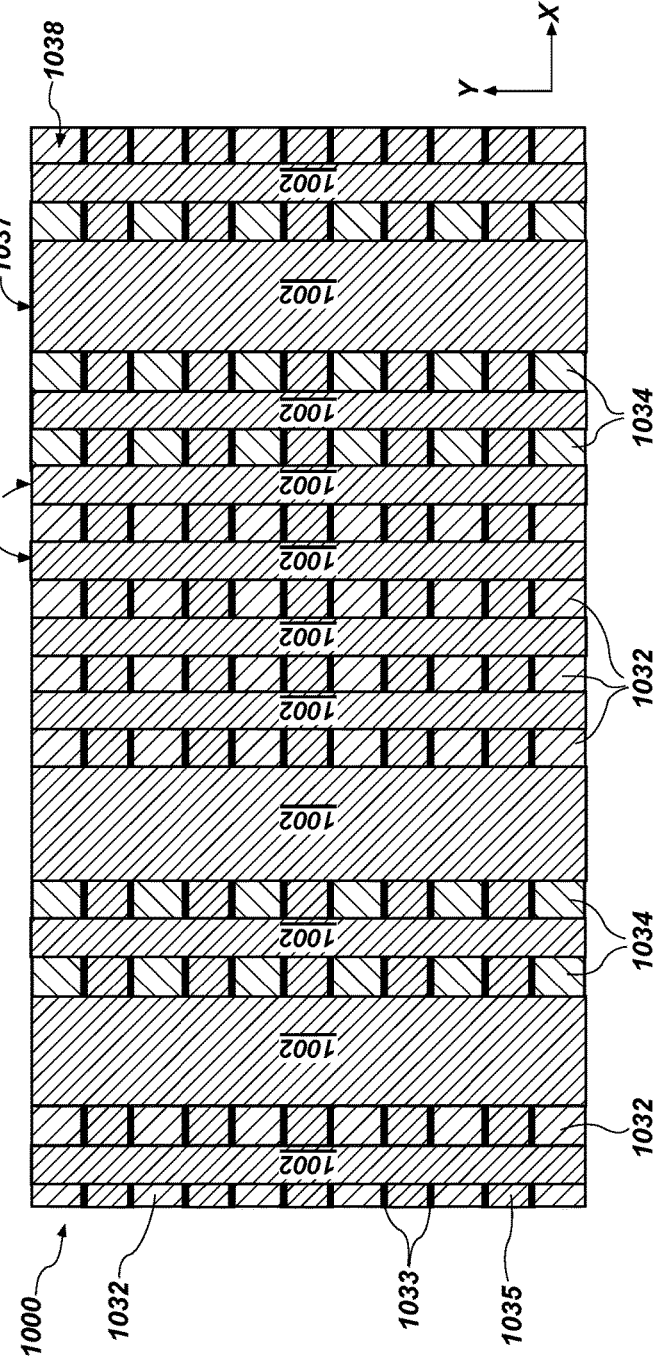
FIG. 19A
FIG. 19B

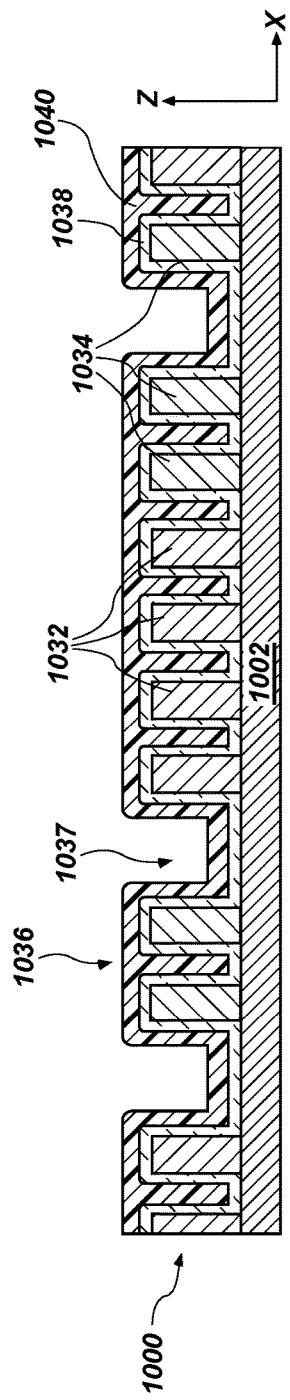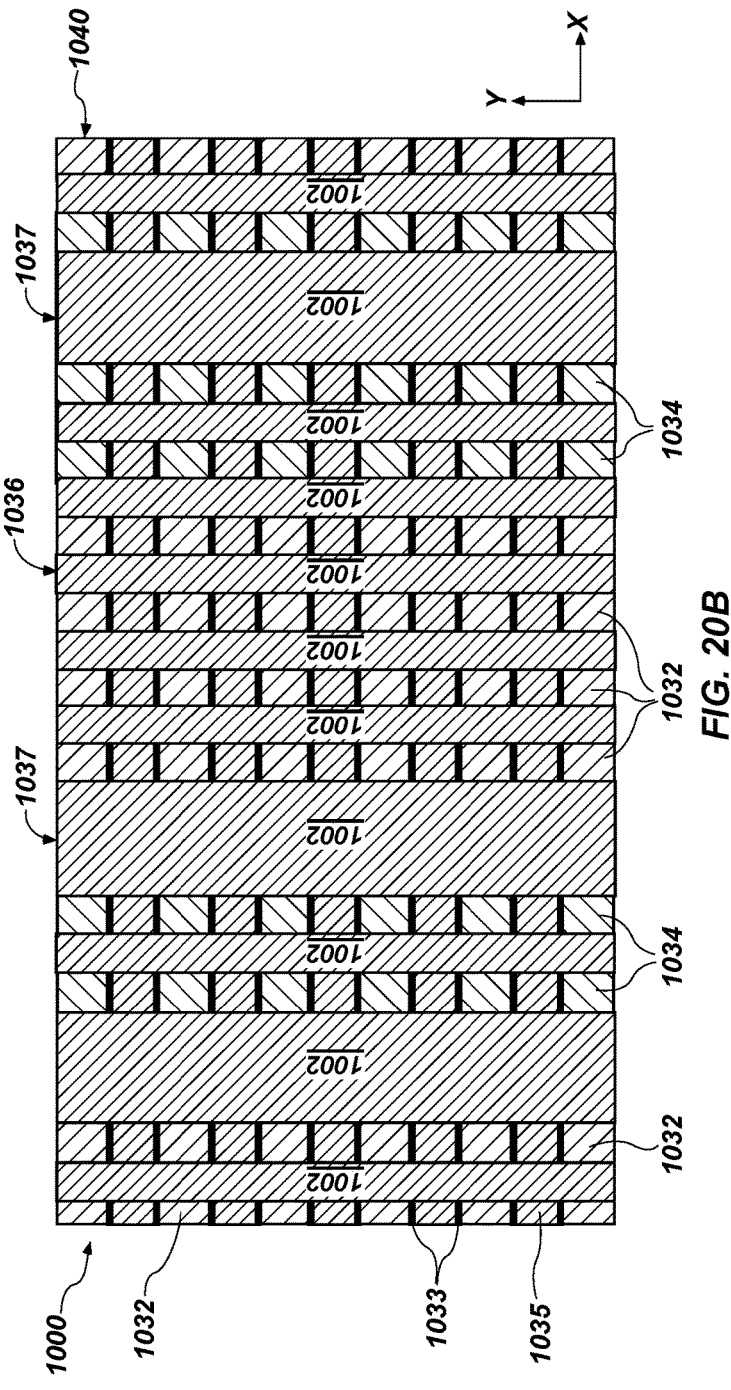
FIG. 20A
FIG. 20B

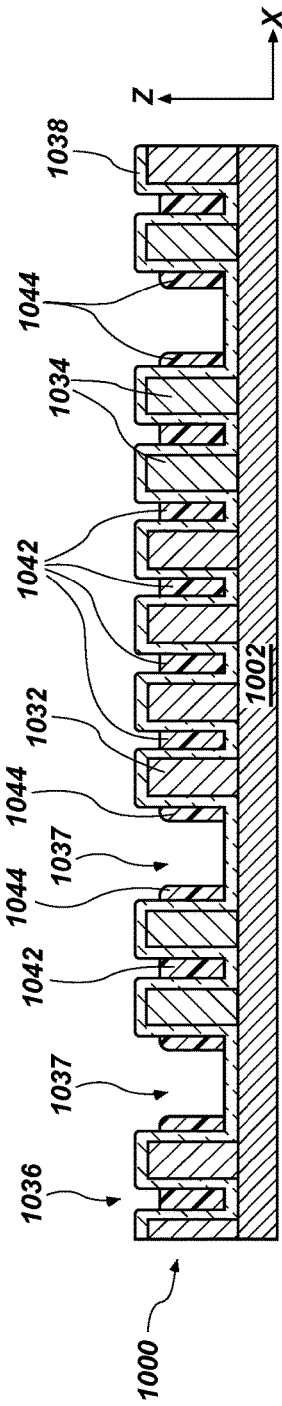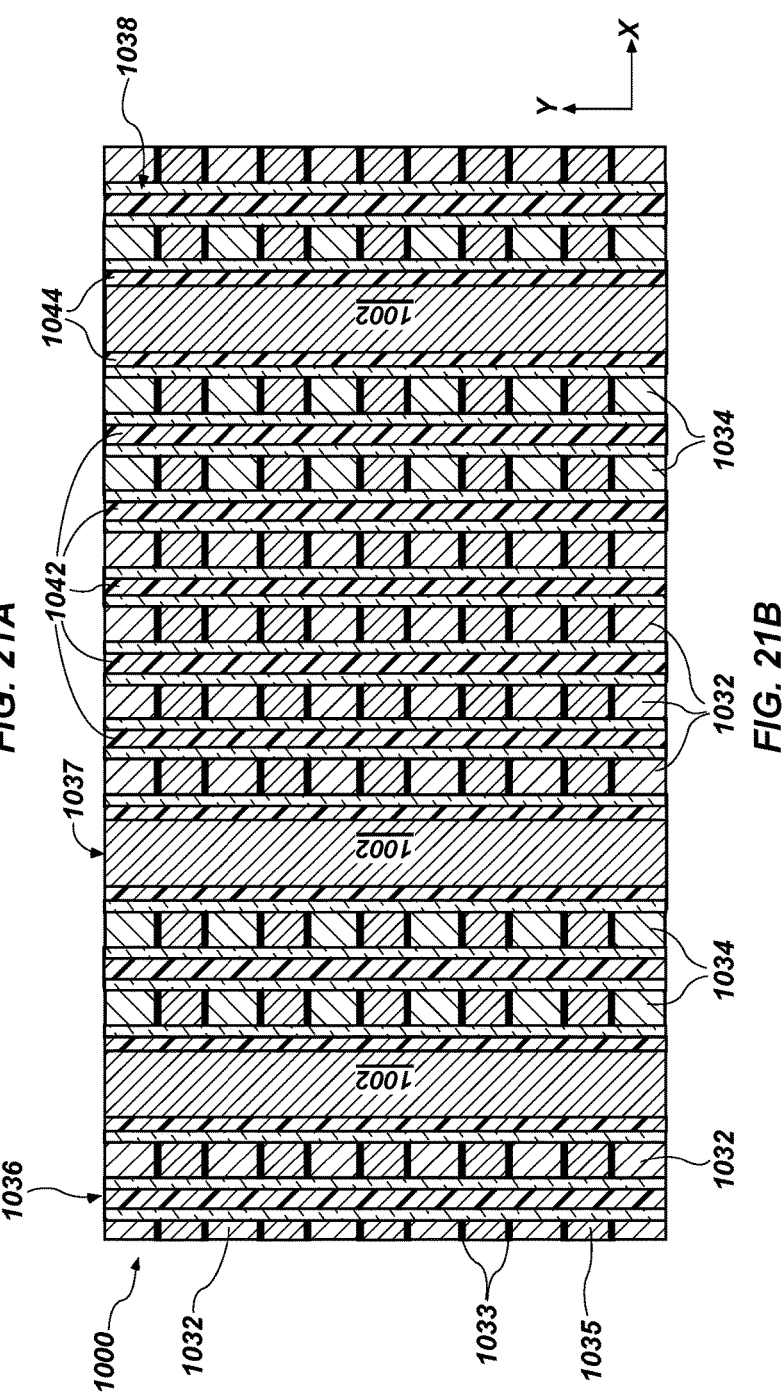
FIG. 21A
FIG. 21B

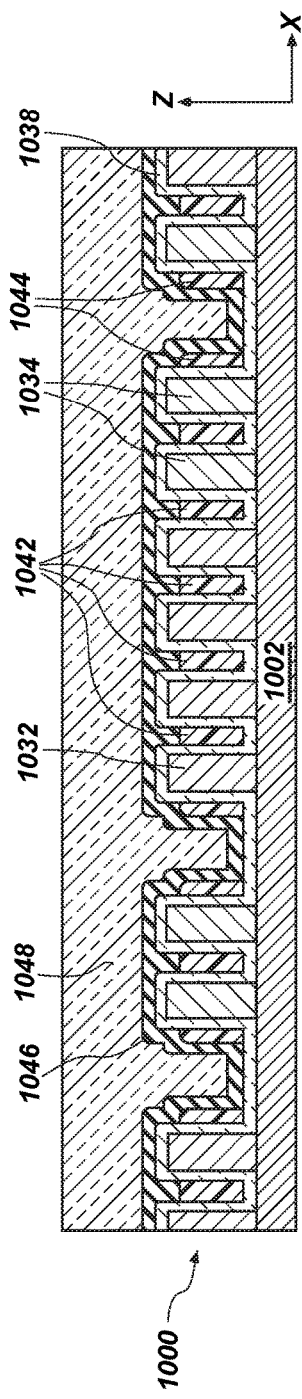
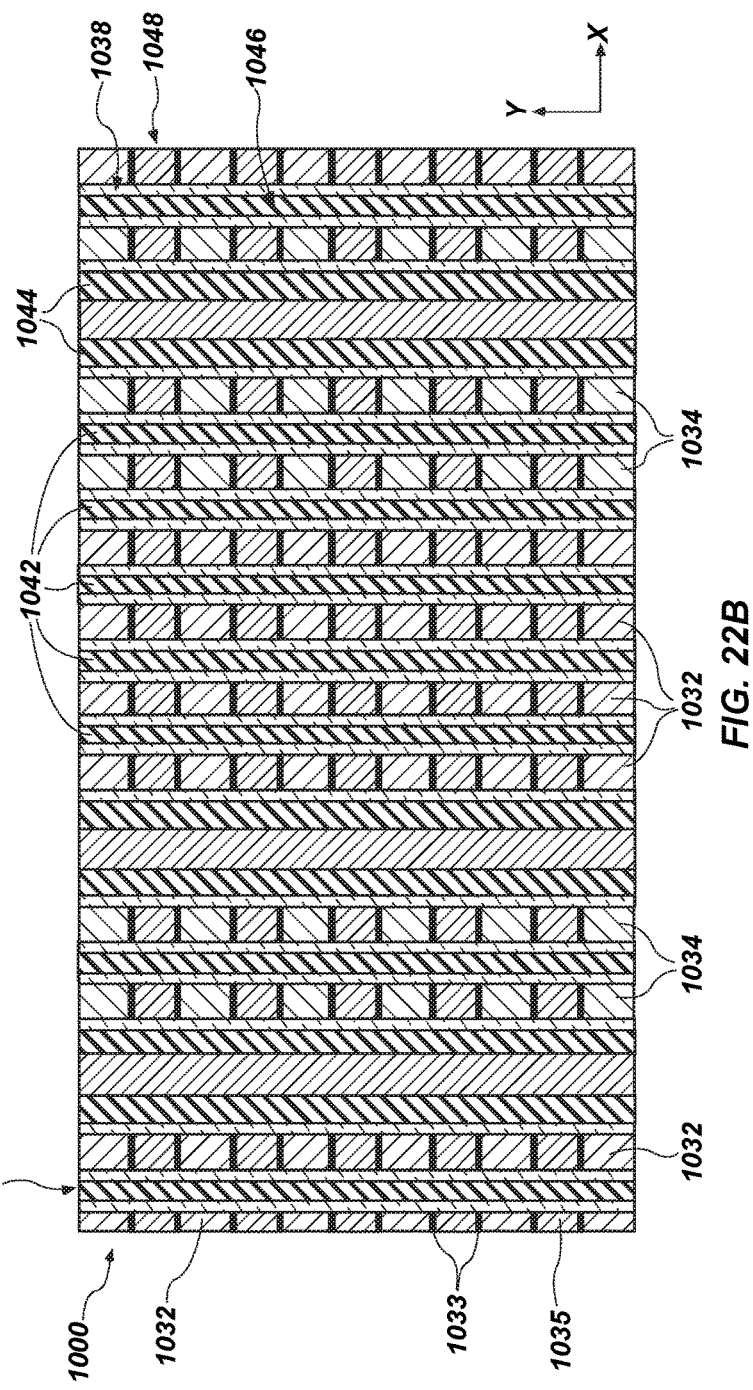
FIG. 22A
FIG. 22B

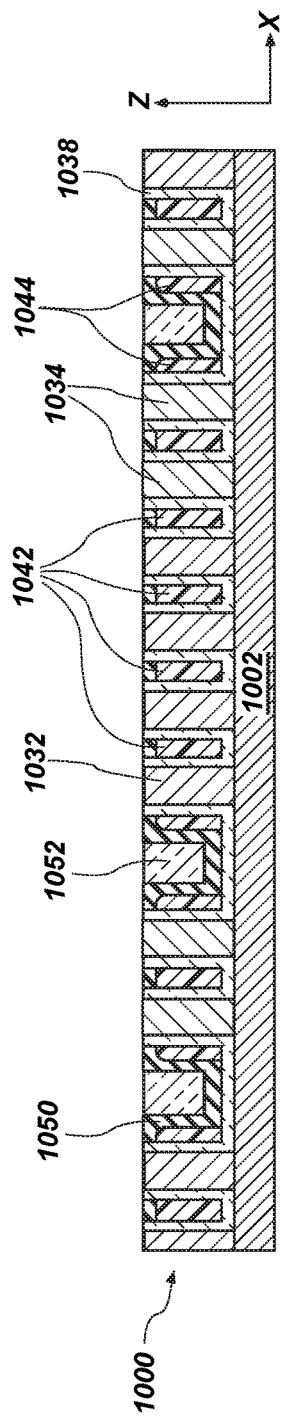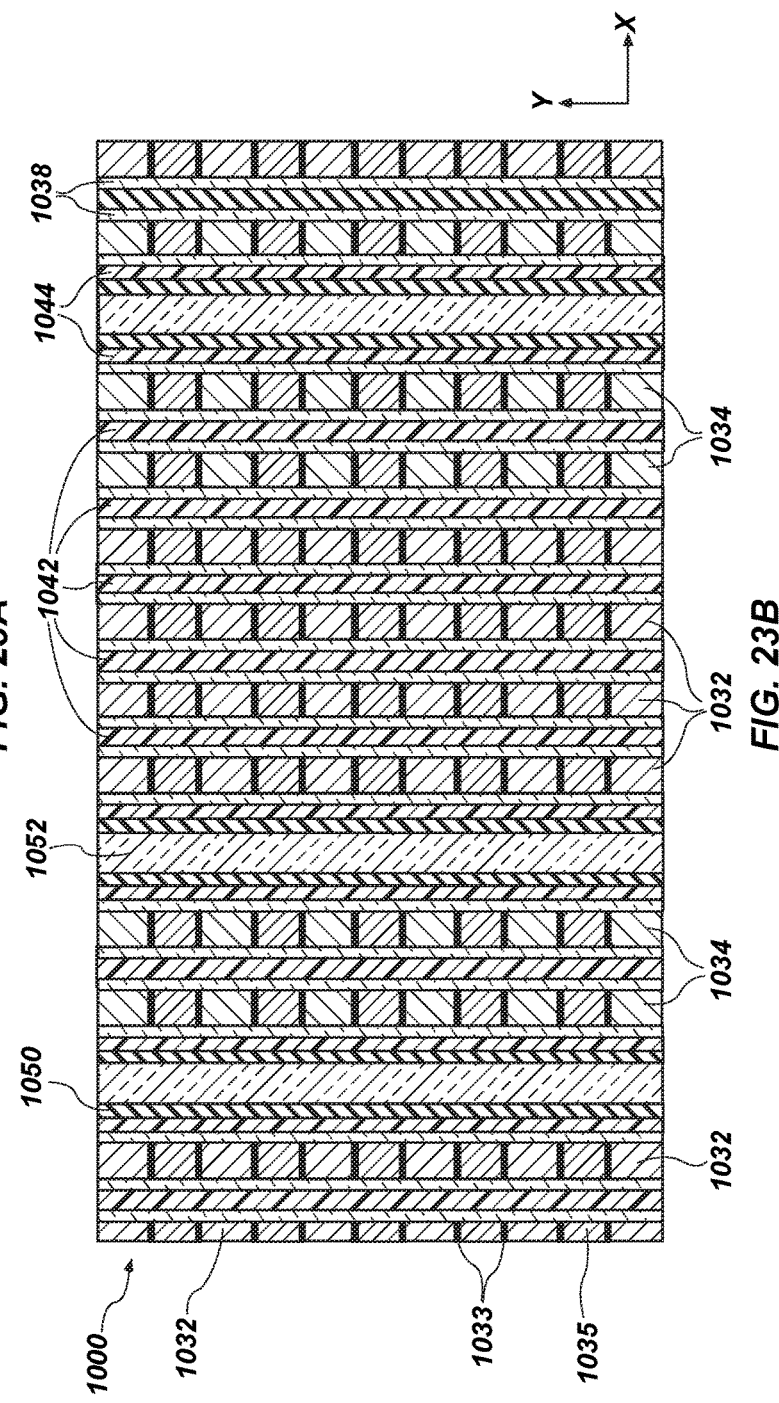
FIG. 23A
FIG. 23B

SEMICONDUCTOR DEVICES, AND RELATED CONTROL LOGIC ASSEMBLIES, CONTROL LOGIC DEVICES, ELECTRONIC SYSTEMS, AND METHODS

TECHNICAL FIELD

Embodiments of the disclosure relate to the field of semiconductor device design and fabrication. More specifically, embodiments of the present disclosure relate to control logic devices including shared gate electrodes, to control logic assemblies and semiconductor devices including the control logic devices, to methods of forming the control logic devices, to methods of operating the semiconductor devices, and to electronic systems including the semiconductor devices.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read-only memory (ROM), dynamic random access memory (DRAM), synchronous dynamic random access memory (SDRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) on the memory cells of the memory device. An assembly of the control logic devices may be provided in electrical communication with the memory cells of the memory array by way of routing and interconnect structures. However, as the number of decks of a 3D memory array increases, electrically connecting the memory cells of the different decks of the 3D memory array to the assembly of control logic devices within the base control logic structure can create sizing and spacing complications associated with the increased quantities and dimensions of routing and interconnect structures required to facilitate the electrical connection. In addition, the quantities, dimensions, and arrangements of the different control logic devices employed within the base control logic structure can also undesirably impede reductions to the size of a memory device, increases to the storage density of the memory device, and/or reductions in fabrication costs.

It would, therefore, be desirable to have improved semiconductor devices, control logic assemblies, and control logic devices facilitating higher packing densities, as well as methods of forming the semiconductor devices, control logic assemblies, and control logic devices.

BRIEF DESCRIPTION OF THE DRAWINGS

FIGS. 4A and 4B are simplified cross-sectional (FIG. 4A) and plan (FIG. 4B) views of a two-input negative-AND (NAND) gate, in accordance with embodiments of the disclosure.

FIGS. 5A and 5B are simplified cross-sectional (FIG. 5A) and plan (FIG. 5B) views of a balanced CMOS inverter, in accordance with embodiments of the disclosure.

FIG. 5C is a plan view of an alternative configuration of the balanced CMOS inverter shown in FIGS. 5A and 5B, in accordance with additional embodiments of the disclosure.

FIGS. 6A and 6B are simplified cross-sectional (FIG. 6A) and plan (FIG. 6B) views of a balanced CMOS transmission pass gate, in accordance with embodiments of the disclosure.

FIG. 6C is a plan view of an alternative configuration of the balanced CMOS transmission pass gate shown in FIGS. 6A and 6B, in accordance with additional embodiments of the disclosure.

FIGS. 7A and 7B are simplified cross-sectional (FIG. 7A) and plan (FIG. 7B) views of a balanced two-input NAND gate, in accordance with embodiments of the disclosure.

FIG. 7C is a plan view of an alternative configuration of the balanced two-input NAND gate shown in FIGS. 7A and 7B, in accordance with additional embodiments of the disclosure.

FIGS. 8A and 8B are simplified cross-sectional (FIG. 8A) and plan (FIG. 8B) views of another balanced two-input NAND gate, in accordance with additional embodiments of the disclosure.

FIGS. 9A through 23B are simplified partial cross-sectional (i.e., FIGS. 9A, 10A, 11A, 12A, 13A, 14A, 15A, 16A, 17A, 18A, 19A, 20A, 21A, 22A, and 23A) and simplified partial plan (i.e., FIGS. 9B, 10B, 11B, 12B, 13B, 14B, 15B, 16B, 17B, 18B, 19B, 20B, 21B, 22B, and 23B) views illustrating embodiments of a method of forming a CMOS control logic device, in accordance with embodiments of the disclosure.

DETAILED DESCRIPTION

Figure 1:
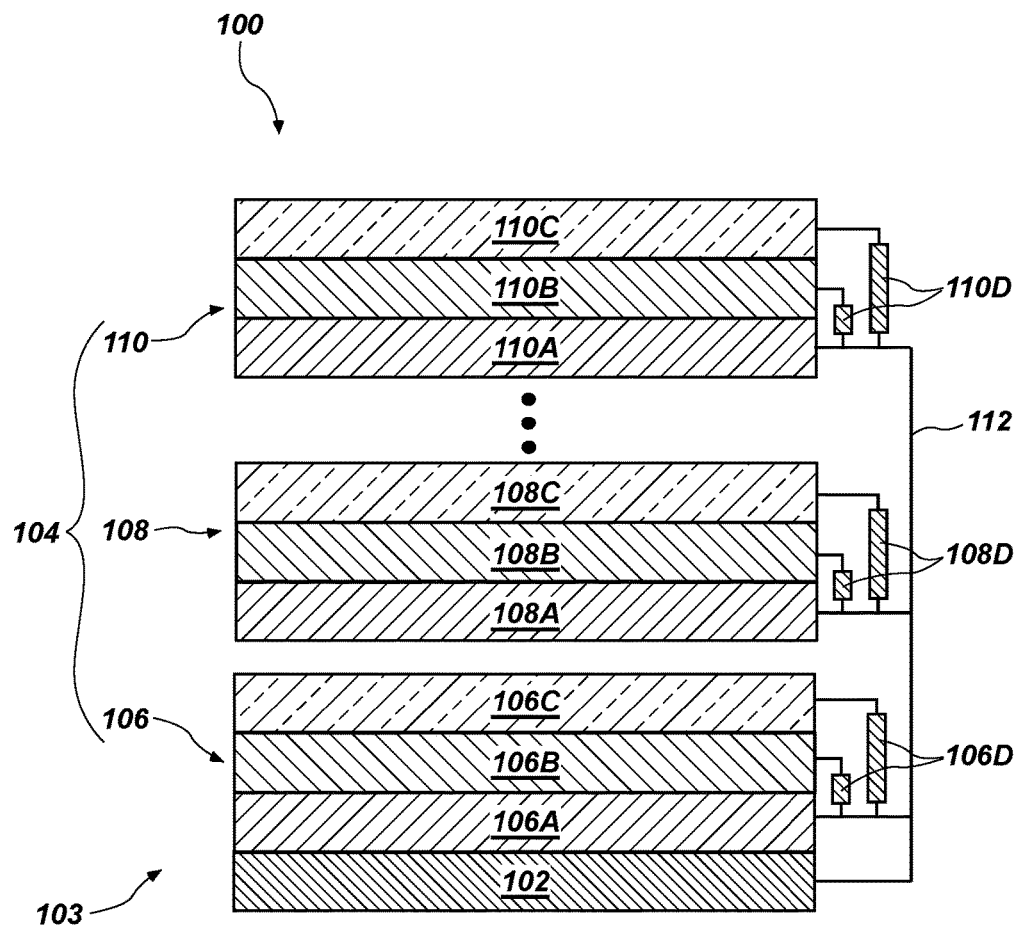
FIG. 1 is a simplified side elevation view of a semiconductor device, in accordance with embodiments of the disclosure.

Semiconductor devices including stack structures having TFT control logic levels in decks thereof are described, as are CMOS devices for inclusion in one or more of the TFT control logic levels, methods of forming the CMOS devices, methods of operating the semiconductor devices, and electronic systems including the semiconductor devices. In some embodiments, a semiconductor device includes a base control logic structure, and a stack structure on or over the base control logic structure including multiple decks (e.g., tiers) each individually including a TFT control logic level, an access device level on or over the TFT control logic level, and a memory element level on or over the access device level. The TFT control logic level of each individual deck of the stack structure is in electrical communication with the access device level and the memory element level of the individual deck, as well as the base control logic structure of the semiconductor device. The TFT control logic level of each of the decks of the stack structure includes TFT control logic devices and circuitry for controlling different operations of the memory element level and the access device level associated therewith. The TFT control logic devices and circuitry included in the TFT control logic level of each of the decks of the stack structure are different than additional control logic devices and circuitry included in the base control logic structure of the semiconductor device. The additional control logic devices and circuitry included in the base control logic structure work in conjunction with the TFT control logic devices and circuitry included in the TFT control logic level of each of the decks of the stack structure to facilitate desired operations (e.g., access operations, read operations, write operations) of the semiconductor device. In addition, the TFT control logic devices included in the TFT control logic level of at least one deck of the stack structure include at least one CMOS device including one or more gate electrodes shared between transistors (e.g., vertical transistors, such as vertical P-type metal-oxide-semiconductor (PMOS) transistors, vertical N-type metal-oxide-semiconductor (NMOS) transistors) thereof. The devices, structures, systems, and methods of the disclosure may facilitate increased efficiency, performance, simplicity, and durability in semiconductor devices (e.g., 3D memory devices) that rely on high packing density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, the term "about" in reference to a given parameter is inclusive of the stated value and has the meaning dictated by the context (e.g., it includes the degree of error associated with measurement of the given parameter).

As used herein, the term "NMOS" transistor means and includes a so-called metal-oxide transistor having a P-type channel region. The gate of the NMOS transistor may comprise a conductive metal, another conductive material, such as polysilicon, or a combination thereof. As used herein, the term "PMOS" transistor means and includes a so-called metal-oxide transistor having an N-type channel region. The gate of the PMOS transistor may comprise a conductive metal, another conductive material, such as polysilicon, or a combination thereof. Accordingly, the gate structures of such transistors may include conductive materials that are not necessarily metals.

FIG. 1 shows a simplified side elevation view of a semiconductor device 100 (e.g., a 3D memory device), in accordance with embodiments of the disclosure. As shown in FIG. 1, the semiconductor device 100 includes a base control logic structure 102, and a stack structure 103 overlying the base control logic structure 102. As described in further detail below, the stack structure 103 includes decks 104 (e.g., tiers) each individually including a thin film transistor (TFT) control logic level, an access device level over the TFT control logic level, a memory element level over the access device level, and interconnect structures extending between the TFT control logic level and each of the access device level and the memory element level. Each TFT control logic level of the decks 104 may individually include one or more control logic devices (e.g., CMOS devices) exhibiting gate electrodes shared between neighboring transistors (e.g., NMOS transistors, PMOS transistors) thereof, as also described in further detail below. The base control logic structure 102 is in electrical communication with one or more (e.g., each) of the decks 104 of the stack structure 103 by way of interconnect structures 112 extending between the base control logic structure 102 and one or more levels (e.g., the TFT control logic level) of the one or more decks 104 of the stack structure 103.

The base control logic structure 102 may include devices and circuitry for controlling various operations of the stack structure 103. The devices and circuitry included in the base control logic structure 102 may be selected relative to devices and circuitry included in the TFT control logic levels of the decks 104 of the stack structure 103. The devices and circuitry included in the base control logic structure 102 may be different than the devices and circuitry included in the TFT control logic levels of the decks 104 of the stack structure 103, and may be used and shared by different decks 104 of the stack structure 103 to facilitate desired operation of the stack structure 103. By way of non-limiting example, the base control logic structure 102 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, and various chip/deck control circuitry. The devices and circuitry included in the base control logic structure 102 may employ different conventional CMOS devices (e.g., conventional CMOS inverters, conventional CMOS NAND gates, conventional CMOS transmission pass gates, etc.), which are not described in detail herein. In turn, as described in further detail below, the devices and circuitry included in the TFT control logic level of each of the decks 104 of the stack structure 103 may not be shared by different decks 104 of the stack structure 103, and may be dedicated to effectuating and controlling various operations (e.g., access device level operations, and memory element level operations) of the deck 104 associated therewith not encompassed within the functions of the devices and circuitry included in the base control logic structure 102.

With continued reference to FIG. 1, the stack structure 103 may include any desired number of the decks 104. For clarity and ease of understanding of the drawings and related description, FIG. 1 shows the stack structure 103 as including three (3) decks 104. A first deck 106 may include a first TFT control logic level 106A, a first access device level 106B on or over the first TFT control logic level 106A, a first memory element level 106C on or over the first access device level 106B, and first interconnect structures 106D extending between and electrically coupling the first TFT control logic level 106A to each of the first access device level 106B and the first memory element level 106C. A second deck 108 may overlie the first deck 106 and may include a second TFT control logic level 108A, a second access device level 108B on or over the second TFT control logic level 108A, a second memory element level 108C on or over the second access device level 108B, and second interconnect structures 108D extending between and electrically coupling the second TFT control logic level 108A to each of the second access device level 108B and the second memory element level 108C. A third deck 110 may overlie the second deck 108 and may include a third TFT control logic level 110A, a third access device level 110B on or over the third TFT control logic level 110A, a third memory element level 110C on or over the third access device level 110B, and third interconnect structures 110D extending between and electrically coupling the third TFT control logic level 110A to each of the third access device level 110B and the third memory element level 110C. In additional embodiments, the stack structure 103 includes a different number of decks 104. For example, the stack structure 103 may include greater than three (3) decks 104 (e.g., greater than or equal to four (4) decks 104, greater than or equal to eight (8) decks 104, greater than or equal to sixteen (16) decks 104, greater than or equal to thirty-two (32) decks 104, greater than or equal to sixty-four (64) decks 104), or may include less than three (3) decks 104 (e.g., two (2) decks 104).

The memory element levels (e.g., the first memory element level 106C, the second memory element level 108C, the third memory element level 110C) of the each of the decks 104 (e.g., the first deck 106, the second deck 108, the third deck 110) of the stack structure 103 may each individually include an array of memory elements. The array may, for example, include rows of the memory elements extending in a first lateral direction, and columns of the memory elements extending in a second lateral direction perpendicular to the first lateral direction. In additional embodiments, the array may include a different arrangement of the memory elements, such as hexagonal close packed arrangement of the memory elements. The memory elements of the array may comprise RAM elements, ROM elements, DRAM elements, SDRAM elements, Flash memory elements, resistance variable memory elements, or another type of memory element. In some embodiments, the memory elements comprise DRAM elements. In additional embodiments, the memory elements comprise resistance variable memory elements. Non-limiting examples of resistance variable memory elements include ReRAM elements, conductive bridge RAM elements, MRAM elements, PCM memory elements, PCRAM elements, STTRAM elements, oxygen vacancy-based memory elements, and programmable conductor memory elements.

The access device levels (e.g., the first access device level 106B, the second access device level 108B, the third access device level 110B) of the each of the decks 104 (e.g., the first deck 106, the second deck 108, the third deck 110) of the stack structure 103 may each individually include an array of access devices (e.g., TFT access devices). The access devices of the access device level (e.g., the first access device level 106B, the second access device level 108B, the third access device level 110B) of a given deck 104 (e.g., the first deck 106, the second deck 108, the third deck 110) may be operatively associated with the memory elements of the memory element level (e.g., the first memory element level 106C, the second memory element level 108C, the third memory element level 110C) of the given deck 104. The quantity and lateral positioning of the access devices of the access device level of the given deck 104 may, for example, correspond to the quantity and lateral positioning of the memory elements of the memory element level of the given deck 104. The access devices of the access device level may underlie (or overlie) and be in electrical communication with the memory elements of the memory element level. Together the access devices of the access device level and the memory elements of the memory element level operatively associated therewith may form memory cells for each of the decks 104 of the stack structure 103. The access devices may, for example, each individually include a channel region between a pair of source/drain regions, and a gate configured to electrically connect the source/drain regions to one another through the channel region. The access devices may comprise planar access devices (e.g., planar TFT access devices) or vertical access devices (e.g., vertical TFT access devices). Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base (e.g., the base control logic structure 102) thereunder, and current flow between source and drain regions of a planar access device is primarily parallel to the primary surface of the substrate or base thereunder. In additional embodiments, the access device levels (e.g., the first access device level 106B, the second access device level 108B, the third access device level 110B) are omitted (e.g., absent) from the decks 104 (e.g., the first deck 106, the second deck 108, the third deck 110) of the stack structure 103. For example, in place of the access device levels separate from the memory element levels (e.g., the first memory element level 106C, the second memory element level 108C, the third memory element level 110C), each of the decks 104 of the stack structure 103 may include a single (e.g., only one) level including memory elements and access devices.

The TFT control logic levels (e.g., the first TFT control logic level 106A, the second TFT control logic level 108A, the third TFT control logic level 110A) of the each of the decks 104 (e.g., the first deck 106, the second deck 108, the third deck 110) of the stack structure 103 may include devices and circuitry for controlling various operations of the memory element level (e.g., the first memory element level 106C, the second memory element level 108C, the third memory element level 110C) and the access device level (e.g., the first access device level 106B, the second access device level 108B, the third access device level 110B) (or of a single level including memory elements and access devices) of the deck 104 not encompassed (e.g., effectuated, carried out, covered) by the devices and circuitry of the base control logic structure 102. By way of non-limiting example, the TFT control logic levels may each individually include one or more (e.g., each) of decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), word line (WL) drivers, repair circuitry (e.g., column repair circuitry, row repair circuitry), I/O devices (e.g., local I/O devices), test devices, array multiplexers (MUX), error checking and correction (ECC) devices, and self-refresh/wear leveling devices. As described in further detail below, the devices and circuitry included in the TFT control logic levels may employ TFT CMOS devices (e.g., CMOS inverters, CMOS NAND gates, CMOS pass gates, etc.) including gate electrodes shared between transistors (e.g., PMOS transistors, NMOS transistors) thereof. The devices and circuitry of the TFT control logic level of each of the decks 104 may only be utilized to effectuate and control operations within a single (e.g., only one) deck 104 of the stack structure 103 (e.g., may not be shared between two or more of the decks 104), or may be utilized to effectuate and control operations within multiple (e.g., more than one) decks 104 of the stack structure 103 (e.g., may be shared between two or more of the decks 104). In addition, each of the TFT control logic levels (e.g., the first TFT control logic level 106A, the second TFT control logic level 108A, and the third TFT control logic level 110A) of the stack structure 103 may exhibit substantially the same configuration (e.g., substantially the same components and component arrangements), or at least one of the TFT control logic levels of the stack structure 103 may exhibit a different configuration (e.g., different components and/or a different component arrangement) than at least one other of the TFT control logic levels.

Thus, a semiconductor device according to embodiments of the disclosure comprises a stack structure comprising decks each comprising a memory element level comprising memory elements, and a control logic level in electrical communication with the memory element level and comprising control logic devices. At least one of the control logic devices of the control logic level of one or more of the decks comprises at least one device exhibiting a gate electrode shared by neighboring vertical transistors thereof.

Figure 2:
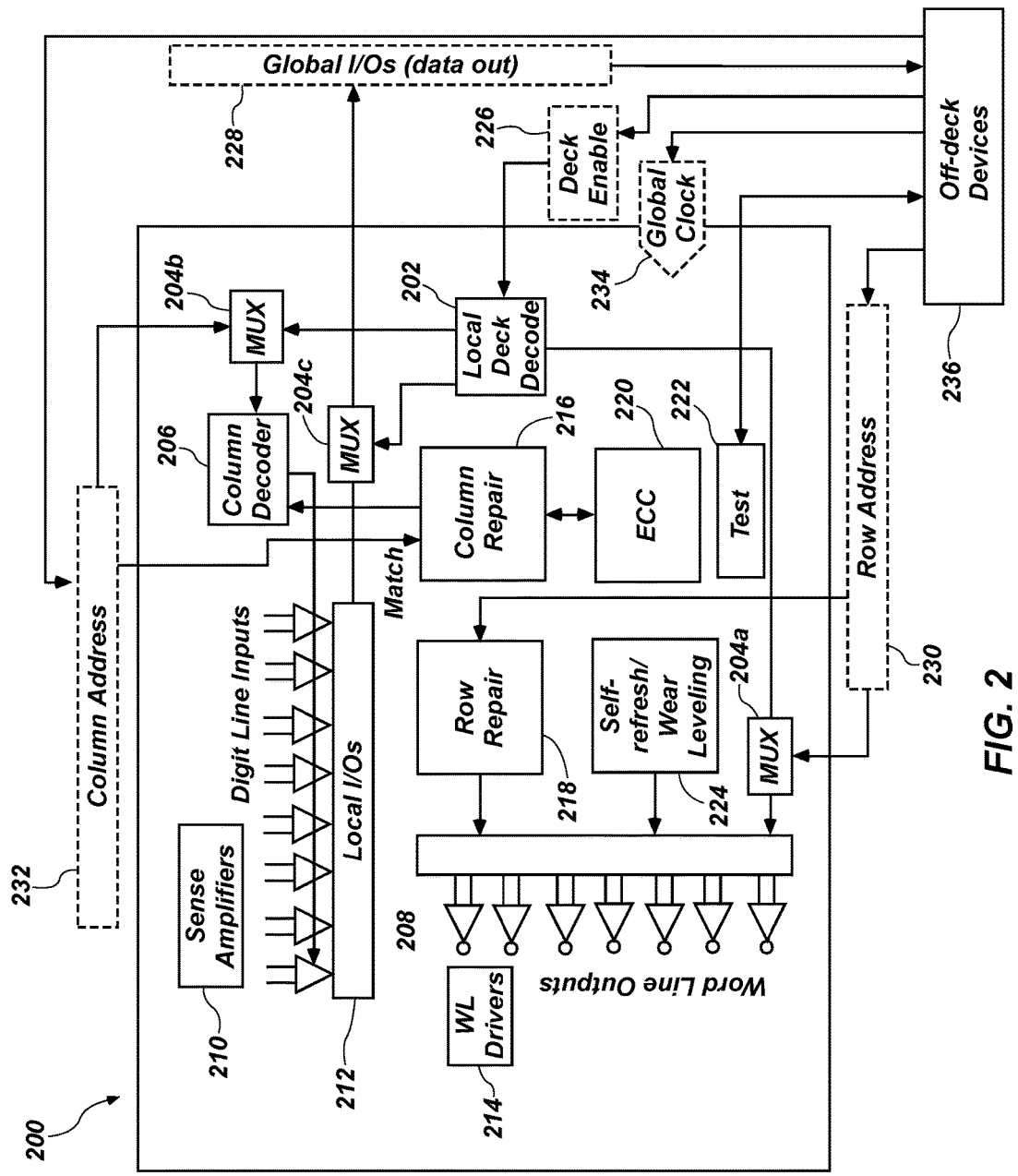
FIG. 2 is a block diagram of a thin film transistor (TFT) control logic level of the semiconductor device shown in FIG. 1, in accordance with embodiments of the disclosure.

FIG. 2 is a block diagram of a configuration of a TFT control logic level 200 for use in one or more of the decks 104 (FIG. 1) of the stack structure 103 (FIG. 1) of the semiconductor device 100 shown in FIG. 1. The TFT control logic level 200 may include a variety of control logic devices and circuits that would otherwise be included in off-deck circuitry (e.g., circuitry not presented within the TFT control logic level 200), such as circuitry within a base control logic structure (e.g., the base control logic structure 102 shown in FIG. 1). For example, as shown in FIG. 2, an assembly of control logic devices and circuits present within the TFT control logic level 200 may include one or more (e.g., each) of a local deck decoder 202, multiplexers (MUX) 204 (illustrated in FIG. 2 as a first MUX 204a, second MUX 204b, and a third MUX 204c), a column decoder 206, a row decoder 208, sense amplifiers 210, local I/O devices 212, word line (WL) drivers 214, a column repair device 216, a row repair device 218, a memory test device 222, an ECC device 220, and a self-refresh/wear leveling device 224. One or more of the control logic devices and circuits may exhibit a gate electrode shared by neighboring vertical transistors thereof, as described in further detail below. The assembly of control logic devices and circuits present within the TFT control logic level 200 may be operatively associated with (e.g., in electrical communication with) off-deck devices 236 (e.g., a controller, a host, global I/O devices) located outside of the TFT control logic level 200, such as within the base control logic structure 102 shown in FIG. 1. The off-deck devices 236 may send a variety signals to the TFT control logic level 200, such as a deck enable signal 226, a column address signal 232, a row address signal 230, a global clock signal 234; and may also receive a variety of signals from the TFT control logic level 200, such as a global data signal 228. While FIG. 2 depicts a particular configuration of the TFT control logic level 200, one of ordinary skill in the art will appreciate that different control logic assembly configurations, including different control logic devices and circuits and/or different arrangements of control logic devices and circuits, are known in the art which may be adapted to be employed in embodiments of the disclosure. FIG. 2 illustrates just one non-limiting example of the TFT control logic level 200.

Thus, in accordance with embodiments of the disclosure, a method of operating a semiconductor device comprises controlling functions of a stack structure having multiple decks each comprising memory cells using control logic levels of the multiple decks. The control logic levels each comprise at least one control logic device exhibiting a gate electrode shared by neighboring vertical transistors thereof. Additional functions of the stack structure are controlled using a base control logic structure in electrical communication with the control logic levels of the stack structure.

As shown in FIG. 2, one or more off-deck devices 236 located outside of the TFT control logic level 200 (e.g., in the base control logic structure 102 shown in FIG. 1) may be configured and operated to convey signals (e.g., a deck enable signal 226, a row address signal 230, a column address signal 232) to different devices of the TFT control logic level 200. For example, the off-deck devices 236 may send a deck enable signal 226 to the local deck decoder 202, which may decode the deck enable signal 226 and activate one or more of the MUX 204 (e.g., the first MUX 204a, the second MUX 204b, and/or the third MUX 204c) of the TFT control logic level 200. As described in further detail below, when activated, the MUX 204 may individually be configured and operated to select one of several input signals and then forward the selected input into a single line.

The first MUX 204a (e.g., a row MUX) of the TFT control logic level 200 may be in electrical communication with the local deck decoder 202 and the row decoder 208 of the TFT control logic level 200. The first MUX 204a may be activated by signal(s) from the local deck decoder 202, and may be configured and operated to selectively forward at least one row address signal 230 from the off-deck devices 236 to the row decoder 208. The row decoder 208 may be configured and operated to select particular word lines of a deck (e.g., one of the first deck 106, the second deck 108, and the third deck 110 shown in FIG. 1) including the TFT control logic level 200 based on the row address signal 230 received thereby.

With continued reference to FIG. 2, the row repair device 218 of the TFT control logic level 200 may be in electrical communication with the row decoder 208, and may be configured and operated to substitute a defective row of memory elements of a memory element array of a memory element level (e.g., one of the memory element levels 106C, 108C, 110C shown in FIG. 1) operatively associated with (e.g., within the same deck 104 shown in FIG. 1) the TFT control logic level 200 for a spare, non-defective row of memory elements of the memory element array of the memory element level. The row repair device 218 may transform a row address signal 230 directed to the row decoder 208 (e.g., from the first MUX 204a) identifying the defective row of memory elements into another row address signal identifying the spare, non-defective row of memory elements. Defective rows (and columns) of memory elements may, for example, be determined using the memory test device 222 of the TFT control logic level 200, as described in further detail below.

The WL drivers 214 of the TFT control logic level 200 may be in electrical communication with the row decoder 208, and may be configured and operated to activate word lines of a deck (e.g., one of the first deck 106, the second deck 108, and the third deck 110 shown in FIG. 1) including the TFT control logic level 200 based on word line selection commands received from the row decoder 208. The memory elements of a memory element level (e.g., one of the memory element levels 106C, 108C, 110C shown in FIG. 1) operatively associated with the TFT control logic level 200 may be accessed by way of access devices of an access device level (e.g., one of the access device levels 106B, 108B, 110B shown in FIG. 1) operatively associated with the TFT control logic level 200 for reading or programming by voltages placed on the word lines using the WL drivers 214.

The self-refresh/wear leveling device 224 of the TFT control logic level 200 may be in electrical communication with the row decoder 208, and may be configured and operated to periodically recharge the data stored in memory elements of a memory element level (e.g., one of the memory element levels 106C, 108C, 110C shown in FIG. 1) operatively associated with (e.g., within the same deck 104 shown in FIG. 1) the TFT control logic level 200. During a self-refresh/wear leveling operation, the self-refresh/wear leveling device 224 may be activated in response to an external command signal, and may generate different row address signals that may be forwarded to the row decoder 208. The row decoder 208 may then select particular word lines of a deck (e.g., one of the first deck 106, the second deck 108, and the third deck 110 shown in FIG. 1) including the TFT control logic level 200 based on the different row address signals received from the self-refresh/wear leveling device 224. The row decoder 208 may then communicate with the WL drivers 214 to activate the selected word lines, and charges accumulated in capacitors of memory elements operatively associated with the selected word lines may then be amplified by a sense amplifier and then stored in the capacitors again.

Still referring to FIG. 2, the second MUX 204b (e.g., a column MUX) of the TFT control logic level 200 may be in electrical communication with the local deck decoder 202 and the column decoder 206 of the TFT control logic level 200. The second MUX 204b may be activated by signal(s) from the local deck decoder 202, and may be configured and operated to selectively forward at least one column address signal 232 from the off-deck devices 236 to the column decoder 206. The column decoder 206 may be configured and operated to select particular digit lines (e.g., bit lines) of a deck (e.g., one of the first deck 106, the second deck 108, and the third deck 110 shown in FIG. 1) including the TFT control logic level 200 based on the column address selection signal received thereby.

The column repair device 216 of the TFT control logic level 200 may be in electrical communication with the column decoder 206, and may be configured and operated to substitute a defective column of memory elements of a memory element array of a memory element level (e.g., one of the memory element levels 106C, 108C, 110C shown in FIG. 1) operatively associated with (e.g., within the same deck 104 shown in FIG. 1) the TFT control logic level 200 for a spare, non-defective column of memory elements of the memory element array of the memory element level. The column repair device 216 may transform a column address signal 232 directed to the column decoder 206 (e.g., from the second MUX 204b) identifying the defective column of memory elements into another column address signal identifying the spare, non-defective column of memory elements. As previously discussed, defective columns (and rows) of memory elements may, for example, be determined using the memory test device 222 of the TFT control logic level 200, as described in further detail below.

The ECC device 220 of the TFT control logic level 200 may be configured and operated to generate an ECC code (also known as "check bits"). The ECC code may correspond to a particular data value, and may be stored along with the data value in a memory element of a memory element level (e.g., one of the memory element levels 106C, 108C, 110C shown in FIG. 1) operatively associated with (e.g., within the same deck 104 shown in FIG. 1) the TFT control logic level 200. When the data value is read back from the memory element, another ECC code is generated and compared with the previously-generated ECC code to access the memory element. If non-zero, the difference in the previously-generated ECC code and the newly-generated ECC code indicates that an error has occurred. If an error condition is detected, the ECC device 220 may then be utilized to correct the erroneous data.

The memory test device 222 of the TFT control logic level 200 may be configured and operated to identify defective (e.g., faulty) memory elements of a memory element array of a memory element level (e.g., one of the memory element levels 106C, 108C, 110C shown in FIG. 1) operatively associated with (e.g., within the same deck 104 shown in FIG. 1) the TFT control logic level 200. The memory test device 222 may attempt to access and write test data to memory elements at different addresses (e.g., different column addresses, different row addresses) within the memory element array. The memory test device 222 may then attempt to read data stored at the memory elements, and compare the read data to the test data expected at the memory elements. If the read data is different than the expected test data, the memory test device 222 may identify the memory elements as defective. The defective memory elements (e.g., defective rows of memory elements, defective columns of memory elements) identified by the memory test device 222 may then be acted upon and/or avoided by other components (e.g., the row repair device 218, the column repair device 216) of the TFT control logic level 200.

With continued reference to FIG. 2, the local I/O devices 212 of the TFT control logic level 200 may be configured and operated to receive data from digit lines selected by the column decoder 206 during read operations, and to output data to digit lines selected by the column decoder 206 during write operations. As shown in FIG. 2, the local I/O devices 212 may include sense amplifiers 210 configured and operated to receive digit line inputs from the digit lines selected by the column decoder 206 and to generate digital data values during read operations. During write operations, the local I/O devices 212 may program data into memory elements of a memory element level operatively associated with the TFT control logic level 200 by placing proper voltages on the digit lines selected by the column decoder 206. For binary operation, one voltage level is typically placed on a digit line to represent a binary "1" and another voltage level to represent a binary "0".

The third MUX 204c of the TFT control logic level 200 may be in electrical communication with the local I/O devices 212 and the local deck decoder 202. The third MUX 204c may be activated by signal(s) received from the local deck decoder 202, and may be configured and operated to receive digital data values generated by the local I/O devices 212 and to generate a global data signal 228 therefrom. The global data signal 228 may be forwarded to one or more off-deck devices 236 (e.g., a controller).

In accordance with embodiments of the disclosure, one or more of the components (e.g., one or more of the local deck decoder 202, the MUX 204 (the first MUX 204a, the second MUX 204b, the third MUX 204c), the column decoder 206, the row decoder 208, the sense amplifiers 210, the local I/O devices 212, the WL drivers 214, the column repair device 216, the row repair device 218, the ECC device 220, the memory test device 222, the self-refresh/wear leveling device 224) of the TFT control logic level 200 may employ one or more TFT CMOS devices exhibiting gate electrodes shared between neighboring vertical transistors (e.g., vertical NMOS transistors, vertical PMOS transistors) thereof. Accordingly, one or more components of at least one of the TFT control logic levels (e.g., the first TFT control logic level 106A, the second TFT control logic level 108A, the third TFT control logic level 110A) of one or more of the decks 104 (e.g., the first deck 106, the second deck 108, the third deck 110) of the stack structure 103 of the semiconductor device 100 previously described with reference to FIG. 1 may include one or more TFT CMOS devices exhibiting gates shared between neighboring vertical transistors thereof. Non-limiting examples of such TFT CMOS devices are described in further detail below with reference to FIGS. 3 through 9B.

Thus, a control logic assembly according to embodiments of the disclosure comprises control logic devices selected from the group comprising decoders, sense amplifiers, word line drivers, repair devices, memory test devices, multiplexers, error checking and correction devices, and self-refresh/wear leveling devices. At least one of the control logic devices comprises at least one device exhibiting one or more gate electrodes is shared by neighboring vertical transistors thereof.

Figure 3:
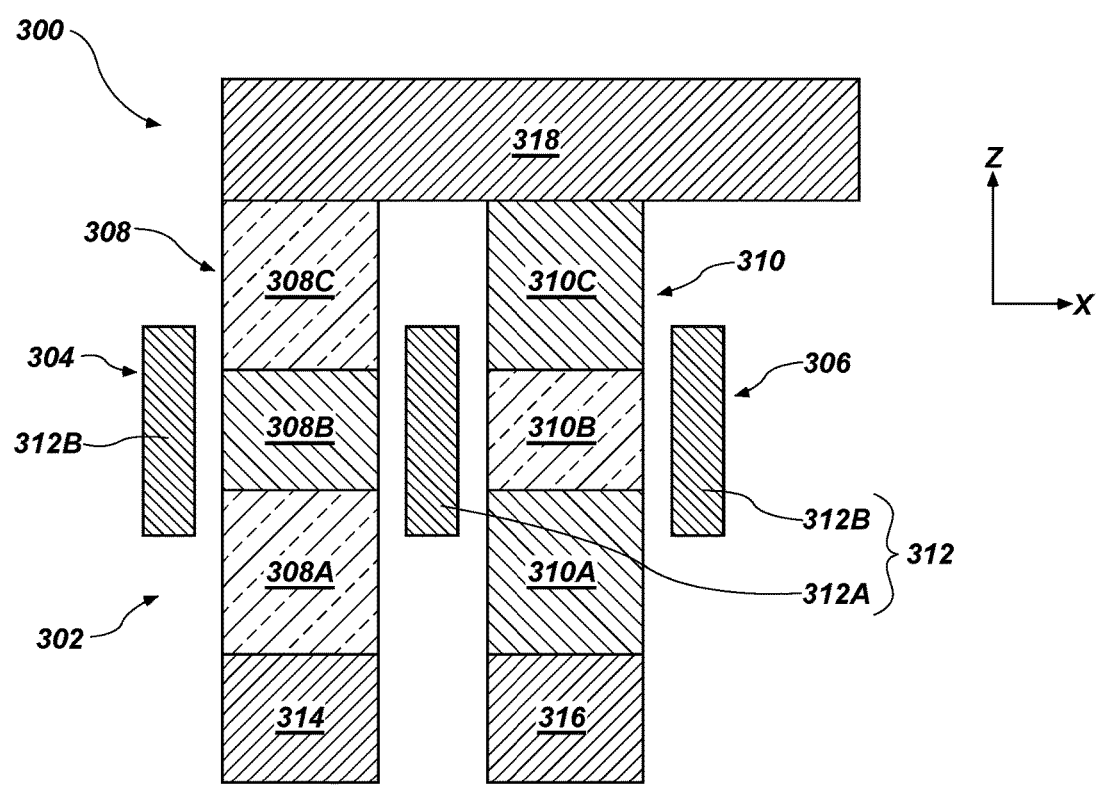
FIG. 3 is a simplified cross-sectional view of a complementary metal-oxide-semiconductor (CMOS) inverter, in accordance with embodiments of the disclosure.

FIG. 3 shows a simplified cross-sectional view of a CMOS inverter 300, in accordance with embodiments of the disclosure. The CMOS inverter 300 includes a CMOS circuit 302 comprising a vertical NMOS transistor 304 and a vertical PMOS transistor 306. The vertical NMOS transistor 304 includes a first semiconductive pillar 308 including an N-type source region 308A, an N-type drain region 308C, and a P-type channel region 308B vertically between the N-type source region 308A and the N-type drain region 308C. The vertical PMOS transistor 306 includes a second semiconductive pillar 310 including a P-type source region 310A, a P-type drain region 310C, and an N-type channel region 310B vertically between the P-type source region 310A and the P-type drain region 310C. The vertical NMOS transistor 304 and the vertical PMOS transistor 306 of the CMOS circuit 302 further include gate electrodes 312, including a first gate electrode 312A shared by the vertical NMOS transistor 304 and the vertical PMOS transistor 306, and second gate electrodes 312B not shared by the vertical NMOS transistor 304 and the vertical PMOS transistor 306. The CMOS inverter 300 also includes a ground (GND) structure 314 connected to the N-type source region 308A of the vertical NMOS transistor 304; a supply voltage ($V_{cc}$) structure 316 connected to the P-type source region 310A of vertical PMOS transistor 306; an output structure 318 connected to the N-type drain region 308C of the vertical NMOS transistor 304 and the P-type drain region 310C of the vertical PMOS transistor 306; and an input structure connected to each of the gate electrodes 312 (e.g., the first gate electrode 312A and the second gate electrodes 312B).

As shown in FIG. 3, the first gate electrode 312A may be disposed laterally (e.g., horizontally) between the P-type channel region 308B of the vertical NMOS transistor 304 and the N-type channel region 310B of the vertical PMOS transistor 306. The first gate electrode 312A may be the only (e.g., sole) gate electrode laterally disposed between the P-type channel region 308B of the vertical NMOS transistor 304 and the N-type channel region 310B of the vertical PMOS transistor 306, such that the first gate electrode 312A is shared between the vertical NMOS transistor 304 and the vertical PMOS transistor 306. Sharing the first gate electrode 312A between the vertical NMOS transistor 304 and the vertical PMOS transistor 306 may improve one or more of semiconductor device scaling, electrical coupling effects, shorts margins, short channel effects, floating body effects, and cross talk as compared to conventional configurations including multiple, non-shared gate electrodes between neighboring vertical NMOS and PMOS transistors.

With continued reference to FIG. 3, the vertical NMOS transistor 304 may include one of the second gate electrodes 312B laterally adjacent a side of the P-type channel region 308B thereof opposing another side laterally adjacent the first gate electrode 312A; and the vertical PMOS transistor 306 may include another of the second gate electrodes 312B laterally adjacent a side of the N-type channel region 310B opposing another side laterally adjacent the first gate electrode 312A. The second gate electrodes 312B may be unshared by the vertical NMOS transistor 304 and the vertical PMOS transistor 306. Each of the vertical NMOS transistor 304 and the vertical PMOS transistor 306 may be considered to be "double-gated" in that two of the gate electrodes 312 (e.g., the first gate electrode 312A, and one of the second gate electrodes 312B) are disposed laterally adjacent opposing sides of the P-type channel region 308B of the vertical NMOS transistor 304; and two other of the gate electrodes 312 (e.g., the first gate electrode 312A, and another of the second gate electrodes 312B) are disposed laterally adjacent opposing sides of the N-type channel region 310B of the vertical PMOS transistor 306.

The gate electrodes 312, including the first gate electrode 312A and the second gate electrodes 312B, may each individually be formed of and include electrically conductive material including, but not limited to, a metal (e.g., tungsten, titanium, nickel, platinum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof. By way of non-limiting example, the gate electrodes 312 may each individually comprise at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental aluminum (Al), elemental copper (Cu), elemental iridium (Ir), iridium oxide ($IrO_x$), elemental ruthenium (Ru), ruthenium oxide ($RuO_x$), alloys thereof, or combinations thereof. In some embodiments, the gate electrodes 312 are formed of TiN.

The P-type channel region 308B of the vertical NMOS transistor 304 may be formed of and include at least one P-type conductivity material. The P-type conductivity material may, for example, comprise polysilicon doped with at least one P-type dopant (e.g., boron ions). In addition, the N-type source region 308A and the N-type drain region 308C of the vertical NMOS transistor 304 may each individually be formed of and include at least one N-type conductivity material. The N-type conductivity material may, for example, comprise polysilicon doped with at least one N-type dopant (e.g., arsenic ions, phosphorous ions, antimony ions). The first semiconductive pillar 308 including the N-type source region 308A, the P-type channel region 308B, and the N-type drain region 308C may exhibit any desired dimensions (e.g., channel width, channel thickness, channel length) and shape (e.g., a rectangular column shape, a cylindrical column shape, a combination thereof). By way of non-limiting example, a channel thickness (laterally extending in the X-direction) of the first semiconductive pillar 308 may be within a range of from about 10 nanometers (nm) to about 50 nm, a channel width (laterally extending perpendicular to the channel thickness) of the first semiconductive pillar 308 may be within a range of from 20 nm to about 200 nm, and a channel length (vertically extending in the Z-direction) of the first semiconductive pillar 308 may within a range of from about 50 nm to about 200 nm.

The N-type channel region 310B of the vertical PMOS transistor 306 may be formed of and include at least one N-type conductivity material. The N-type conductivity material may, for example, comprise polysilicon doped with at least one N-type dopant (e.g., arsenic ions, phosphorous ions, antimony ions). In addition, the P-type source region 310A and the P-type drain region 310C of the vertical PMOS transistor 306 may each individually be formed of and include at least one P-type conductivity material. The P-type conductivity material may, for example, comprise polysilicon doped with at least one P-type dopant (e.g., boron ions). The second semiconductive pillar 310 including the P-type source region 310A, the N-type channel region 310B, and the P-type drain region 310C may exhibit any desired dimensions (e.g., width, length, height) and shape (e.g., a rectangular column shape, a cylindrical column shape, a combination thereof). The second semiconductive pillar 310 including the P-type source region 310A, the N-type channel region 310B, and the P-type drain region 310C may exhibit any desired dimensions (e.g., channel width, channel thickness, channel length) and shape (e.g., a rectangular column shape, a cylindrical column shape, a combination thereof). By way of non-limiting example, a channel thickness (laterally extending in the X-direction) of the second semiconductive pillar 310 may be within a range of from about 10 nanometers (nm) to about 50 nm, a channel width (laterally extending perpendicular to the channel thickness) of the second semiconductive pillar 310 may be within a range of from 20 nm to about 200 nm, and a channel length (vertically extending in the Z-direction) of the second semiconductive pillar 310 may within a range of from about 50 nm to about 200 nm. The dimensions of the second semiconductive pillar 310 may be substantially the same as or different than the dimensions of the first semiconductive pillar 308.

The GND structure 314, the $V_{cc}$ structure 316, the output structure 318, and the input structure of the CMOS inverter 300 may exhibit conventional configurations (e.g., conventional dimensions, conventional shapes, conventional conductive material compositions, conventional material distributions, conventional orientations, conventional arrangements), which are not described in detail herein.

FIGS. 4A through 9B show simplified cross-sectional (e.g., FIGS. 4A, 5A, 6A, 7A, 8A, and 9A) and plan (e.g., FIGS. 4B, 5B, 5C, 6B, 6C, 7B, 7C, 8B, and 9B) views of additional TFT CMOS devices according to embodiments of the disclosure that may be included in TFT control logic levels (e.g., the TFT control logic level 200 shown in FIG. 2; one or more of the first TFT control logic level 106A, the second TFT control logic level 108A, and the third TFT control logic level 110A shown in FIG. 1) of the disclosure. Throughout FIGS. 4A through 9B and the written description associated therewith, functionally similar features (e.g., structures) are referred to with similar reference numerals incremented by 100. To avoid repetition, not all features shown in FIGS. 4A through 9B are described in detail herein. Rather, unless described otherwise below, throughout FIGS. 4A through 9B (and the written description associated therewith), a feature designated by a reference numeral that is a 100 increment of the reference numeral of a previously-described feature (whether the previously-described feature is first described before the present paragraph, or is first described after the present paragraph) will be understood to be substantially similar to the previously-described feature.

FIG. 4A shows a simplified cross-sectional view of a two-input NAND gate 400, in accordance with embodiments of the disclosure. The two-input NAND gate 400 includes a CMOS circuit 402, an additional CMOS circuit 422, a GND structure 414, a $V_{cc}$ structure 416, an interconnect structure 420, an output structure 418, an input structure 434 (see FIG. 4B), and an additional input structure 436 (see FIG. 4B). FIG. 4B shows a plan view of the two-input NAND gate 400 shown in FIG. 4A.

As shown in FIG. 4A, the CMOS circuit 402 of the two-input NAND gate 400 includes a vertical NMOS transistor 404 and a vertical PMOS transistor 406. The vertical NMOS transistor 404 includes a first semiconductive pillar 408 including an N-type source region 408A, an N-type drain region 408C, and a P-type channel region 408B vertically between the N-type source region 408A and the N-type drain region 408C. The vertical PMOS transistor 406 includes a second semiconductive pillar 410 including a P-type source region 410A, a P-type drain region 410C, and an N-type channel region 410B vertically between the P-type source region 410A and the P-type drain region 410C. The vertical NMOS transistor 404 and the vertical PMOS transistor 406 further include gate electrodes 412, including a first gate electrode 412A shared by the vertical NMOS transistor 404 and the vertical PMOS transistor 406, and second gate electrodes 412B not shared by the vertical NMOS transistor 404 and the vertical PMOS transistor 406. The first gate electrode 412A may be disposed laterally (e.g., horizontally) between the P-type channel region 408B of the vertical NMOS transistor 404 and the N-type channel region 410B of the vertical PMOS transistor 406. The first gate electrode 412A may be the only (e.g., sole) gate electrode laterally disposed between the P-type channel region 408B of the vertical NMOS transistor 404 and the N-type channel region 410B of the vertical PMOS transistor 406, such that the first gate electrode 412A is shared between the vertical NMOS transistor 404 and the vertical PMOS transistor 406. In addition, the vertical NMOS transistor 404 may include one of the second gate electrodes 412B laterally adjacent a side of the P-type channel region 408B thereof opposing another side laterally adjacent the first gate electrode 412A; and the vertical PMOS transistor 406 may include another of the second gate electrodes 412B laterally adjacent a side of the N-type channel region 410B opposing another side laterally adjacent the first gate electrode 412A. The second gate electrodes 412B may be unshared by the vertical NMOS transistor 404 and the vertical PMOS transistor 406 of the CMOS circuit 402.

The additional CMOS circuit 422 includes an additional vertical NMOS transistor 424 and an additional vertical PMOS transistor 426. The additional vertical NMOS transistor 424 includes a first additional semiconductive structure 428 including an additional N-type source region 428A, an additional N-type drain region 428C, and an additional P-type channel region 428B vertically between the additional N-type source region 428A and the additional N-type drain region 428C. The additional vertical PMOS transistor 426 includes a second additional semiconductive structure 430 including an additional P-type source region 430A, an additional P-type drain region 430C, and an additional N-type channel region 430B vertically between the additional P-type source region 430A and the additional P-type drain region 430C. The additional vertical NMOS transistor 424 and the additional vertical PMOS transistor 426 further include additional gate electrodes 432, including a first additional gate electrode 432A shared by the additional vertical NMOS transistor 424 and the additional vertical PMOS transistor 426, and second additional gate electrodes 432B not shared by the additional vertical NMOS transistor 424 and the additional vertical PMOS transistor 426. The first additional gate electrode 432A may be disposed laterally (e.g., horizontally) between the additional P-type channel region 428B of the additional vertical NMOS transistor 424 and the additional N-type channel region 430B of the additional vertical PMOS transistor 426. The first additional gate electrode 432A may be the only (e.g., sole) gate electrode laterally disposed between the additional P-type channel region 428B of the additional vertical NMOS transistor 424 and the additional N-type channel region 430B of the additional vertical PMOS transistor 426, such that the first additional gate electrode 432A is shared between the additional vertical NMOS transistor 424 and the additional vertical PMOS transistor 426. In addition, the additional vertical NMOS transistor 424 may include one of the second additional gate electrodes 432B laterally adjacent a side of the additional P-type channel region 428B thereof opposing another side laterally adjacent the first additional gate electrode 432A; and the additional vertical PMOS transistor 426 may include another of the second additional gate electrodes 432B laterally adjacent a side of the additional N-type channel region 430B opposing another side laterally adjacent the first additional gate electrode 432A. The second additional gate electrodes 432B may be unshared by the additional vertical NMOS transistor 424 and the additional vertical PMOS transistor 426 of the additional CMOS circuit 422.

With continued reference to FIG. 4A, regarding the additional components of the two-input NAND gate 400, the GND structure 414 may be connected to the N-type source region 408A of the vertical NMOS transistor 404; the $V_{cc}$ structure 416 may be connected to each of the P-type source region 410A of the vertical PMOS transistor 406 and the additional P-type source region 430A of the additional vertical PMOS transistor 426; the interconnect structure 420 may be connected to and extend between the additional N-type source region 428A of the additional vertical NMOS transistor 424 and the N-type drain region 408C of the vertical NMOS transistor 404; the output structure 418 may be connected to the P-type drain region 410C of the vertical PMOS transistor 406, the additional N-type drain region 428C of the additional vertical NMOS transistor 424, and the additional P-type drain region 430C of the additional vertical PMOS transistor 426; the input structure 434 may be connected to each of the gate electrodes 412 (e.g., the first gate electrode 412A and the second gate electrodes 412B) of the CMOS circuit 402; and the additional input structure 436 may be connected to each of the additional gate electrodes 432 (e.g., the first additional gate electrode 432A and the second additional gate electrodes 432B) of the additional CMOS circuit 422. The GND structure 414, the $V_{cc}$ structure 416, the interconnect structure 420, the output structure 418, the input structure 434, and the additional input structure 436 of the two-input NAND gate 400 may exhibit conventional configurations (e.g., conventional dimensions, conventional shapes, conventional conductive material compositions, conventional material distributions, conventional orientations, conventional arrangements), which are not described in detail herein.

FIG. 5A shows a simplified cross-sectional view of a balanced CMOS inverter 500, in accordance with embodiments of the disclosure. The balanced CMOS inverter 500 includes a CMOS circuit 502, a GND structure 514, a $V_{cc}$ structure 516, an output structure 518, and an input structure 534 (see FIG. 5B). FIG. 5B shows a plan view of the balanced CMOS inverter 500 shown in FIG. 5A. FIG. 5C shows a plan view of an alternative configuration of the balanced CMOS inverter 500 shown in FIG. 5A, in accordance with additional embodiments of the disclosure.

As shown in FIG. 5A, the balanced CMOS inverter 500 may be similar to the CMOS inverter 300 previously described with reference to FIG. 3, except that the CMOS circuit 502 includes a single vertical NMOS transistor 504 and multiple (e.g., more than one) vertical PMOS transistors 506. Multiple vertical PMOS transistors 506 may be employed to balance the driving strengths of the different transistors (e.g., the vertical NMOS transistor 504, the vertical PMOS transistors 506) of the CMOS circuit 502 so as to maximize noise margins and obtain symmetrical characteristics. As depicted in FIG. 5A, in some embodiments, the CMOS circuit 502 includes a single (e.g., only one) vertical NMOS transistor 504, and three (3) vertical PMOS transistors 506. In additional embodiments, the CMOS circuit 502 includes a different number of vertical PMOS transistors 506. For example, the CMOS circuit 502 may include a single (e.g., only one) vertical NMOS transistor 504 and two (2) vertical PMOS transistors 506.

The vertical NMOS transistor 504 of the CMOS circuit 502 includes a first semiconductive pillar 508 including an N-type source region 508A, an N-type drain region 508C, and a P-type channel region 508B vertically between the N-type source region 508A and the N-type drain region 508C. In addition, each of the vertical PMOS transistors 506 of the CMOS circuit 502 individually includes a second semiconductive pillar 510 including a P-type source region 510A, a P-type drain region 510C, and an N-type channel region 510B vertically between the P-type source region 510A and the P-type drain region 510C. The vertical NMOS transistor 504 and the vertical PMOS transistors 506 further include gate electrodes 512, including first gate electrodes 512A shared by neighboring vertical transistors (e.g., the vertical NMOS transistor 504 and the vertical PMOS transistor 506 closest thereto, neighboring vertical PMOS transistors 506), and second gate electrodes 512B not shared by neighboring vertical transistors. For example, as shown in FIG. 5A, the CMOS circuit 502 may include three (3) first gate electrodes 512A and two (2) second gate electrodes 512B. One of the first gate electrodes 512A may be disposed laterally (e.g., horizontally) between the P-type channel region 508B of the vertical NMOS transistor 504 and the N-type channel region 510B of a first of the vertical PMOS transistors 506 closest thereto. The one of the first gate electrodes 512A may be the only gate electrode laterally disposed between the P-type channel region 508B of the vertical NMOS transistor 504 and the N-type channel region 510B of the first of the vertical PMOS transistors 506. Another of the first gate electrodes 512A may be disposed laterally between the N-type channel region 510B of the first of the vertical PMOS transistors 506 and the N-type channel region 510B of a second of the vertical PMOS transistors 506 neighboring the first of the vertical PMOS transistors 506. The another of the first gate electrodes 512A may be the only gate electrode laterally disposed between the N-type channel region 510B of the first of the vertical PMOS transistors 506 and the N-type channel region 510B of the second of the vertical PMOS transistors 506. Yet another of first gate electrodes 512A may be disposed laterally between the N-type channel region 510B of the second of the vertical PMOS transistors 506 and the N-type channel region 510B of a third of the vertical PMOS transistors 506 neighboring the second of the vertical PMOS transistors 506. The yet another of the first gate electrodes 512A may be the only gate electrode laterally disposed between the N-type channel region 510B of the second of the vertical PMOS transistors 506 and the N-type channel region 510B of the third of the vertical PMOS transistors 506. In addition, the vertical NMOS transistor 504 may include one of the second gate electrodes 512B laterally adjacent a side of the P-type channel region 508B thereof opposing another side laterally adjacent the one of the first gate electrodes 512A; and the third of the vertical PMOS transistors 506 may include another of the second gate electrodes 512B laterally adjacent a side of the N-type channel region 510B thereof opposing another side laterally adjacent the yet another of the first gate electrodes 512A.

In some embodiments, the first semiconductive pillar 508 of the vertical NMOS transistor 504 and the second semiconductive pillars 510 of the vertical PMOS transistors 506 of the CMOS circuit 502 are all substantially laterally aligned with other another. For example, as shown in FIG. 5B, the first semiconductive pillar 508 of the vertical NMOS transistor 504 and each of the second semiconductive pillars 510 of the vertical PMOS transistors 506 may be positioned at substantially the same location in the Y-direction, such that the first semiconductive pillar 508 and each of the second semiconductive pillars 510 form a substantially straight line with one another in the X-direction. In additional embodiments, the first semiconductive pillar 508 of the vertical NMOS transistor 504 and the second semiconductive pillars 510 of the vertical PMOS transistors 506 are not all substantially laterally aligned with other another. For example, as shown in FIG. 5C, at least one of the second semiconductive pillars 510 of the vertical PMOS transistors 506 may be positioned at a different location in the Y-direction than the first semiconductive pillar 508 of the vertical NMOS transistor 504 and the other of the second semiconductive pillars 510 of the vertical PMOS transistors 506, such that the first semiconductive pillar 508 and each of the second semiconductive pillars 510 do not form a substantially straight line with one another in the X-direction. In some such embodiments, the second semiconductive pillar 510 offset from the other semiconductive pillars of the CMOS circuit 502 in a first lateral direction (e.g., the Y-direction) is aligned with at least one of the other second semiconductive pillars 510 in a second, different lateral direction (e.g., the X-direction). For example, as also shown in FIG. 5C, the second semiconductive pillar 510 positioned at a different location in the Y-direction than the first semiconductive pillar 508 and the other second semiconductive pillars 510 may be positioned at substantially the same location in the X-direction as one of the other second semiconductive pillars 510. As a result, one of the first gate electrodes 512A may be shared by and laterally disposed between (e.g., in the X-direction) one of the vertical PMOS transistors 506 and two (2) other of the vertical PMOS transistors 506. In addition, each of the two (2) other of the vertical PMOS transistors 506 may include one of the second gate electrodes 512B laterally adjacent a side of the N-type channel region 510B thereof opposing another side laterally adjacent the one of the first gate electrodes 512A.

In additional embodiments, the second semiconductive pillar 510 positioned at a different location in the Y-direction than the other second semiconductive pillars 510 is disposed at a different location in the X-direction than that depicted in FIG. 5C. For example, the second semiconductive pillar 510 offset from the other second semiconductive pillars 510 may be provided laterally adjacent (e.g., in the X-direction) the first semiconductive pillar 508 of the vertical NMOS transistor 504, such that one of the first gate electrodes 512A is shared by and laterally disposed between (e.g., in the X-direction) the vertical NMOS transistor 504 and two (2) of the vertical PMOS transistors 506, and another of the first gate electrodes 512A is shared by and laterally disposed between (e.g., in the X-direction) the two (2) of the vertical PMOS transistors 506 and another of the vertical PMOS transistors 506. In further embodiments, each of the second semiconductive pillars 510 of the vertical PMOS transistors 506 is positioned at a different location in the Y-direction than each other of the second semiconductive pillars 510, and each of the second semiconductive pillars 510 is positioned at a substantially the same location in the X-direction as each other of the second semiconductive pillars 510. For example, each of the second semiconductive pillars 510 of the vertical PMOS transistors 506 may be provided laterally adjacent (e.g., in the X-direction) the first semiconductive pillar 508 of the vertical NMOS transistor 504, such that a single (e.g., only one) first gate electrode 512A is shared by and laterally disposed between (e.g., in the X-direction) the vertical NMOS transistor 504 and each of the vertical PMOS transistors 506.

With returned reference to FIG. 5A, regarding the additional components of the balanced CMOS inverter 500, the GND structure 514 may be connected to the N-type source region 508A of the vertical NMOS transistor 504; the $V_{cc}$ structure 516 may be connected to the P-type source region 510A of each of the vertical PMOS transistors 506; the output structure 518 may be connected to the N-type drain region 508C of the vertical NMOS transistor 504 and the P-type drain region 510C of each of the vertical PMOS transistors 506; and the input structure 534 (FIG. 5B) may be connected to each of the gate electrodes 512 (e.g., the first gate electrodes 512A and the second gate electrodes 512B) of the CMOS circuit 502. The GND structure 514, the $V_{cc}$ structure 516, the output structure 518, and the input structure 534 of the balanced CMOS inverter 500 may exhibit conventional configurations (e.g., conventional dimensions, conventional shapes, conventional conductive material compositions, conventional material distributions, conventional orientations, conventional arrangements), which are not described in detail herein.

FIG. 6A shows a simplified cross-sectional view of a balanced CMOS transmission pass gate 600, in accordance with embodiments of the disclosure. The balanced CMOS transmission pass gate 600 includes a CMOS circuit 602, an output structure 618, an input structure 634, a first gate input structure 638 (see FIG. 6B), and a second gate input structure 640 (see FIG. 6B). FIG. 6B shows a plan view of the balanced CMOS transmission pass gate 600 shown in FIG. 6A. FIG. 6C shows a plan view of an alternative configuration of the balanced CMOS transmission pass gate 600 shown in FIG. 6A, in accordance with additional embodiments of the disclosure.

As shown in FIG. 6A, the CMOS circuit 602 of the balanced CMOS transmission pass gate 600 includes a vertical NMOS transistor 604 and multiple (e.g., more than one) vertical PMOS transistors 606. The multiple vertical PMOS transistors 606 may be employed to balance the driving strengths of the different transistors (e.g., the vertical NMOS transistor 604, the vertical PMOS transistors 606) of the CMOS circuit 602 so as to maximize noise margins and obtain symmetrical characteristics. As depicted in FIG. 6A, in some embodiments, the CMOS circuit 602 includes a single (e.g., only one) vertical NMOS transistor 604, and three (3) vertical PMOS transistors 606. In additional embodiments, the CMOS circuit 602 includes a different number of vertical PMOS transistors 606. For example, the CMOS circuit 602 may include a single (e.g., only one) vertical NMOS transistor 604 and two (2) vertical PMOS transistors 606. In further embodiments, the CMOS circuit 602 includes a single (e.g., only one) vertical NMOS transistor 604 and a single (e.g., only one) vertical PMOS transistor 606.

The vertical NMOS transistor 604 of the CMOS circuit 602 includes a first semiconductive pillar 608 including an N-type source region 608A, an N-type drain region 608C, and a P-type channel region 608B vertically between the N-type source region 608A and the N-type drain region 608C. In addition, each of the vertical PMOS transistors 606 of the CMOS circuit 602 individually includes a second semiconductive pillar 610 including a P-type source region 610A, a P-type drain region 610C, and an N-type channel region 610B vertically between the P-type source region 610A and the P-type drain region 610C. The vertical NMOS transistor 604 and the vertical PMOS transistors 606 further include gate electrodes 612, including first gate electrodes 612A shared by some neighboring vertical transistors (e.g., neighboring vertical PMOS transistors 606), and second gate electrodes 612B not shared by neighboring vertical transistors. For example, as shown in FIG. 6A, the CMOS circuit 602 may include two (2) first gate electrodes 612A and four (4) second gate electrodes 612B. One of the first gate electrodes 612A may be disposed laterally between the N-type channel region 610B of a first of the vertical PMOS transistors 606 and the N-type channel region 610B of a second of the vertical PMOS transistors 606 neighboring the first of the vertical PMOS transistors 606. The one of the first gate electrodes 612A may be the only gate electrode laterally disposed between the N-type channel region 610B of the first of the vertical PMOS transistors 606 and the N-type channel region 610B of the second of the vertical PMOS transistors 606. Another of the first gate electrodes 612A may be disposed laterally between the N-type channel region 610B of the second of the vertical PMOS transistors 606 and the N-type channel region 610B of a third of the vertical PMOS transistors 606 neighboring the second of the vertical PMOS transistors 606. The another of the first gate electrodes 612A may be the only gate electrode laterally disposed between the N-type channel region 610B of the second of the vertical PMOS transistors 606 and the N-type channel region 610B of the third of the vertical PMOS transistors 606. In addition, the vertical NMOS transistor 604 may include two (2) of the second gate electrodes 612B laterally adjacent opposing sides of the P-type channel region 608B thereof (e.g., such that the vertical NMOS transistor 604 does not share a gate electrode with any of the vertical PMOS transistors 606); the first of the vertical PMOS transistors 606 may include another of the second gate electrodes 612B laterally adjacent a side of the N-type channel region 610B thereof opposing another side laterally adjacent the one of the first gate electrodes 612A; and the third of the vertical PMOS transistors 606 may include yet another of the second gate electrodes 612B laterally adjacent a side of the N-type channel region 610B thereof opposing another side laterally adjacent the another of the first gate electrodes 612A.

In some embodiments, the first semiconductive pillar 608 of the vertical NMOS transistor 604 and the second semiconductive pillars 610 of the vertical PMOS transistors 606 of the CMOS circuit 602 are all substantially laterally aligned with other another. For example, as shown in FIG. 6B, the first semiconductive pillar 608 and each of the second semiconductive pillars 610 may be positioned at substantially the same location in the Y-direction, such that the first semiconductive pillar 608 and each of the second semiconductive pillars 610 form a substantially straight line with one another in the X-direction. In additional embodiments, the first semiconductive pillar 608 of the vertical NMOS transistor 604 and the second semiconductive pillars 610 of the vertical PMOS transistors 606 are not all substantially laterally aligned with other another. For example, as shown in FIG. 6C, at least one of the second semiconductive pillars 610 may be positioned at a different location in the Y-direction than the first semiconductive pillar 608 and the other second semiconductive pillars 610, such that the first semiconductive pillar 608 and the second semiconductive pillars 610 do not form a substantially straight line with one another in the X-direction. In some such embodiments, the second semiconductive pillar 610 offset from the other semiconductive pillars of the CMOS circuit 602 in a first lateral direction (e.g., the Y-direction) is aligned with at least one other of the second semiconductive pillars 610 in a second, different lateral direction (e.g., the X-direction). For example, as also shown in FIG. 6C, the second semiconductive pillar 610 positioned at a different location in the Y-direction than the first semiconductive pillar 608 and the other of the second semiconductive pillars 610, and may be positioned at substantially the same location in the X-direction as one of the other of the second semiconductive pillars 610. As a result, one of the first gate electrodes 612A may be shared by and laterally disposed between (e.g., in the X-direction) one of the vertical PMOS transistors 606 and two (2) other of the vertical PMOS transistors 606. In addition, each of the two (2) other of the vertical PMOS transistors 606 may include one of the second gate electrodes 612B laterally adjacent a side of the N-type channel region 610B thereof opposing another side laterally adjacent the one of the first gate electrodes 612A. In further embodiments, the second semiconductive pillar 610 positioned at a different location in the Y-direction than the other of the second semiconductive pillars 610 is positioned at a different location in the X-direction than that depicted in FIG. 6C. For example, the second semiconductive pillar 610 offset from the other second semiconductive pillars 610 may be provided laterally adjacent (e.g., in the X-direction) the first semiconductive pillar 608 of the vertical NMOS transistor 604.

With returned reference to FIG. 6A, regarding the additional components of the balanced CMOS transmission pass gate 600, the output structure 618 may be connected to the N-type source region 608A of the vertical NMOS transistor 604 and the P-type source region 610A of each of the vertical PMOS transistors 606; the input structure 634 may be connected to N-type drain region 608C of the vertical NMOS transistor 604 and the P-type drain region 610C of each of the vertical PMOS transistors 606; the first gate input structure 638 (FIG. 6B) may be connected to the second gate electrodes 612B adjacent opposing sides of the vertical NMOS transistor 604; and the second gate input structure 640 (FIG. 6B) may be connected to the first gate electrodes 612A, and the second gate electrodes 612B adjacent sides of the vertical PMOS transistors 606. The output structure 618, the input structure 634, the first gate input structure 638, and the second gate input structure 640 of the balanced CMOS transmission pass gate 600 may exhibit conventional configurations (e.g., conventional dimensions, conventional shapes, conventional conductive material compositions, conventional material distributions, conventional orientations, conventional arrangements), which are not described in detail herein.

FIG. 7A shows a simplified cross-sectional view of a balanced two-input NAND gate 700, in accordance with embodiments of the disclosure. The balanced two-input NAND gate 700 includes a CMOS circuit 702, an additional CMOS circuit 722, a GND structure 714, a $V_{cc}$ structure 716, an interconnect structure 720, an output structure 718, an input structure 734 (see FIG. 7B), and an additional input structure 736 (see FIG. 7B). FIG. 7B shows a plan view of the balanced two-input NAND gate 700 shown in FIG. 7A. FIG. 7C shows a plan view of an alternative configuration of the balanced two-input NAND gate 700 shown in FIG. 7A, in accordance with additional embodiments of the disclosure.

As shown in FIG. 7A, the balanced two-input NAND gate 700 may be similar to the two-input NAND gate 400 previously described with reference to FIG. 4, except that the CMOS circuit 702 includes a single vertical NMOS transistor 704 and multiple (e.g., more than one) vertical PMOS transistors 706, and the additional CMOS circuit 722 includes a single additional vertical NMOS transistor 724 and multiple additional vertical PMOS transistors 726. As depicted in FIG. 7A, in some embodiments, the CMOS circuit 702 includes one vertical NMOS transistor 704, and three (3) vertical PMOS transistors 706; and the additional CMOS circuit 722 includes one additional vertical NMOS transistor 724, and three (3) additional vertical PMOS transistors 726. In additional embodiments, the CMOS circuit 702 includes a different number of vertical PMOS transistors 706, and/or the additional CMOS circuit 722 includes a different number of additional vertical PMOS transistors 726. For example, the CMOS circuit 702 may include one vertical NMOS transistor 704 and two (2) vertical PMOS transistors 706, and/or the additional CMOS circuit 722 may include one additional vertical NMOS transistor 724 and two (2) additional vertical PMOS transistors 726.

The vertical NMOS transistor 704 of the CMOS circuit 702 includes a first semiconductive pillar 708 including an N-type source region 708A, an N-type drain region 708C, and a P-type channel region 708B vertically between the N-type source region 708A and the N-type drain region 708C. In addition, each of the vertical PMOS transistors 706 of the CMOS circuit 702 individually includes a second semiconductive pillar 710 including a P-type source region 710A, a P-type drain region 710C, and an N-type channel region 710B vertically between the P-type source region 710A and the P-type drain region 710C. The vertical NMOS transistor 704 and the vertical PMOS transistors 706 further include gate electrodes 712, including first gate electrodes 712A shared by neighboring vertical transistors (e.g., the vertical NMOS transistor 704 and the vertical PMOS transistor 706 closest thereto, neighboring vertical PMOS transistors 706), and second gate electrodes 712B not shared by neighboring vertical transistors. For example, as shown in FIG. 7A, the CMOS circuit 702 may include three (3) first gate electrodes 712A and two (2) second gate electrodes 712B. One of the first gate electrodes 712A may be disposed laterally (e.g., horizontally) between the P-type channel region 708B of the vertical NMOS transistor 704 and the N-type channel region 710B of a first of the vertical PMOS transistors 706 closest thereto. The one of the first gate electrodes 712A may be the only gate electrode laterally disposed between the P-type channel region 708B of the vertical NMOS transistor 704 and the N-type channel region 710B of the first of the vertical PMOS transistors 706. Another of the first gate electrodes 712A may be disposed laterally between the N-type channel region 710B of the first of the vertical PMOS transistors 706 and the N-type channel region 710B of a second of the vertical PMOS transistors 706 neighboring the first of the vertical PMOS transistors 706. The another of the first gate electrodes 712A may be the only gate electrode laterally disposed between the N-type channel region 710B of the first of the vertical PMOS transistors 706 and the N-type channel region 710B of the second of the vertical PMOS transistors 706. Yet another of first gate electrodes 712A may be disposed laterally between the N-type channel region 710B of the second of the vertical PMOS transistors 706 and the N-type channel region 710B of a third of the vertical PMOS transistors 706 neighboring the second of the vertical PMOS transistors 706. The yet another of the first gate electrodes 712A may be the only gate electrode laterally disposed between the N-type channel region 710B of the second of the vertical PMOS transistors 706 and the N-type channel region 710B of the third of the vertical PMOS transistors 706. In addition, the vertical NMOS transistor 704 may include one of the second gate electrodes 712B laterally adjacent a side of the P-type channel region 708B thereof opposing another side laterally adjacent the one of the first gate electrodes 712A; and the third of the vertical PMOS transistors 706 may include another of the second gate electrodes 712B laterally adjacent a side of the N-type channel region 710B thereof opposing another side laterally adjacent the yet another of the first gate electrodes 712A.

The additional vertical NMOS transistor 724 of the additional CMOS circuit 722 includes a first additional semiconductive pillar 728 including an N-type source region 728A, an N-type drain region 728C, and a P-type channel region 728B vertically between the N-type source region 728A and the N-type drain region 728C. In addition, each of the additional vertical PMOS transistors 726 of the additional CMOS circuit 722 individually includes a second additional semiconductive pillar 730 including a P-type source region 730A, a P-type drain region 730C, and an N-type channel region 730B vertically between the P-type source region 730A and the P-type drain region 730C. The additional vertical NMOS transistor 724 and the additional vertical PMOS transistors 726 further include additional gate electrodes 732, including first additional gate electrodes 732A shared by neighboring vertical transistors (e.g., the additional vertical NMOS transistor 724 and the additional vertical PMOS transistor 726 closest thereto, neighboring additional vertical PMOS transistors 726), and second additional gate electrodes 732B not shared by neighboring vertical transistors. For example, as shown in FIG. 7A, the additional CMOS circuit 722 may include three (3) first additional gate electrodes 732A and two (2) second additional gate electrodes 732B. One of the first additional gate electrodes 732A may be disposed laterally (e.g., horizontally) between the P-type channel region 728B of the additional vertical NMOS transistor 724 and the N-type channel region 730B of a first of the additional vertical PMOS transistors 726 closest thereto. The one of the first additional gate electrodes 732A may be the only gate electrode laterally disposed between the P-type channel region 728B of the additional vertical NMOS transistor 724 and the N-type channel region 730B of the first of the additional vertical PMOS transistors 726. Another of the first additional gate electrodes 732A may be disposed laterally between the N-type channel region 730B of the first of the additional vertical PMOS transistors 726 and the N-type channel region 730B of a second of the additional vertical PMOS transistors 726 neighboring the first of the additional vertical PMOS transistors 726. The another of the first additional gate electrodes 732A may be the only gate electrode laterally disposed between the N-type channel region 730B of the first of the additional vertical PMOS transistors 726 and the N-type channel region 730B of the second of the additional vertical PMOS transistors 726. Yet another of the first additional gate electrodes 732A may be disposed laterally between the N-type channel region 730B of the second of the additional vertical PMOS transistors 726 and the N-type channel region 730B of a third of the additional vertical PMOS transistors 726 neighboring the second of the additional vertical PMOS transistors 726. The yet another of the first additional gate electrodes 732A may be the only gate electrode laterally disposed between the N-type channel region 730B of the second of the additional vertical PMOS transistors 726 and the N-type channel region 730B of the third of the additional vertical PMOS transistors 726. In addition, the additional vertical NMOS transistor 724 may include one of the second additional gate electrodes 732B laterally adjacent a side of the P-type channel region 728B thereof opposing another side laterally adjacent the one of the first additional gate electrodes 732A; and the third of the additional vertical PMOS transistors 726 may include another of the second additional gate electrodes 732B laterally adjacent a side of the N-type channel region 730B thereof opposing another side laterally adjacent the yet another of the first additional gate electrodes 732A.

In some embodiments, the semiconductive pillars of the CMOS circuit 702 and the additional semiconductive pillars of the additional CMOS circuit 722 are all substantially laterally aligned with other another. For example, as shown in FIG. 7B, the first semiconductive pillar 708 of the CMOS circuit 702, each of the second semiconductive pillars 710 of the CMOS circuit 702, the first additional semiconductive pillar 728 of the additional CMOS circuit 722, and each of the second additional semiconductive pillars 730 of the additional CMOS circuit 722 may be positioned at substantially the same location in the Y-direction. In additional embodiments, one or more of the semiconductive pillars of the CMOS circuit 702 and/or one or more of the additional semiconductive pillars of the additional CMOS circuit 722 are not substantially laterally aligned with one another. For example, as shown in FIG. 7C, one or more of the second semiconductive pillars 710 of the vertical PMOS transistors 706 of the CMOS circuit 702 may be positioned at a different location in the Y-direction than one or more other of the semiconductive pillars (e.g., the first semiconductive pillar 708, one or more other of the second semiconductive pillars 710) of the CMOS circuit 702 and the additional semiconductive pillars (e.g., the first additional semiconductive pillar 728, one or more of the second additional semiconductive pillars 730) of the additional CMOS circuit 722; and/or one or more of the second additional semiconductive transistors 726 of the additional vertical PMOS transistors 726 of the additional CMOS circuit 722 may be positioned at a different location in the Y-direction than one or more other of the semiconductive pillars (e.g., the first semiconductive pillar 708, one or more of the second semiconductive pillars 710) of the CMOS circuit 702 and the additional semiconductive pillars (e.g., the first additional semiconductive pillar 728, one or more other of the second additional semiconductive pillars 730) of the additional CMOS circuit 722. In some embodiments, one of the second semiconductive pillars 710 is offset from the other second semiconductive pillars 710 of the CMOS circuit 702 in a first lateral direction (e.g., the Y-direction), and is aligned with at least one of the other second semiconductive pillars 710 in a second, different lateral direction (e.g., the X-direction); and one of the second additional semiconductive pillars 730 is offset from the other additional semiconductive pillars of the additional CMOS circuit 722 in the first lateral direction, and is aligned with at least one of the other second additional semiconductive pillars 730 in the second, different lateral direction. As a result, one of the first gate electrodes 712A may be shared by and laterally disposed between (e.g., in the X-direction) one of the vertical PMOS transistors 706 and two (2) other of the vertical PMOS transistors 706; and one of first additional gate electrodes 732A may be shared by and laterally disposed between (e.g., in the X-direction) one of the additional vertical PMOS transistors 726 and two (2) other of the additional vertical PMOS transistors 726. In addition, each of the two (2) other of the vertical PMOS transistors 706 may include one of the second gate electrodes 712B laterally adjacent a side of the N-type channel region 710B thereof opposing another side laterally adjacent the one of the first gate electrodes 712A; and each of the two (2) other of the additional vertical PMOS transistors 726 may include one of the second additional gate electrodes 732B laterally adjacent a side of the N-type channel region 730B thereof opposing another side laterally adjacent the one of the first additional gate electrodes 732A.

In additional embodiments, the second semiconductive pillar 710 positioned at a different location in the Y-direction than the other of the second semiconductive pillars 710 is positioned at a different location in the X-direction than that depicted in FIG. 7C; and/or the second additional semiconductive pillar 730 positioned at a different location in the Y-direction than the other of the second additional semiconductive pillars 730 is positioned at a different location in the X-direction than that depicted in FIG. 7C. For example, the second semiconductive pillar 710 offset from the other second semiconductive pillars 710 may be provided laterally adjacent (e.g., in the X-direction) the first semiconductive pillar 708, such that one of the first gate electrodes 712A is shared by and laterally disposed between (e.g., in the X-direction) the vertical NMOS transistor 704 and two (2) of the vertical PMOS transistors 706, and another of the first gate electrodes 712A is shared by and laterally disposed between (e.g., in the X-direction) the two (2) of the vertical PMOS transistors 706 and another of the vertical PMOS transistors 706. As another example, the second additional semiconductive pillar 730 offset from the other second additional semiconductive pillars 730 may be provided laterally adjacent (e.g., in the X-direction) the first additional semiconductive pillar 728, such that one of the first additional gate electrodes 732A is shared by and laterally disposed between (e.g., in the X-direction) the additional vertical NMOS transistor 724 and two (2) of the additional vertical PMOS transistors 726, and another of the first additional gate electrodes 732A is shared by and laterally disposed between (e.g., in the X-direction) the two (2) of the additional vertical PMOS transistors 726 and another of the additional vertical PMOS transistors 726. In further embodiments, each of the second semiconductive pillars 710 is positioned at a different location in the Y-direction than each other of the second semiconductive pillars 710, and each of the second semiconductive pillars 710 is positioned at a substantially the same location in the X-direction as each other of the second semiconductive pillars 710; and/or each of the second additional semiconductive pillars 730 is positioned at a different location in the Y-direction than each other of the second additional semiconductive pillars 730, and each of the second additional semiconductive pillars 730 is positioned at a substantially the same location in the X-direction as each other of the second additional semiconductive pillars 730. For example, each of the second semiconductive pillars 710 may be provided laterally adjacent (e.g., in the X-direction) the first semiconductive pillars 708, such that a single (e.g., only one) first gate electrode 712A is shared by and laterally disposed between (e.g., in the X-direction) the vertical NMOS transistor 704 and each of the vertical PMOS transistors 706; and/or each of the second additional semiconductive pillars 730 may be provided laterally adjacent (e.g., in the X-direction) the first additional semiconductive pillars 728, such that a single first additional gate electrode 732A is shared by and laterally disposed between (e.g., in the X-direction) the additional vertical NMOS transistor 724 and each of the additional vertical PMOS transistors 726.

With returned reference to FIG. 7A, regarding the additional components of the balanced two-input NAND gate 700, the GND structure 714 may be connected to the N-type source region 708A of the vertical NMOS transistor 704; the $V_{cc}$ structure 716 may be connected to the P-type source region 710A of each of the vertical PMOS transistors 706, and the P-type source region 730A of each of the additional vertical PMOS transistors 726; the interconnect structure 720 may be connected to and extends between the N-type source region 728A of the additional vertical NMOS transistor 724 and the N-type drain region 708C of the vertical NMOS transistor 704; the output structure 718 may be connected to the P-type drain region 710C of each of the vertical PMOS transistors 706, the N-type drain region 728C of the additional vertical NMOS transistor 724, and the P-type drain region 730C of each of the additional vertical PMOS transistors 726; the input structure 734 may be connected to each of the gate electrodes 712 (e.g., the first gate electrodes 712A and the second gate electrodes 712B) of the CMOS circuit 702; and the additional input structure 736 may be connected to each of the additional gate electrodes 732 (e.g., the first additional gate electrodes 732A and the second additional gate electrodes 732B) of the additional CMOS circuit 722. The GND structure 714, the $V_{cc}$ structure 716, the interconnect structure 720, the output structure 718, the input structure 734, and the additional input structure 736 of the balanced two-input NAND gate 700 may exhibit conventional configurations (e.g., conventional dimensions, conventional shapes, conventional conductive material compositions, conventional material distributions, conventional orientations, conventional arrangements), which are not described in detail herein.

FIG. 8A shows a simplified cross-sectional view of another balanced two-input NAND gate 800, in accordance with additional embodiments of the disclosure. The balanced two-input NAND gate 800 includes a CMOS circuit 802, an additional CMOS circuit 822, dummy (e.g., inactive) semiconductive pillars D, a GND structure 814, a $V_{cc}$ structure 816, at least one interconnect structure 820, an output structure 818, an input structure 834 (see FIG. 8B), and an additional input structure 836 (see FIG. 8B). FIG. 8B shows a plan view of the balanced two-input NAND gate 800 shown in FIG. 8A. As shown in FIG. 8B, the balanced two-input NAND gate 800 may be similar to the balanced two-input NAND gate 700 previously described with reference to FIG. 7, except that the CMOS circuit 802 includes multiple (e.g., more than one) vertical NMOS transistors 804 and multiple vertical PMOS transistors 806 associated with each of the vertical NMOS transistors 804; the additional CMOS circuit 822 includes multiple additional vertical NMOS transistors 824 and multiple additional vertical PMOS transistors 826 associated with each of the additional vertical NMOS transistors 824; and the balanced two-input NAND gate 800 also includes dummy (e.g., inactive) semiconductive pillars D.

Referring to FIG. 8B, in some embodiments, the CMOS circuit 802 includes two (2) vertical NMOS transistors 804, and six (6) vertical PMOS transistors 806; and the additional CMOS circuit 822 includes two (2) additional vertical NMOS transistors 824, and six (6) additional vertical PMOS transistors 826. Accordingly, a ratio of vertical NMOS transistors 804 to vertical PMOS transistors 806 in the CMOS circuit 802 may be 1:3; and a ratio of additional vertical NMOS transistors 824 to additional vertical PMOS transistors 826 in the additional CMOS circuit 822 may be 1:3. In additional embodiments, the CMOS circuit 802 includes a different number of vertical NMOS transistors 804 and vertical PMOS transistors 806 and/or a different ratio of vertical NMOS transistors 804 and vertical PMOS transistors 806; and/or the additional CMOS circuit 822 includes a different number of additional vertical NMOS transistors 824 and additional vertical PMOS transistors 826 and/or a different ratio of additional vertical NMOS transistors 824 to additional vertical PMOS transistors 826. For example, the CMOS circuit 802 may exhibit a 1:3 ratio of vertical NMOS transistors 804 to additional vertical PMOS transistors 826, and may include more than two (2) vertical NMOS transistors 804 (e.g., three (3) vertical NMOS transistors 804, five (5) vertical NMOS transistors 804, ten (10) vertical NMOS transistors 804, greater than or equal to twenty-five (25) vertical NMOS transistors 804). As another example, the CMOS circuit 802 may exhibit a 1:2 ratio of vertical NMOS transistors 804 to additional vertical PMOS transistors 826, and may include greater than or equal to two (2) vertical NMOS transistors 804. As an additional example, the additional CMOS circuit 822 may exhibit a 1:3 ratio of additional vertical NMOS transistors 824 to additional vertical PMOS transistors 826, and may include more than two (2) additional vertical NMOS transistors 824 (e.g., three (3) additional vertical NMOS transistors 824, five (5) additional vertical NMOS transistors 824, ten (10) additional vertical NMOS transistors 824, greater than or equal to twenty-five (25) additional vertical NMOS transistors 824). As a further example, the additional CMOS circuit 822 may exhibit a 1:2 ratio of additional vertical NMOS transistors 824 to additional vertical PMOS transistors 826, and may include more than greater than or equal to two (2) additional vertical NMOS transistors 804.

Each of the vertical NMOS transistors 804 of the CMOS circuit 802 individually includes a first semiconductive pillar 808 including an N-type source region 808A, an N-type drain region 808C, and a P-type channel region 808B vertically between the N-type source region 808A and the N-type drain region 808C. In addition, each of the vertical PMOS transistors 806 of the CMOS circuit 802 individually includes a second semiconductive pillar 810 including a P-type source region 810A, a P-type drain region 810C, and an N-type channel region 810B vertically between the P-type source region 810A and the P-type drain region 810C. The first semiconductive pillars 808 of the vertical NMOS transistors 804 may be substantially aligned with one another in a first lateral direction (e.g., the Y-direction), and each of the first semiconductive pillars 808 of the vertical NMOS transistors 804 may individually be substantially aligned with three (3) of the second semiconductive pillars 810 of the vertical PMOS transistors 806 in a second direction (e.g., the X-direction) substantially perpendicular to the first direction. In addition, the vertical NMOS transistors 804 and the vertical PMOS transistors 806 further include gate electrodes 812, including first gate electrodes 812A shared by neighboring vertical transistors adjacent opposing sides (e.g., in the X-direction) of the first gate electrodes 812A, and second gate electrodes 812B not shared by neighboring vertical transistors. As shown in FIG. 8B, one of the first gate electrodes 812A may be disposed laterally between the first semiconductive pillars 808 of the vertical NMOS transistors 804 and a first pair of the second semiconductive pillars 810 of the vertical PMOS transistors 806 closest thereto; another of the first gate electrodes 812A may be disposed laterally between the first pair of the second semiconductive pillars 810 and a second pair of the second semiconductive pillars 810 neighboring the first pair of the second semiconductive pillars 810; and yet another of the first gate electrodes 812A may be disposed laterally between the second pair of the second semiconductive pillars 810 and a third pair of the second semiconductive pillars 810 neighboring the second pair of the second semiconductive pillars 810.

Each of the additional vertical NMOS transistors 824 of the additional CMOS circuit 822 individually includes a first additional semiconductive pillar 828 including an N-type source region 828A, an N-type drain region 828C, and a P-type channel region 828B vertically between the N-type source region 828A and the N-type drain region 828C. In addition, each of the additional vertical PMOS transistors 826 of the additional CMOS circuit 822 individually includes a second additional semiconductive pillar 830 including a P-type source region 830A, a P-type drain region 830C, and an N-type channel region 830B vertically between the P-type source region 830A and the P-type drain region 830C. The first additional semiconductive pillars 828 of the additional vertical NMOS transistors 824 may be substantially aligned with one another in a first lateral direction (e.g., the Y-direction), and each of the first additional semiconductive pillars 828 of the additional vertical NMOS transistors 824 may individually be substantially aligned with three (3) of the second additional semiconductive pillars 830 of the additional vertical PMOS transistors 826 in a second direction (e.g., the X-direction) substantially perpendicular to the first direction. In addition, the additional vertical NMOS transistors 824 and the additional vertical PMOS transistors 826 further include additional gate electrodes 832, including first additional gate electrodes 832A shared by neighboring additional vertical transistors adjacent opposing sides (e.g., in the X-direction) of the first additional gate electrodes 832A, and second additional gate electrodes 832B not shared by neighboring vertical transistors. As shown in FIG. 8B, one of the first additional gate electrodes 832A may be disposed laterally between the first additional semiconductive pillars 828 of the additional vertical NMOS transistors 824 and a first pair of the second additional semiconductive pillars 830 of the additional vertical PMOS transistors 826 closest thereto; another of the first additional gate electrodes 832A may be disposed laterally between the first pair of the second additional semiconductive pillars 830 and a second pair of the second additional semiconductive pillars 830 neighboring the first pair of the second additional semiconductive pillars 830; and yet another of the first additional gate electrodes 832A may be disposed laterally between the second pair of the second additional semiconductive pillars 830 and a third pair of the second additional semiconductive pillars 830 neighboring the second pair of the second additional semiconductive pillars 830.

Referring collectively to FIGS. 8A and 8B, the dummy (e.g., inactive) semiconductive pillars D may laterally surround the active semiconductive pillars (e.g., the first semiconductive pillars 808 of the vertical NMOS transistors 804, the second semiconductive pillars 810 of the vertical PMOS transistors 806, the first additional semiconductive pillar 828 of the additional vertical NMOS transistors 824, the second additional semiconductive pillars 830 of the additional vertical PMOS transistors 826) of the CMOS circuit 802 and the additional CMOS circuit 822. The dummy semiconductive pillars D may, for example, be employed to isolate the CMOS circuit 802 and the additional CMOS circuit 822, to equalize pattern density across the balanced two-input NAND gate 800, and/or to ensure proper printing of the active semiconductive pillars. The dummy semiconductive pillars D do not contribute to control logic functions of the balanced two-input NAND gate 800.

The dummy semiconductive pillars D may each individually be substantially similar to the active semiconductive pillars laterally adjacent thereto. For example, shown in FIG. 8A, those dummy semiconductive pillars D laterally adjacent the first semiconductive pillars 808 of the vertical NMOS transistors 804 may each individually exhibit substantially the same configuration (e.g., size, shape, material composition, material distribution, orientation) as the first semiconductive pillars 808; those dummy semiconductive pillars D laterally adjacent the second semiconductive pillars 810 of the vertical PMOS transistors 806 may each individually exhibit substantially the same configuration as the second semiconductive pillars 810; those dummy semiconductive pillars D laterally adjacent the first additional semiconductive pillars 828 of the additional vertical NMOS transistors 824 may each individually exhibit substantially the same configuration as the first additional semiconductive pillars 828; and those dummy semiconductive pillars D laterally adjacent the second additional semiconductive pillars 830 of the additional vertical PMOS transistors 826 may each individually exhibit substantially the same configuration as the second additional semiconductive pillars 830.

Regarding the additional components of the balanced two-input NAND gate 800, the GND structure 814 may be connected to the N-type drain region 808C of each of the vertical NMOS transistors 704; the $V_{cc}$ structure 816 may be connected to the P-type source region 810A of each of the vertical PMOS transistors 806, and the P-type source region 830A of each of the additional vertical PMOS transistors 826; the interconnect structure 820 may be connected to and extends between the N-type source region 828A of each of the additional vertical NMOS transistors 824 and the N-type source region 808A of each of the vertical NMOS transistors 804; the output structure 818 may be connected to the P-type drain region 810C of each of the vertical PMOS transistors 806, the N-type drain region 828C of each of the additional vertical NMOS transistors 824, and the P-type drain region 830C of each of the additional vertical PMOS transistors 826; the input structure 834 (FIG. 8B) may be connected to each of the gate electrodes 812 (e.g., the first gate electrodes 812A and the second gate electrodes 812B); and the additional input structure 836 (FIG. 8B) may be connected to each of the additional gate electrodes 832 (e.g., the first additional gate electrodes 832A and the second additional gate electrodes 832B). The GND structure 814, the $V_{cc}$ structure 816, the interconnect structure 820, the output structure 818, the input structure 834, and the additional input structure 836 of the balanced two-input NAND gate 800 may exhibit conventional configurations (e.g., conventional dimensions, conventional shapes, conventional conductive material compositions, conventional material distributions, conventional orientations, conventional arrangements), which are not described in detail herein.

Thus, a control logic device according to embodiments of the disclosure comprises a vertical transistor and another vertical transistor. The vertical transistor comprises a semiconductive structure and a shared gate electrode. The another vertical transistor comprises another semiconductive structure and the shared gate electrode. The semiconductive structure comprises a source region, a drain region, and a channel region between the source region and the drain region. The another semiconductive structure comprises another source region, another drain region, and another channel region between the another source region and the another drain region. The shared gate electrode laterally intervenes between the channel region of the semiconductive structure and the another channel region of the another semiconductive structure.

FIGS. 9A through 23B are simplified partial cross-sectional (i.e., FIGS. 9A, 10A, 11A, 12A, 13A, 14A, 15A, 16A, 17A, 18A, 19A, 20A, 21A, 22A, and 23A) and simplified partial plan (i.e., FIGS. 9B, 10B, 11B, 12B, 13B, 14B, 15B, 16B, 17B, 18B, 19B, 20B, 21B, 22B, and 23B) views illustrating embodiments of a method of forming a TFT CMOS control logic device including one or more gate electrode(s) shared between vertical transistors (e.g., vertical PMOS transistors, vertical NMOS transistors) thereof. With the description as provided below, it will be readily apparent to one of ordinary skill in the art that the process described herein may be used in various applications. In other words, the process may be used whenever it is desired to form a semiconductor device structure including one or more gates electrode(s) shared between transistors (e.g., PMOS transistors, NMOS transistors) thereof.

Referring to collectively to FIGS. 9A and 9B, a TFT CMOS control logic device structure 1000 includes an N-type structure 1004 formed on or over a substrate 1002 (FIG. 9A). The substrate 1002 may comprise any base material or construction upon which additional materials may be formed. The substrate 1002 may be a semiconductor substrate, a base semiconductor material on a supporting structure, a metal electrode, or a semiconductor substrate having one or more materials, structures, or regions formed thereon. The substrate 1002 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 1002 may be doped or undoped. By way of non-limiting example, a substrate 1002 may comprise one or more of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a Noble metal.

The N-type structure 1004 may be formed of and include at least one N-type conductivity material. By way of non-limiting example, the N-type conductivity material may comprise polysilicon doped with at least one N-type dopant (e.g., arsenic ions, phosphorous ions, antimony ions). The N-type conductivity material may form channel regions of transistors (e.g., PMOS transistors) subsequently formed from the N-type structure 1004, as described in further detail below. In addition, in some embodiments, the N-type structure 1004 further includes P-type conductivity materials above and below the N-type conductivity material. By way of non-limiting example, the P-type conductivity materials may comprise polysilicon doped with at least one P-type dopant (e.g., boron ions). The N-type structure 1004 may, for example, be formed to comprise a stack including a first P-type conductivity material on or over the substrate 1002, an N-type conductivity material on or over the first P-type conductivity material, and a second P-type conductivity material on or over the N-type conductivity material.

The N-type structure 1004 may be formed on or over the substrate 1002 using conventional processes and conventional processing equipment, which are not described in detail herein. By way of non-limiting example, at least one semiconductive material (e.g., polysilicon) may be conventionally formed (e.g., through one or more of in situ growth, spin-on coating, blanket coating, chemical vapor deposition (CVD), plasma enhanced chemical vapor deposition (PECVD), atomic layer deposition (ALD), and physical vapor deposition (PVD)) on or over the substrate 1002 and doped (e.g., through ion-implantation) to form the N-type structure 1004.

Referring next to FIG. 10A, portions of the N-type structure 1004 (FIGS. 9A and 9B) may be selectively removed to form N-type line structures 1006 separated from one another by trenches 1008 (e.g., apertures, openings). As shown in FIG. 10A, the N-type line structures 1006 may each continuously extend in a first lateral direction (e.g., a Y-direction), and may be spaced apart from one another in a second lateral direction (an X-direction) perpendicular to the first lateral direction. The trenches 1008 intervening N-type line structures 1006 may continuously extend parallel to the N-type line structures 1006 in the first lateral direction (e.g., the Y-direction), and may longitudinally extend (e.g., in a Z-direction) to and expose (e.g., uncover) an upper surface of the substrate 1002. The N-type line structures 1006 and the trenches 1008 may each individually be formed to exhibit any desired dimensions and spacing. The dimensions and spacing of the N-type line structures 1006 and the trenches 1008 may be selected at least partially based on desired dimensions and desired spacing of the additional structures to be formed from the N-type line structures 1006 and/or to be formed within the trenches 1008, as described in further detail below. FIG. 10B is a simplified plan view of the TFT CMOS control logic device structure 1000 at the process stage depicted in FIG. 10A.

The N-type line structures 1006 (and, hence, the trenches 1008) may be formed using conventional processes (e.g., conventional photolithographic patterning processes, conventional material removal processes) and conventional processing equipment, which are not described in detail herein. By way of non-limiting example, a mask structure may be provided on or over the N-type structure 1004 (FIGS. 9A and 9B), and portions of the N-type structure 1004 remaining unmasked (e.g., uncovered, exposed) by the mask structure may be selectively recessed and removed using at least one etching process (e.g., at least one dry etching process, such as at least one of a reactive ion etching (RIE) process, a deep RIE process, a plasma etching process, a reactive ion beam etching process, and a chemically assisted ion beam etching process; at least one wet etching process, such as at least one of a hydrofluoric acid etching process, a buffered hydrofluoric acid etching process, and a buffered oxide etching process).

Referring to next to FIG. 11A, linear spacer structures 1009 may be formed on or over opposing sidewalls of each of the N-type line structures 1006. The linear spacer structures 1009 may partially fill the trenches 1008, such that the linear spacer structures 1009 on neighboring N-type line structures 1006 are separated from one another by remainders of the trenches 1008. The linear spacer structures 1009 may be formed of and include at least one dielectric material, such as one or more of an oxide material (e.g., silicon dioxide, phosphosilicate glass, borosilicate glass, borophosphosilicate glass, fluorosilicate glass, aluminum oxide, a combination thereof), a nitride material (e.g., silicon nitride), and an oxynitride material (e.g., silicon oxynitride). In some embodiments, the linear spacer structures 1009 are formed of silicon dioxide. In addition, dimensions and spacing of the linear spacer structures 1009 (and, hence, the dimensions and spacing of remaining portions of the trenches 1008) may be selected to provide desired dimensions and spacing to additional structures to be formed in the remaining portions of the trenches 1008. By way of non-limiting example, the linear spacer structures 1009 may be sized and spaced to facilitate the formation of P-type line structures exhibiting dimensions and spacing substantially similar to those of the N-type line structures 1006 within the remaining portions of the trenches 1008, as described in further detail below. In additional embodiments, the linear spacer structures 1009 are not formed on or over opposing sidewalls of each of the N-type line structures 1006 (e.g., the formation of the linear spacer structures 1009 is omitted, such that the opposing sidewalls of the N-type line structures 1006 remain free of any linear spacer structures 1009 formed thereon or thereover). FIG. 12B is a simplified plan view of the TFT CMOS control logic device structure 1000 at the process stage depicted in FIG. 11A.

The linear spacer structures 1009 (if any) may be formed using conventional processes and conventional processing equipment, which are not described in detail herein. By way of non-limiting example, a spacer material may be conformally formed (e.g., deposited through one or more of a PVD process, a CVD process, an ALD process, and a spin-coating process) over exposed surfaces of the N-type line structures 1006 and the substrate 1002, and then an anisotropic etching process may be performed to remove the spacer material from upper surfaces of the N-type line structures 1006 and from portions of the upper surface of substrate 1002 underlying central portions of the trenches 1008, while maintaining the spacer material on the opposing sidewalls of the N-type line structures 1006 to form the linear spacer structures 1009.

Referring next to FIG. 12A, a P-type structure 1010 may be formed on or over exposed surfaces of the substrate 1002, the N-type line structures 1006, and the linear spacer structures 1009 (if any). As shown in FIG. 12A, the P-type structure 1010 may substantially fill remaining portions of the trenches 1008 (FIG. 11A), such as portions of the trenches 1008 (FIG. 11A) unoccupied by the linear spacer structures 1009, and may exhibit a non-planar upper surface 1014 defined by elevated regions and recessed regions of the P-type structure 1010. The elevated regions of the P-type structure 1010 may overlie the N-type line structures 1006 and the linear spacer structures 1009 (if any), and the recessed regions of the P-type structure 1010 may overlie regions of the substrate 1002 not covered by the N-type line structures 1006 and the linear spacer structures 1009 (if any). FIG. 12B is a simplified plan view of the TFT CMOS control logic device structure 1000 at the process stage depicted in FIG. 12A.

The P-type structure 1010 may be formed of and include at least one P-type conductivity material. By way of non-limiting example, the P-type conductivity material may comprise polysilicon doped with at least one P-type dopant (e.g., boron ions). The P-type conductivity material may form channel regions of transistors (e.g., NMOS transistors) subsequently formed from the P-type structure 1010, as described in further detail below. In addition, in some embodiments, the P-type structure 1010 further includes N-type conductivity materials above and below the P-type conductivity material. By way of non-limiting example, the N-type conductivity materials may comprise polysilicon doped with at least one N-type dopant (e.g., arsenic ions, phosphorous ions, antimony ions). The P-type structure 1010 may, for example, be formed to comprise a stack including a first N-type conductivity material on or over surfaces of the substrate 1002, the N-type line structures 1006, and the linear spacer structures 1009 (if any); a P-type conductivity material on or over the first N-type conductivity material, and a second N-type conductivity material on or over the P-type conductivity material.

The P-type structure 1010 may be formed using conventional processes and conventional processing equipment, which are not described in detail herein. By way of non-limiting example, at least one semiconductive material (e.g., polysilicon) may be conventionally formed (e.g., through one or more of in situ growth, spin-on coating, blanket coating, CVD, PECVD, ALD, and PVD) on or over the substrate 1002, the N-type line structures 1006, and the linear spacer structures 1009 (if any); and then the semiconductive material may be doped (e.g., through ion-implantation) to form the P-type structure 1010.

Referring next to FIG. 13A, at least one material removal process (e.g., at least one planarization process, such as at least one chemical-mechanical planarization (CMP) process) may be used to at least remove portions of the P-type structure 1010 (FIG. 12A) overlying upper surfaces of the N-type line structures 1006, and the linear spacer structures 1009 (if any) and form P-type line structures 1012. In some embodiments, the material removal process substantially only removes portions of the P-type structure 1010 (FIG. 12A) overlying the upper surfaces of the N-type line structures 1006 and the linear spacer structures 1009 (if any), such that the N-type line structures 1006 and the linear spacer structures 1009 remain substantially unmodified by the material removal process. In additional embodiments, the material removal process removes portions of the P-type structure 1010 (FIG. 12A) overlying the upper surfaces of the N-type line structures 1006 and the linear spacer structures 1009 (if any), and also removes upper portions of the N-type line structures 1006 and the linear spacer structures 1009 (if any) and additional portions of the P-type structure 1010 (FIG. 12A) laterally neighboring the N-type line structures 1006 and/or the linear spacer structures 1009 (if any). Accordingly, the material removal process may reduce thicknesses of the N-type line structures 1006 and the linear spacer structures 1009 (if any). As shown in FIG. 13A, the material removal process may form a substantially planar surface 1018 including substantially coplanar upper surfaces of the P-type line structures 1012, the N-type line structures 1006, and the linear spacer structures 1009 (if any). The P-type line structures 1012 may continuously extend parallel to the N-type line structures 1006 in the first lateral direction (e.g., the Y-direction), and may be spaced apart from one another in the second lateral direction (an X-direction) perpendicular to the first lateral direction. The dimensions and the spacing of the P-type line structures 1012 may respectively be substantially the same as the dimensions and the spacing of N-type line structures 1006, or one or more of the dimensions and the spacing of the P-type line structures 1012 may be different than the dimensions and the spacing of the N-type line structures 1006. In some embodiments, the dimensions and the spacing of the P-type line structures 1012 are respectively substantially the same as the dimensions and the spacing of N-type line structures 1006. FIG. 13B is a simplified plan view of the TFT CMOS control logic device structure 1000 at the process stage depicted in FIG. 13A.

Figure 14A:
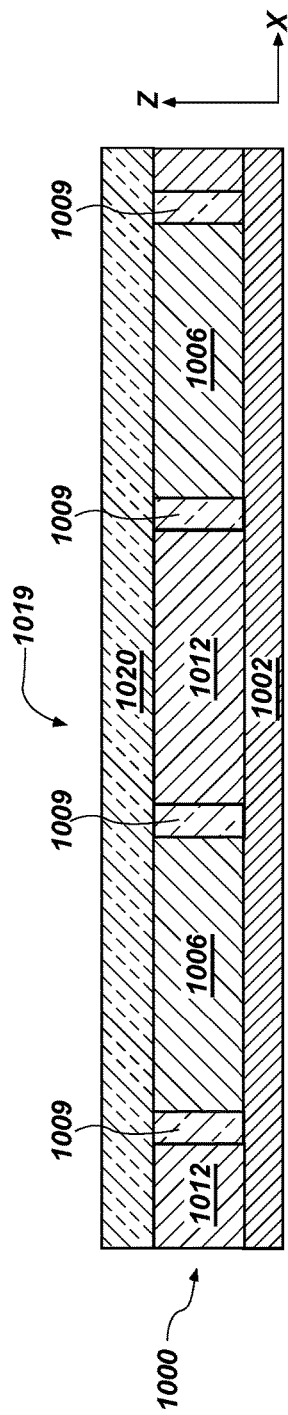
Figure 14B:
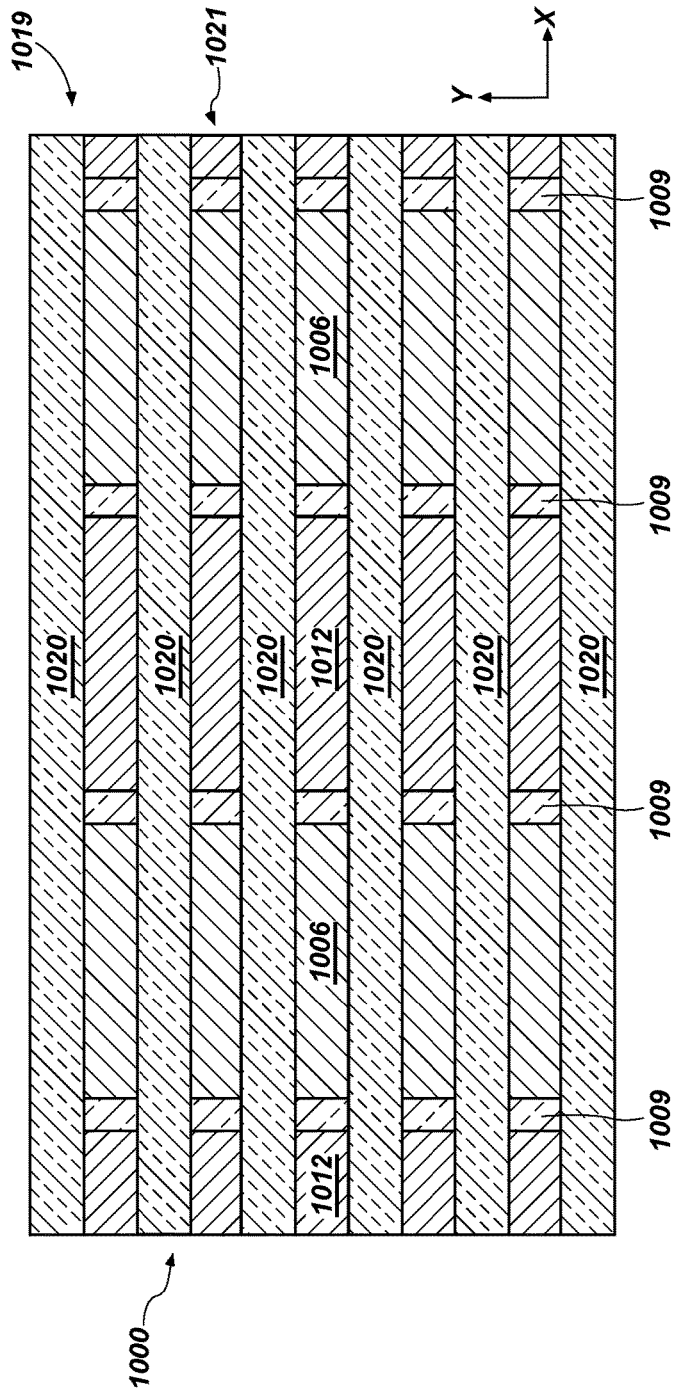

Next, referring to FIG. 14A, a first mask structure 1019 may be provided on or over exposed upper surfaces of the P-type line structures 1012, the N-type line structures 1006, and the linear spacer structures 1009 (if any). The first mask structure 1019 may be formed of and include at least one material (e.g., at least one hard mask structure material) suitable for use as an etch mask structure to pattern portions of the P-type line structures 1012, the N-type line structures 1006, and the linear spacer structures 1009 (if any), as described in further detail below. By way of non-limiting example, the first mask structure 1019 may be formed of and include at least one of amorphous carbon, silicon, a silicon oxide, a silicon nitride, a silicon oxycarbide, aluminum oxide, and a silicon oxynitride. The first mask structure 1019 may be homogeneous (e.g., may comprise a single material layer), or may be heterogeneous (e.g., may comprise a stack exhibiting at least two different material layers). FIG. 14B is a simplified plan view of the TFT CMOS control logic device structure 1000 at the process stage depicted in FIG. 14A.

The first mask structure 1019 exhibits a desired pattern to be transferred to the combination of the P-type line structures 1012, the N-type line structures 1006, and the linear spacer structures 1009 (if any). For example, referring to FIG. 14B, the first mask structure 1019 may include first linear structures 1020, and first linear apertures 1021 (e.g., openings) laterally intervening (e.g., in the Y-direction) between the first linear structures 1020. The first linear structures 1020 and the first linear apertures 1021 may individually exhibit lateral dimensions, shapes, positions, and orientations facilitating desired lateral dimensions, shapes, positions, and orientations of features and openings to be subsequently formed from and in the combination of the P-type line structures 1012, the N-type line structures 1006, and the linear spacer structures 1009 (if any). As shown in FIG. 14B, in some embodiments, each of the first linear structures 1020 exhibits substantially the same lateral dimensions (e.g., width, length), shape, spacing, and orientation as each other of the first linear structures 1020. Accordingly, each of the first linear apertures 1021 may also exhibit substantially the same lateral dimensions (e.g., width, length), shape, spacing, and orientation as each other of the first linear apertures 1021. In additional embodiments, one or more of the first linear structures 1020 exhibits one or more of different lateral dimensions (e.g., a different width, a different length), a different shape, different spacing, and/or a different orientation than one or more of the first linear structures 1020. Accordingly, one or more of the first linear apertures 1021 may also exhibit one or more of different lateral dimensions (e.g., a different width, a different length), a different shape, different spacing, and/or a different orientation than one or more other of the first linear apertures 1021.

The first mask structure 1019, including the first linear structures 1020 and the first linear apertures 1021 thereof, may be formed and positioned by conventional processes (e.g., conventional deposition processes, such as at least one of in situ growth, spin-on coating, blanket coating, CVD, PECVD, ALD, and PVD; conventional photolithography processes; conventional material removal processes; conventional alignment processes) and conventional processing equipment, which are not described in detail herein.

Referring next to FIG. 15A, portions of the P-type line structures 1012 (FIGS. 14A and 14B), the N-type line structures 1006 (FIGS. 14A and 14B), and the linear spacer structures 1009 (FIGS. 14A and 14B) remaining uncovered by the first linear structures 1020 (FIGS. 14A and 14B) of the first mask structure 1019 (FIGS. 14A and 14B) may be subjected to at least one material removal process to respectively form first P-type pillar structures 1013, first N-type pillar structures 1007, and spacer structures 1011. The material removal process may transfer or extend a pattern defined by the first linear apertures 1021 (FIG. 14B) in the first mask structure 1019 (FIGS. 14A and 14B) into the P-type line structures 1012 (FIGS. 14A and 14B), the N-type line structures 1006 (FIGS. 14A and 14B), and the linear spacer structures 1009 (FIGS. 14A and 14B) to form the first P-type pillar structures 1013, the first N-type pillar structures 1007, and the spacer structures 1011. In addition, as shown in FIG. 15A, following the formation of the first P-type pillar structures 1013, the first N-type pillar structures 1007, and the spacer structures 1011, remaining portions of the first mask structure 1019 (FIGS. 14A and 14B) may be removed to expose upper surfaces of the first P-type pillar structures 1013, the first N-type pillar structures 1007, and the spacer structures 1011. FIG. 15B is a simplified plan view of the TFT CMOS control logic device structure 1000 at the process stage depicted in FIG. 15A.

As shown in FIG. 15B, the material removal process forms first linear openings 1015 laterally intervening between (e.g., in the Y-direction) and separating neighboring first P-type pillar structures 1013 formed from the same P-type line structure 1012 (FIGS. 14A and 14B), neighboring first N-type pillar structures 1007 formed from the same N-type line structure 1006 (FIGS. 14A and 14B), and neighboring spacer structures 1011 formed from the same linear spacer structures 1009 (FIGS. 14A and 14B). The first linear openings 1015 may exhibit substantially the same lateral dimensions (e.g., in the Y-direction and the X-direction), shapes, spacing, and orientations as the first linear apertures 1021 (FIG. 14B) in the first mask structure 1019 (FIGS. 14A and 14B), and may longitudinally extend (e.g., in the Z-direction shown in FIG. 15A) to the substrate 1002.

The material removal process employed to form the first P-type pillar structures 1013, the first N-type pillar structures 1007, the spacer structures 1011, and the first linear openings 1015 may comprise a conventional anisotropic etching process, which is not described in detail herein. For example, the material removal process may comprise exposing portions of the P-type line structures 1012 (FIGS. 14A and 14B), the N-type line structures 1006 (FIGS. 14A and 14B), and the linear spacer structures 1009 (FIGS. 14A and 14B) remaining uncovered by the first linear structures 1020 (FIGS. 14A and 14B) of the first mask structure 1019 (FIGS. 14A and 14B) to one or more of anisotropic dry etching (e.g., reactive ion etching (RIE), deep RIE, plasma etching, reactive ion beam etching, chemically assisted ion beam etching) and anisotropic wet etching (e.g., hydrofluoric acid (HF) etching, a buffered HF etching, buffered oxide etching). In addition, remaining portions of the first mask structure 1019 (FIGS. 14A and 14B) (if any) may be selectively removed following the formation of the first P-type pillar structures 1013, the first N-type pillar structures 1007, the spacer structures 1011, and the first linear openings 1015 using at least one other conventional material removal process (e.g., a conventional wet etching process, a conventional dry etching process), which are not described in detail herein.

Next, referring collectively to FIGS. 16A and 16B, first linear dielectric liner structures 1024 may be formed on or over surfaces within the first linear openings 1015 (FIG. 15B), and first linear isolation structures 1022 may be formed on or over surfaces of the first linear dielectric liner structures 1024. The first linear dielectric liner structures 1024 may be formed on or over portions of the substrate 1002 exposed within the first linear openings 1015 (FIG. 15B), and on or over opposing sidewalls of neighboring first P-type pillar structures 1013, opposing sidewalls of neighboring first N-type pillar structures 1007, and opposing sidewalls neighboring spacer structures 1011 exposed within the first linear openings 1015 (FIG. 15B). In additional embodiments, the first linear dielectric liner structures 1024 on or over one or more surfaces within the first linear openings 1015 (FIG. 15B) may, optionally, be omitted (e.g., such that the first linear isolation structures 1022 are formed directly on surfaces of the substrate 1002, the first P-type pillar structures 1013, and the spacer structures 1011 are exposed within the first linear openings 1015 (FIG. 15B). The first linear dielectric liner structures 1024 formed within the first linear openings 1015 may be substantially confined within horizontal boundaries and vertical boundaries of the first linear openings 1015. Accordingly, uppermost surfaces of the first linear dielectric liner structures 1024 may be substantially coplanar with a plane shared by the upper surfaces of the first P-type pillar structures 1013, the N-type pillar structures 1007, and the spacer structures 1011.

The first linear dielectric liner structures 1024 (if any) may be formed of and include at least one dielectric material, such as one or more of an dielectric oxide material (e.g., silicon dioxide, phosphosilicate glass, borosilicate glass, borophosphosilicate glass, fluorosilicate glass, aluminum oxide, a combination thereof), a dielectric nitride material (e.g., silicon nitride (SiN)), a dielectric oxynitride material (e.g., silicon oxynitride (SiON)), a dielectric carbonitride material (e.g., silicon carbonitride (SiCN)), and a dielectric carboxynitride material (e.g., silicon carboxynitride (SiOCN)). In some embodiments, the first linear dielectric liner structures 1024 comprise silicon dioxide. Each of the first linear dielectric liner structures 1024 may be formed to exhibit any desirable thickness. By way of non-limiting example, a thickness of each of the first linear dielectric liner structures 1024 may be less than or equal to about 1 nm, less than or equal to about 50 Angstroms (Å), less than or equal to about 25 Å, or less than or equal to about 10 Å. In some embodiments, the thickness of each of the first linear dielectric liner structures 1024 is within a range of from about 3 Å to about 10 Å. The thickness of each of the first linear dielectric liner structures 1024 may be substantially uniform, or at least one region of one or more of the first linear dielectric liner structures 1024 (e.g., a region extending across the upper surface of the substrate 1002) may have a different thickness than at least one other region of one or more of the first linear dielectric liner structures 1024 (e.g., regions extending across the opposing sidewalls of neighboring first P-type pillar structures 1013, the opposing sidewalls of neighboring first N-type pillar structures 1007, and/or the opposing sidewalls neighboring spacer structures 1011).

With continued reference to FIG. 16B, the first linear isolation structures 1022 may fill remaining spaces (e.g., spaces not occupied by the first linear dielectric liner structures 1024) of the first linear openings 1015 (FIG. 15B). The first linear isolation structures 1022 may be formed on or over surfaces of the first P-type pillar structures 1013, the first N-type pillar structures 1007, the spacer structures 1011, and the substrate 1002 (e.g., on surfaces of the first linear dielectric liner structures 1024, if any). As shown in FIG. 16B, the first linear isolation structures 1022 may laterally intervene between neighboring first P-type pillar structures 1013, neighboring first N-type pillar structures 1007, and neighboring spacer structures 1011 in the Y-direction. The first linear isolation structures 1022 may electrically isolate the neighboring first P-type pillar structures 1013 from one another, and may also electrically isolate the neighboring first N-type pillar structures 1007 from one another. The first linear isolation structures 1022 formed within the first linear openings 1015 (FIG. 15B) may be substantially confined within the horizontal boundaries and the vertical boundaries of the first linear openings 1015 (FIG. 15B). Accordingly, upper surfaces of the first linear isolation structures 1022 may be substantially coplanar with a plane shared by the upper surfaces of the P-type pillar structures 1013, N-type pillar structures 1007, and the spacer structures 1011.

The first linear isolation structures 1022 may be formed of and include a dielectric material, such as one or more of an dielectric oxide material (e.g., silicon dioxide, phosphosilicate glass, borosilicate glass, borophosphosilicate glass, fluorosilicate glass, aluminum oxide, a combination thereof), a dielectric nitride material (e.g., SiN), a dielectric oxynitride material (e.g., SiON), a dielectric carbonitride material (e.g., SiCN), and a dielectric carboxynitride material (e.g., SiOCN). The dielectric material of the first linear isolation structures 1022 may be the same as or different than that of the first linear dielectric liner structures 1024 (if any). In some embodiments, each of the first linear isolation structures 1022 is formed of and includes a silicon oxide (e.g., silicon dioxide).

The first linear dielectric liner structures 1024 (if any) and the first linear isolation structures 1022 may be formed using conventional processes (e.g., conventional deposition processes and conventional material removal processes) and conventional processing equipment, which are not described in detail herein. By way of non-limiting example, a first dielectric liner material may be formed (e.g., through one or more of in situ growth, spin-on coating, blanket coating, CVD, PECVD, ALD, and PVD) on exposed surfaces of the first P-type pillar structures 1013, the first N-type pillar structures 1007, the spacer structures 1011 (if any), and the substrate 1002 inside and outside of the first linear openings 1015 (FIG. 15B); a first dielectric material may be formed (e.g., through one or more of in situ growth, spin-on coating, blanket coating, CVD, PECVD, ALD, and PVD) on exposed surfaces of the first dielectric liner material inside and outside of the first linear openings 1015 (FIG. 15B); and then at least portions of the first dielectric liner material and first dielectric material outside of the first linear openings 1015 (FIG. 15B) may be removed (e.g., through at least one planarization process, such as at least one CMP process) to form the first linear dielectric liner structures 1024 from the first dielectric liner material, and the first linear isolation structures 1022 from the first dielectric material.

Next, referring to FIG. 17A, a second mask structure 1025 may be provided on or over exposed upper surfaces of the first P-type pillar structures 1013, the first N-type pillar structures 1007, the spacer structures 1011 (if any), the first linear dielectric liner structures 1024 (FIG. 17B)(if any), and the first linear isolation structures 1022 (FIG. 17B). The second mask structure 1025 may be formed of and include at least one material (e.g., at least one hard mask structure material) suitable for use as an etch mask structure to pattern portions of the first P-type pillar structures 1013, the first N-type pillar structures 1007, the spacer structures 1011 (if any), the first linear dielectric liner structures 1024 (if any), and the first linear isolation structures 1022, as described in further detail below. By way of non-limiting example, the second mask structure 1025 may be formed of and include at least one of amorphous carbon, silicon, a silicon oxide, a silicon nitride, a silicon oxycarbide, aluminum oxide, and a silicon oxynitride. The second mask structure 1025 may be homogeneous (e.g., may comprise a single material layer), or may be heterogeneous (e.g., may comprise a stack exhibiting at least two different material layers). The material composition of the second mask structure 1025 may be substantially the same as or may be different than that of the first mask structure 1019 (FIG. 14B). FIG. 17B is a simplified plan view of the TFT CMOS control logic device structure 1000 at the process stage depicted in FIG. 17A.

The second mask structure 1025 exhibits a desired pattern to be transferred to the combination of the first P-type pillar structures 1013, the first N-type pillar structures 1007, the spacer structures 1011 (if any), the first linear dielectric liner structures 1024 (if any), and the first linear isolation structures 1022. For example, referring to FIG. 17B, the second mask structure 1025 may include second linear structures 1026, second linear apertures 1027 (e.g., openings) laterally intervening (e.g., in the Y-direction) between some of the second linear structures 1026, and, optionally, third linear apertures 1028 (e.g., openings) laterally intervening (e.g., in the Y-direction) between other of the second linear structures 1026. The second linear structures 1026, the second linear apertures 1027, and the third linear apertures 1028 (if any) of the second mask structure 1025 may be oriented (e.g., laterally extend) in a lateral direction substantially perpendicular to that of the first linear structures 1020 (FIG. 14B) and the first linear apertures 1021 (FIG. 14B) of the first mask structure 1019 (FIG. 14B). For example, as shown in FIG. 17B, the second linear structures 1026, the second linear apertures 1027, and the third linear apertures 1028 (if any) of the second mask structure 1025 may laterally extend in the Y-direction substantially perpendicular to the X-direction in which the first linear structures 1020 (FIG. 14B) and the first linear apertures 1021 (FIG. 14B) of the first mask structure 1019 (FIG. 14B) laterally extend.

The second linear structures 1026, the second linear apertures 1027, and the third linear apertures 1028 (if any) of the second mask structure 1025 may individually exhibit lateral dimensions, shapes, positions, and orientations facilitating desired lateral dimensions, shapes, positions, and orientations of features and openings to be subsequently formed from and in the combination of the first P-type pillar structures 1013, the first N-type pillar structures 1007, the spacer structures 1011 (if any), the first linear dielectric liner structures 1024 (if any), and the first linear isolation structures 1022. If present, the third linear apertures 1028 may be wider (e.g., in the X-direction) than the second linear apertures 1027. For example, as shown in FIGS. 17A and 17B, the second mask structure 1025 may exhibit one or more regions 1030, wherein the second linear structures 1026 are absent and/or non-uniformly spaced so as to form the third linear apertures 1028 to be relatively wider that the second linear apertures 1027, and such that neighboring second linear structures 1026 laterally separated (e.g., in the X-direction) from one another by the third linear apertures 1028 are spaced apart by a greater distance than some other neighboring second linear structures 1026 laterally separated (e.g., in the X-direction) from one another by the second linear apertures 1027. The third linear apertures 1028 may correspond to locations where neighboring structures subsequently formed from the first P-type pillar structures 1013 and the first N-type pillar structures 1007 do not share gate electrodes, as described in further detail below. In additional embodiments, the third linear apertures 1028 may be omitted, such that only the second linear apertures 1027 laterally intervene between the second linear structures 1026. Each of the second linear structures 1026 may exhibit substantially the same lateral dimensions (e.g., width, length), shape, spacing, and orientation as each other of the second linear structures 1026, or one or more of the second linear structures 1026 may exhibit one or more of different lateral dimensions (e.g., a different width, a different length), a different shape, different spacing, and/or a different orientation than one or more of the second linear structures 1026. In addition, each of the second linear apertures 1027 may exhibit substantially the same lateral dimensions (e.g., width, length), shape, spacing, and orientation as each other of the second linear apertures 1027, or one or more of the second linear apertures 1027 may exhibit one or more of different lateral dimensions (e.g., a different width, a different length), a different shape, different spacing, and/or a different orientation than one or more of the second linear apertures 1027. Furthermore, each of the third linear apertures 1028 (if any) may exhibit substantially the same lateral dimensions (e.g., width, length), shape, spacing, and orientation as each other of the third linear apertures 1028, or one or more of the third linear apertures 1028 may exhibit one or more of different lateral dimensions (e.g., a different width, a different length), a different shape, different spacing, and/or a different orientation than one or more of the third linear apertures 1028.

The second mask structure 1025, including the second linear structures 1026, the second linear apertures 1027, and the third linear apertures 1028 (if any) thereof, may be formed and positioned by conventional processes (e.g., conventional deposition processes, such as at least one of in situ growth, spin-on coating, blanket coating, CVD, PECVD, ALD, and PVD; conventional photolithography processes; conventional material removal processes; conventional alignment processes) and conventional processing equipment, which are not described in detail herein.

Next, referring collectively to FIGS. 18A and 18B, the spacer structures 1011 (FIGS. 17A and 17B) (if any) and portions of the first P-type pillar structures 1013 (FIGS. 17A and 17B), the first N-type pillar structures 1007 (FIGS. 17A and 17B), the first linear dielectric liner structures 1024 (FIG. 17B) (if any), and the first linear isolation structures 1022 (FIG. 17B) may be subjected to at least one additional material removal process to form second P-type pillar structures 1032, second N-type pillar structures 1034, first dielectric liner structures 1033 (if the first linear dielectric liner structures 1024 were present), and first isolation structures 1035. The additional material removal process may transfer or extend a pattern defined by the third linear apertures 1028 (FIG. 17B) in the second mask structure 1025 (FIGS. 17A and 17B) into the combination of first P-type pillar structures 1013 (FIGS. 17A and 17B), the first N-type pillar structures 1007 (FIGS. 17A and 17B), the spacer structures 1011 (FIG. 17B) (if any), the first linear dielectric liner structures 1024 (FIG. 17B) (if any), and the first linear isolation structures 1022 (FIG. 17B) to form the second P-type pillar structures 1032, the second N-type pillar structures 1034, the first dielectric liner structures 1033 (if any), and the first isolation structures 1035. In additional embodiments, the first linear dielectric liner structures 1024 (FIGS. 17A and 17B) (if any) and the first linear isolation structures 1022 (FIGS. 17A and 17B) may remain following the additional material removal process, such that the first dielectric liner structures 1033 and first isolation structures 1035 are not formed. In addition, as shown in FIGS. 18A and 18B, following the formation of the second P-type pillar structures 1032, the second N-type pillar structures 1034, the first dielectric liner structures 1033 (if any), and the first isolation structures 1035, remaining portions of the second mask structure 1025 (FIGS. 17A and 17B) may be removed to expose upper surfaces of the second P-type pillar structures 1032, the second N-type pillar structures 1034, the first dielectric liner structures 1033 (if any), and the first isolation structures 1035.

As shown in FIG. 18B, the additional material removal process may form second linear openings 1036 and third linear openings 1037 that may individually laterally intervene between (e.g., in the X-direction) and separate neighboring second P-type pillar structures 1032 formed from the same first P-type pillar structure 1013 (FIGS. 17A and 17B), neighboring second N-type pillar structures 1034 formed from the same first N-type pillar structure 1007 (FIGS. 17A and 17B), neighboring first dielectric liner structures 1033 (if any) formed from the same first linear dielectric liner structure 1024 (FIGS. 17A and 17B) (if any), and neighboring first isolation structures 1035 formed from the same first linear isolation structure 1022 (FIGS. 17A and 17B). The third linear openings 1037 may be relatively wider (e.g., in the X-direction) than the second linear openings 1036. The second linear openings 1036 may exhibit substantially the same lateral dimensions (e.g., in the Y-direction and the X-direction), shapes, spacing, and orientations as the second linear apertures 1027 (FIG. 17B) in the second mask structure 1025 (FIGS. 17A and 17B), and may longitudinally extend (e.g., in the Z-direction shown in FIG. 18A) to the substrate 1002. In addition, the third linear openings 1037 may exhibit substantially the same lateral dimensions (e.g., in the Y-direction and the X-direction), shapes, spacing, and orientations as the third linear apertures 1028 (FIG. 17B) in the second mask structure 1025 (FIGS. 17A and 17B), and may longitudinally extend (e.g., in the Z-direction shown in FIG. 18A) to the substrate 1002. In additional embodiments wherein the third linear apertures 1028 (FIG. 17B) are omitted from the second mask structure 1025 (FIGS. 17A and 17B), the third linear openings 1037 may be absent, such that only the second linear openings 1036 laterally intervene between (e.g., in the X-direction) and separate neighboring second P-type pillar structures 1032 formed from the same first P-type pillar structure 1013 (FIGS. 17A and 17B), neighboring second N-type pillar structures 1034 formed from the same first N-type pillar structure 1007 (FIGS. 17A and 17B), neighboring first dielectric liner structures 1033 (if any) formed from the same first linear dielectric liner structure 1024 (FIGS. 17A and 17B) (if any), and neighboring first isolation structures 1035 formed from the same first linear isolation structure 1022 (FIGS. 17A and 17B).

The additional material removal process employed to form the second P-type pillar structures 1032, the second N-type pillar structures 1034, the first dielectric liner structures 1033 (if any), the first isolation structures 1035, the second linear openings 1036, and the third linear openings 1037 (if any) may comprise a conventional anisotropic etching process, which is not described in detail herein. For example, the additional material removal process may comprise exposing the spacer structures 1011 (FIGS. 17A and 17B) (if any) and portions of the first P-type pillar structures 1013 (FIGS. 17A and 17B), the first N-type pillar structures 1007 (FIGS. 17A and 17B), the first linear dielectric liner structures 1024 (FIGS. 17A and 17B) (if any), and the first linear isolation structures 1022 (FIGS. 17A and 17B) remaining uncovered by the second linear structures 1026 (FIGS. 17A and 17B) of the second mask structure 1025 (FIGS. 17A and 17B) to one or more of anisotropic dry etching (e.g., RIE, deep RIE, plasma etching, reactive ion beam etching, chemically assisted ion beam etching) and anisotropic wet etching (e.g., HF etching, a buffered HF etching, buffered oxide etching). In addition, remaining portions of the second mask structure 1025 (FIGS. 17A and 17B) (if any) may be selectively removed following the formation of the second P-type pillar structures 1032, the second N-type pillar structures 1034, the first dielectric liner structures 1033 (if any), the first isolation structures 1035, the second linear openings 1036, and the third linear openings 1037 (if any) using at least one other conventional material removal process (e.g., a conventional wet etching process, a conventional dry etching process), which is not described in detail herein.

Next, referring to FIG. 19A, a gate dielectric material 1038 may be formed (e.g., conformally formed) on or over exposed surfaces of the second P-type pillar structures 1032, the second N-type pillar structures 1034, the first dielectric liner structures 1033 (if any), the first isolation structures 1035, and the substrate 1002. The gate dielectric material 1038 may be formed of and include a dielectric oxide material (e.g., silicon dioxide; phosphosilicate glass; borosilicate glass; borophosphosilicate glass; fluorosilicate glass; aluminum oxide; high-k oxides, such as hafnium oxide (HfO$_x$); a combination thereof), a dielectric nitride material (e.g., silicon nitride (SiN)), a dielectric oxynitride material (e.g., silicon oxynitride (SiON)), a dielectric carbonitride material (e.g., silicon carbonitride (SiCN)), and a dielectric carboxynitride material (e.g., silicon carboxynitride (SiOCN)), and amphorous carbon. In some embodiments, the gate dielectric material 1038 comprises silicon dioxide. The gate dielectric material 1038 may be formed at any suitable thickness. The thickness of the gate dielectric material 1038 may be selected (e.g., tailored) to provide a desired lateral offset (e.g., space, distance) between the second P-type pillar structures 1032, the second N-type pillar structures 1034, and one or more gate electrodes to be subsequently formed laterally adjacent thereto, and to provide a desired longitudinal offset (e.g., space, distance) between the subsequently-formed gate electrodes and the substrate 1002. By way of non-limiting example, the thickness of the gate dielectric material 1038 may be less than or equal to about 100 Angstroms (Å), less than or equal to about 50 Å, less than or equal to about 25 Å, or less than or equal to about 10 Å. In some embodiments, the thickness of the gate dielectric material 1038 is within a range of from about 5 Å to about 10 Å. The thickness of the gate dielectric material 1038 may be substantially uniform, or at least one region of the gate dielectric material 1038 may have a different thickness than at least one other region of the gate dielectric material 1038. FIG. 19B is a simplified plan view of the TFT CMOS control logic device structure 1000 at the process stage depicted in FIG. 19A, wherein the gate dielectric material 1038 is depicted as transparent to show the other components of the TFT CMOS control logic device structure 1000 provided thereunder.

The gate dielectric material 1038 may be formed on or over the exposed surfaces of the second P-type pillar structures 1032, the second N-type pillar structures 1034, the first dielectric liner structures 1033 (if any), the first isolation structures 1035, and the substrate 1002 using conventional processes (e.g., one or more of in situ growth, spin-on coating, blanket coating, CVD, PECVD, ALD, and PVD) and conventional processing equipment, which are not described in detail herein.

Referring next to FIG. 20A, a gate material 1040 may be formed (e.g., conformally formed) on or over exposed surfaces of the gate dielectric material 1038. The gate material 1040 may be formed of and include an electrically conductive material including, but not limited to, a metal (e.g., W, Ti, Ni, Pt, Au), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof. By way of non-limiting example, the gate material 1040 may comprise at least one of TiN, TaN, WN, TiAlN, elemental Ti, elemental Pt, elemental Rh, elemental Ir, iridium oxide (IrO$_x$), elemental Ru, ruthenium oxide (RuO$_x$), alloys thereof, or combinations thereof. In some embodiments, the gate material 1040 comprises TiN. FIG. 20B is a simplified plan view of the TFT CMOS control logic device structure 1000 at the process stage depicted in FIG. 19A, wherein the gate material 1040 is depicted as transparent and the gate dielectric material 1038 (FIG. 20A) is omitted to show the other components of the TFT CMOS control logic device structure 1000 provided thereunder.

As shown in FIG. 20A, the gate material 1040 may substantially (e.g., completely) fill remaining spaces (e.g., spaces not occupied by the gate dielectric material 1038) of the second linear openings 1036, and may only partially (e.g., less than completely) fill remaining spaces of the third linear openings 1037 (if any). As described in further detail below, each of the second linear openings 1036 substantially filled with the gate material 1040 may individually facilitate the formation of a single (e.g., only one), shared gate electrode between neighboring (e.g., in the X-direction) second P-type pillar structures 1032, neighboring (e.g., in the X-direction) second N-type pillar structures 1034, or a second P-type pillar structure 1032 neighboring (e.g., in the X-direction) a second N-type pillar structure 1034. In turn, as also described in further detail below, each third linear opening 1037 (if any) only partially filled with the gate material 1040 may individually facilitate the formation of two, unshared gate electrodes between neighboring (e.g., in the X-direction) second P-type pillar structures 1032, neighboring (e.g., in the X-direction) second N-type pillar structures 1034, or a second P-type pillar structure 1032 neighboring (e.g., in the X-direction) a second N-type pillar structure 1034.

The gate material 1040 may be formed on or over the exposed surfaces of the gate dielectric material 1038 using conventional processes (e.g., one or more of spin-on coating, blanket coating, CVD, PECVD, ALD, and PVD) and conventional processing equipment, which are not described in detail herein.

Referring to next to FIG. 21A, the gate material 1040 (FIG. 20A) may be subjected to at least one material removal process to form shared gate electrodes 1042 and non-shared gate electrodes 1044. The shared gate electrodes 1042 may be provided in the second linear openings 1036, and the non-shared gate electrodes 1044 may be provided in the third linear openings 1037. Each of the second linear openings 1036 may exhibit a single (e.g., only one) shared gate electrode 1042, and each of the third linear openings 1037 may exhibit two (2) non-shared gate electrodes 1044. Each shared gate electrode 1042 may substantially extend across the lateral dimensions of a remainder of the second linear opening 1036 associated therewith in the X-direction and the Y-direction, whereas each non-shared gate electrode 1044 may only partially extend across the lateral dimensions of a remainder of the third linear opening 1037 associated therewith in the X-direction. FIG. 21B is a simplified plan view of the TFT CMOS control logic device structure 1000 at the process stage depicted in FIG. 21A.

As shown in FIGS. 21A and 21B, each shared gate electrode 1042 continuously extends in a first lateral direction (e.g., the Y-direction), and may intervene between and be shared by at least two (2) neighboring second P-type pillar structures 1032 in a second lateral direction (e.g. the X-direction), at least two (2) neighboring second N-type pillar structures 1034 in the second lateral direction, or at least one second P-type pillar structure 1032 neighboring at least one second N-type pillar structure 1034 in the second lateral direction. Opposing lateral sides of each shared gate electrode 1042 in the second lateral direction may, for example, be provided directly adjacent portions of the gate dielectric material 1038 intervening between the neighboring second P-type pillar structures 1032, the neighboring second N-type pillar structures 1034, or the second P-type pillar structure 1032 neighboring the second N-type pillar structure 1034. Accordingly, neighboring shared gate electrodes 1042 may be separated from one another in the second lateral direction by one or more second P-type pillar structures 1032, or one or more second N-type pillar structures 1034.

As also shown in FIGS. 21A and 21B, each non-shared gate electrode 1044 continuously extends in the first lateral direction (e.g., the Y-direction, and may be positioned between another non-shared gate electrode 1044 and one or more second P-type pillar structures 1032 in the second lateral direction (e.g. the X-direction), or between another non-shared gate electrode 1044 and one or more second N-type pillar structures 1034 in the second lateral direction. Accordingly, neighboring non-shared gate electrodes 1044 may be separated from one another in the X-direction by a remainder of the third linear openings 1037 in which the neighboring non-shared gate electrodes 1044 are mutually disposed within. In additional embodiments, such as embodiments wherein the third linear openings 1037 are not formed, the non-shared gate electrodes 1044 are omitted (e.g., only shared gate electrodes 1042 are formed).

The shared gate electrodes 1042 and the non-shared gate electrodes 1044 may be formed from the gate material 1040 (FIG. 20A) using conventional material removal processes (e.g., conventional etching processes) and conventional material removal equipment, which are not described in detail herein. For example, to form the shared gate electrodes 1042 and the non-shared gate electrodes 1044, the gate material 1040 (FIG. 20A) may be subjected to a conventional anisotropic etching process (e.g., a conventional anisotropic dry etching process) to remove portions of the gate material 1040 (FIG. 20A) overlying upper surfaces of the second P-type pillar structures 1032, upper surfaces of the second N-type pillar structures 1034, and portions of the upper surface of the substrate 1002 underlying the third linear openings 1037, while maintaining other portions of the gate material 1040 (FIG. 20A) overlying sidewalls of the second P-type pillar structures 1032 and the second N-type pillar structures 1034.

Next, referring to FIG. 22A, a second dielectric liner material 1046 may be formed (e.g., conformally formed) on or over exposed surfaces of the second P-type pillar structures 1032, the second N-type pillar structures 1034, the first dielectric liner structures 1033 (if any), the first isolation structures 1035, the shared gate electrodes 1042, and the non-shared gate electrodes 1044; and a second dielectric material 1048 may be formed on or over exposed surfaces of the second dielectric liner material 1046. As shown in FIG. 22A, the second dielectric liner material 1046 and the second dielectric material 1048 may substantially fill remaining portions of the second linear openings 1036 (FIG. 21A) and the third linear openings 1037 (FIG. 21A), such as portions of the second linear openings 1036 (FIG. 21A) and the third linear openings 1037 (FIG. 21A) unoccupied by the shared gate electrodes 1042 and non-shared gate electrodes 1044. For example, the second dielectric liner material 1046 may substantially fill remaining portions of the second linear openings 1036 (FIG. 21A) overlying the shared gate electrodes 1042, and may partially fill remaining portions of the third linear openings 1037 (FIG. 21A) overlying and laterally adjacent the non-shared gate electrodes 1044; and the second dielectric material 1048 may substantially fill further remaining portions of the third linear openings 1037 (FIG. 21A) unoccupied by the non-shared gate electrodes 1044 and the second dielectric liner material 1046. FIG. 22B is a simplified plan view of the TFT CMOS control logic device structure 1000 at the process stage depicted in FIG. 22A, wherein the second dielectric material 1048 is depicted as transparent to show the other components of the TFT CMOS control logic device structure 1000 provided thereunder.

The second dielectric liner material 1046 may be formed of and include at least one dielectric material, such as one or more of an dielectric oxide material (e.g., silicon dioxide, phosphosilicate glass, borosilicate glass, borophosphosilicate glass, fluorosilicate glass, aluminum oxide, a combination thereof), a dielectric nitride material (e.g., SiN), a dielectric oxynitride material (e.g., SiON), a dielectric carbonitride material (e.g., SiCN), and a dielectric carboxynitride material (e.g., SiOCN). The dielectric material of the second dielectric liner material 1046 may be the same as or different than that of one or more of the first linear isolation structures 1022, and the first linear dielectric liner structures 1024 (if any). In some embodiments, the second dielectric liner material 1046 comprises a silicon oxide (e.g., silicon dioxide). In addition, the second dielectric liner material 1046 may be formed to exhibit any desirable thickness. By way of non-limiting example, a thickness of the second dielectric liner material 1046 may be less than or equal to about 120 Å, less than or equal to about 50 Å, less than or equal to about 25 Å, or less than or equal to about 10 Å. In some embodiments, the thickness of the second dielectric liner material 1046 is within a range of from about 30 Å to about 120 Å. The thickness of the second dielectric liner material 1046 may be substantially uniform, or at least one region of the second dielectric liner material 1046 may have a different thickness than at least one other region of the second dielectric liner material 1046.

The second dielectric material 1048 may be formed of and include a dielectric material, such as one or more of an dielectric oxide material (e.g., silicon dioxide, phosphosilicate glass, borosilicate glass, borophosphosilicate glass, fluorosilicate glass, aluminum oxide, a combination thereof), a dielectric nitride material (e.g., SiN), a dielectric oxynitride material (e.g., SiON), a dielectric carbonitride material (e.g., SiCN), and a dielectric carboxynitride material (e.g., SiOCN). The dielectric material of the second dielectric material 1048 may be the same as or different than that of one or more of the first linear isolation structures 1022, the first linear dielectric liner structures 1024 (if any), and the second dielectric liner material 1046. In some embodiments, the second dielectric material 1048 comprises a silicon oxide (e.g., silicon dioxide). As shown in FIG. 22A, the second dielectric material 1048 may exhibit a substantially planar upper surface. In additional embodiments, the second dielectric material 1048 may exhibit a non-planar upper surface defined by elevated regions and recessed regions.

The second dielectric liner material 1046 and the second dielectric material 1048 may be formed using conventional processes (e.g., conventional deposition processes) and conventional processing equipment, which are not described in detail herein. By way of non-limiting example, the second dielectric liner material 1046 may be formed (e.g., through one or more of in situ growth, spin-on coating, blanket coating, CVD, PECVD, ALD, and PVD) on exposed surfaces of the second P-type pillar structures 1032, the second N-type pillar structures 1034, the first dielectric liner structures 1033 (if any), the first isolation structures 1035, the shared gate electrodes 1042, and the non-shared gate electrodes 1044; and then the second dielectric material 1048 may be formed (e.g., through one or more of in situ growth, spin-on coating, blanket coating, CVD, PECVD, ALD, and PVD) on exposed surfaces of the second dielectric liner material 1046.

Referring next to FIG. 23A, portions of at least the second dielectric liner material 1046 (FIG. 22A) and the second dielectric material 1048 (FIG. 22A) may be removed to form second linear dielectric liner structures 1050 and second linear isolation structures 1052. In addition, as shown in FIG. 23A, portions of the gate dielectric material 1038 overlying upper surfaces of the second P-type pillar structures 1032 and the second N-type pillar structures 1034 may also be removed to facilitate subsequent electrical contact with the P-type pillar structures 1032 and the second N-type pillar structures 1034. The second linear dielectric liner structures 1050 and the second linear isolation structures 1052 may be substantially confined within horizontal boundaries and vertical boundaries of the second linear openings 1036 (FIG. 21A) and the third linear openings 1037 (FIG. 21A). Accordingly, uppermost surfaces of the second linear dielectric liner structures 1050 and second linear isolation structures 1052 may be substantially coplanar with a plane shared by the upper surfaces of the second P-type pillar structures 1032, the second N-type pillar structures 1034, the first dielectric liner structures 1033 (if any), and the first isolation structures 1035. As shown in FIG. 23A, in some embodiments, uppermost surfaces of the shared gate electrodes 1042 and the non-shared gate electrodes 1044 are covered by at least the second linear dielectric liner structures 1050. In additional embodiments, uppermost surfaces of the shared gate electrodes 1042 and the non-shared gate electrodes 1044 are not covered by the second linear dielectric liner structures 1050. Furthermore, as also shown in FIG. 23A, the second linear isolation structures 1052 (as well as some of the second linear dielectric liner structures 1050 (if any)) may laterally intervene (e.g., in the X-direction) between neighboring non-shared gate electrodes 1044. The second linear isolation structures 1052 may electrically isolate the neighboring non-shared gate electrodes 1044 from one another. FIG. 23B is a simplified plan view of the TFT CMOS control logic device structure 1000 at the process stage depicted in FIG. 23A.

The second linear dielectric liner structures 1050 and second linear isolation structures 1052 may be formed using conventional processes (e.g., conventional material removal processes, such as conventional etching processes and/or conventional CMP processes) and conventional processing equipment, which are not described in detail herein. For example, at least the second dielectric liner material 1046 (FIG. 22A) and the second dielectric material 1048 (FIG. 22A) may be subjected to at least one CMP process to at least remove portions of the second dielectric liner material 1046 (FIG. 22A) and the second dielectric material 1048 (FIG. 22A) outside of the second linear openings 1036 (FIG. 21A) and the third linear openings 1037 (FIG. 21A) and form the second linear dielectric liner structures 1050 and second linear isolation structures 1052. The CMP process may expose drain regions of the second P-type pillar structures 1032 (e.g., upper $p^+$ regions) and the second N-type pillar structures 1034 (e.g., upper $n^+$ regions). Optionally, the CMP process may also remove upper portions of one or more of the second P-type pillar structures 1032, the second N-type pillar structures 1034, the first dielectric liner structures 1033 (if any), and the first isolation structures 1035.

Following the formation of the second linear dielectric liner structures 1050 and second linear isolation structures 1052, the TFT CMOS control logic device structure 1000 may be subjected to additional processing to form a TFT CMOS control logic device. By way of non-limiting example, the TFT CMOS control logic device structure 1000 may subsequently be subjected to additional processing to form one or more of contacts (e.g., source side contacts, drain side contacts, gate contacts), interconnects, and routing structures. Such additional processing may be conventional, and is not described in detail herein.

Thus, in accordance with embodiments of the disclosure, a method of forming a control logic device comprises forming N-type line structures extending over a substrate in a first lateral direction. P-type line structures extending over the substrate in the first lateral direction and intervening between the N-type line structures in a second lateral direction perpendicular to the first lateral direction are formed. Portions of the N-type line structures and the P-type line structures are removed to form first N-type pillar structures, first P-type pillar structures, and first linear trenches extending over the substrate in the second lateral direction. First linear isolation structures are formed within the first linear trenches. Portions of the first N-type pillar structures, the first P-type pillar structures, and the first linear isolation structures are removed to form second N-type pillar structures, second P-type pillar structures, first isolation structures, and second linear trenches extending over the substrate in the first lateral direction. Gate electrodes are formed in the second linear trenches, some of the second linear trenches including only one of the gate electrodes and other of the second linear trenches including more than one of the gate electrodes. Second linear isolation structures are formed in portions of the second linear trenches remaining after forming the gate electrodes.

Figure 24:
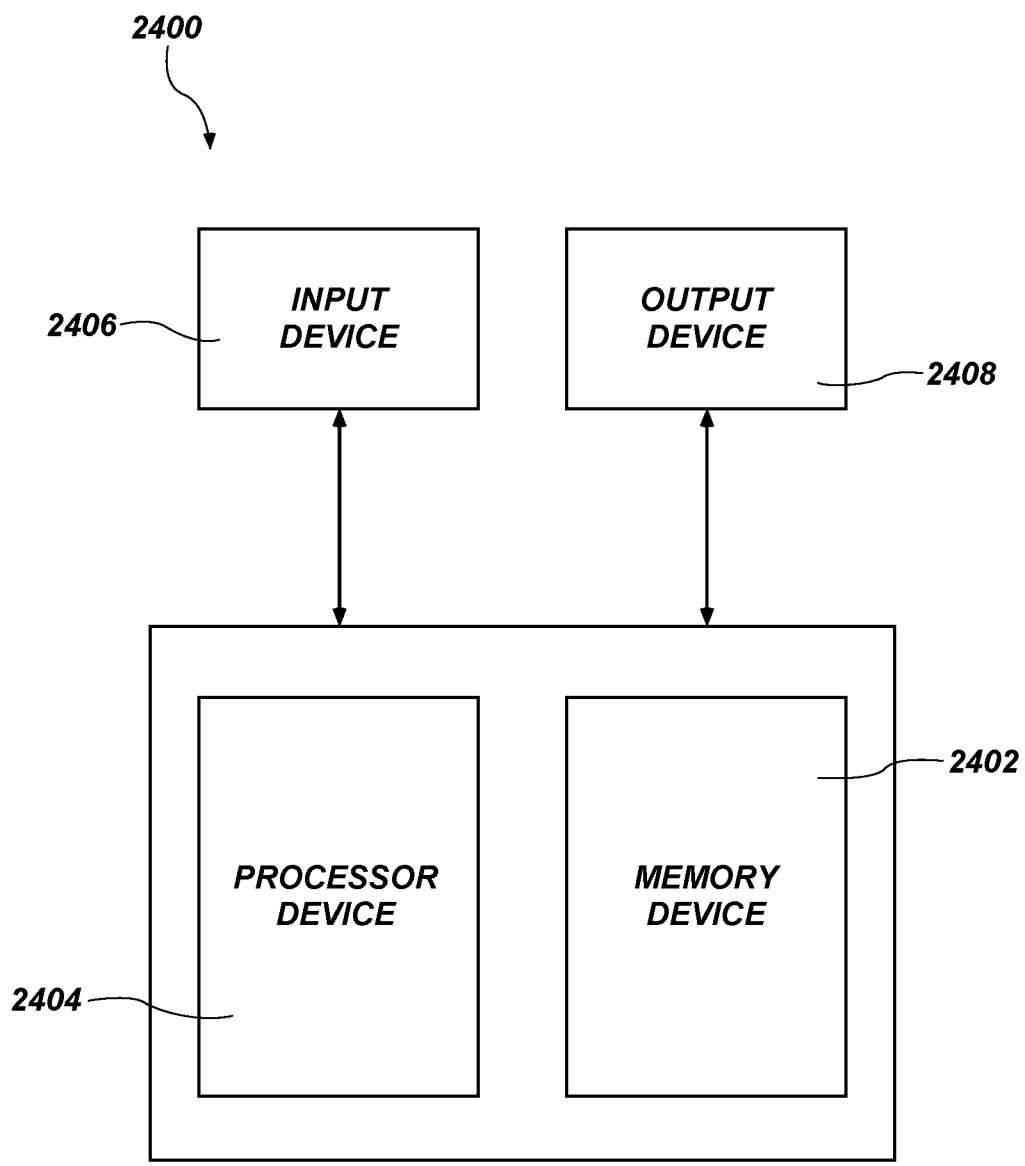
FIG. 24 is a schematic block diagram illustrating an electronic system, in accordance with embodiments of the disclosure.

Semiconductor devices (e.g., the semiconductor device 100 previous described with reference to FIG. 1) including semiconductor device structures (e.g., the stack structure 103 and the base control logic structure 102 previous described with reference to FIG. 1) in accordance with embodiments of the disclosure may be used in embodiments of electronic systems of the disclosure. For example, FIG. 24 is a block diagram of an illustrative electronic system 2400 according to embodiments of disclosure. The electronic system 2400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 2400 includes at least one memory device 2402. The at least one memory device 2402 may include, for example, an embodiment of a semiconductor device previously described herein (e.g., semiconductor device 100 previously previous described with reference to FIG. 1), wherein different decks (e.g., the decks 104) of a stack structure (e.g., the stack structure 102) of the semiconductor device each include a control logic level (e.g., the TFT control logic level 200 previously described with reference to FIG. 2) comprising an assembly of control logic devices, at least one of the control logic devices including at least one device (e.g., a TFT CMOS device) exhibiting one or more gate electrodes shared by neighboring vertical transistors thereof. The electronic system 2400 may further include at least one electronic signal processor device 2404 (often referred to as a "microprocessor"). The electronic signal processor device 2404 may, optionally, include an embodiment of a semiconductor device previously described herein (e.g., semiconductor device 100 previously previous described with reference to FIG. 1). The electronic system 2400 may further include one or more input devices 2406 for inputting information into the electronic system 2400 by a user, such as, for example, a mouse or other pointing device, a keyboard, a touchpad, a button, or a control panel. The electronic system 2400 may further include one or more output devices 2408 for outputting information (e.g., visual or audio output) to a user such as, for example, a monitor, a display, a printer, an audio output jack, a speaker, etc. In some embodiments, the input device 2406 and the output device 2408 may comprise a single touchscreen device that can be used both to input information to the electronic system 2400 and to output visual information to a user. The one or more input devices 2406 and output devices 2408 may communicate electrically with at least one of the memory device 2402 and the electronic signal processor device 2404.

Thus, in accordance with embodiments of the disclosure, an electronic system comprises a semiconductor device comprising a stack structure. The stack structure comprises decks each comprising a memory element level comprising memory elements, and a control logic level in electrical communication with the memory element level and comprising control logic devices. At least one of the control logic devices of the control logic level of one or more of the decks comprises at least one device exhibiting a gate electrode shared by neighboring vertical transistors thereof.

The devices, structures, systems, and methods of the disclosure advantageously facilitate improved semiconductor device performance, reduced costs (e.g., manufacturing costs, material costs), increased miniaturization of components, and greater packaging density as compared to conventional devices, conventional structures, conventional systems, and conventional methods. The devices, structures, systems, and methods of the disclosure may also improve performance, scalability, efficiency, and simplicity as compared to conventional device, conventional structures, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A control logic device, comprising:
a vertical transistor comprising:
   a semiconductive structure comprising a source region, a drain region, and a channel region between the source region and the drain region; and
   a shared gate electrode;
another vertical transistor comprising:
   another semiconductive structure comprising another source region, another drain region, and another channel region between the another source region and the another drain region; and
   the shared gate electrode, the shared gate electrode laterally intervening between the channel region of the semiconductive structure and the another channel region of the another semiconductive structure; and
at least one additional vertical transistor neighboring the another vertical transistor and comprising:
   at least one additional semiconductive structure comprising an additional source region, an additional drain region, and an additional channel region vertically between the additional source region and the additional drain region; and
   an additional shared gate, the additional shared gate laterally intervening between the another channel region of the another semiconductive structure and the at least one additional channel region of the at least one additional semiconductive structure;
wherein the semiconductive structure of the vertical transistor, the another semiconductive structure of the another vertical transistor, and the at least one additional semiconductive structure of the at least one additional vertical transistor are not all substantially aligned with one another in a single lateral direction.

2. The control logic device of claim 1, wherein:
the semiconductive structure of the vertical transistor comprises an N-type source region, an N-type drain region, and a P-type channel region vertically between the N-type source region and the N-type drain region; and
the another semiconductive structure of the another vertical transistor comprises a P-type source region, a P-type drain region, and an N-type channel region vertically between the P-type source region and the P-type drain region.

3. The control logic device of claim 1, wherein:
the semiconductive structure of the vertical transistor comprises a P-type source region, a P-type drain region, and an N-type channel region vertically between the P-type source region and the P-type drain region; and the another semiconductive structure of the another vertical transistor comprising an additional P-type source region, an additional P-type drain region, and an additional N-type channel region vertically between the additional P-type source region and the additional P-type drain region.

4. The control logic device of claim 1, wherein:
the semiconductive structure of the vertical transistor comprises a semiconductive pillar comprising the source region, the drain region, and the channel region vertically between the source region and the drain region; and
the another semiconductive structure of the another vertical transistor comprises another semiconductive pillar comprising the another source region, the another drain region, and the another channel region vertically between the another source region and the another drain region.

\* \* \* \* \*